United States Patent [19]

Havel

[11] Patent Number: 4,794,383
[45] Date of Patent: Dec. 27, 1988

[54] VARIABLE COLOR DIGITAL MULTIMETER

[76] Inventor: Karel Havel, P.O. Box 66, Station M, Toronto, Ontario, Canada, M6S 4T2

[21] Appl. No.: 819,111

[22] Filed: Jan. 15, 1986

[51] Int. Cl.[4] .......................... G01R 13/02; G09G 3/16
[52] U.S. Cl. .................................... 340/704; 340/702; 340/762; 324/99 D
[58] Field of Search ....................... 340/702, 704, 762; 324/99 D

[56] References Cited

U.S. PATENT DOCUMENTS

| | | | |
|---|---|---|---|
| 3,740,570 | 6/1973 | Kaelin | 340/704 |
| 3,840,873 | 10/1974 | Usui | 340/762 |
| 4,086,514 | 4/1978 | Havel | 313/500 |
| 4,228,394 | 10/1980 | Cosby | 324/99 D |
| 4,298,837 | 11/1981 | Koslar | 324/99 D |
| 4,303,913 | 12/1981 | Tohda et al. | 340/704 |
| 4,360,804 | 11/1982 | Ohura | 340/703 |
| 4,484,187 | 11/1984 | Brown et al. | 340/703 |
| 4,630,040 | 12/1986 | Haertling | 340/704 |

Primary Examiner—Howard A. Birmiel

[57] ABSTRACT

A multimeter with variable color digital display indicates measured values in digital format and in variable color. The multimeter includes a color control circuit for selectively controlling color of the digital display in accordance with the measurement quantity, method, unit, mode, function, range, location, modifier, control, limits, and the like. A color converter circuit is disclosed for converting analog voltage to variable color.

10 Claims, 69 Drawing Sheets

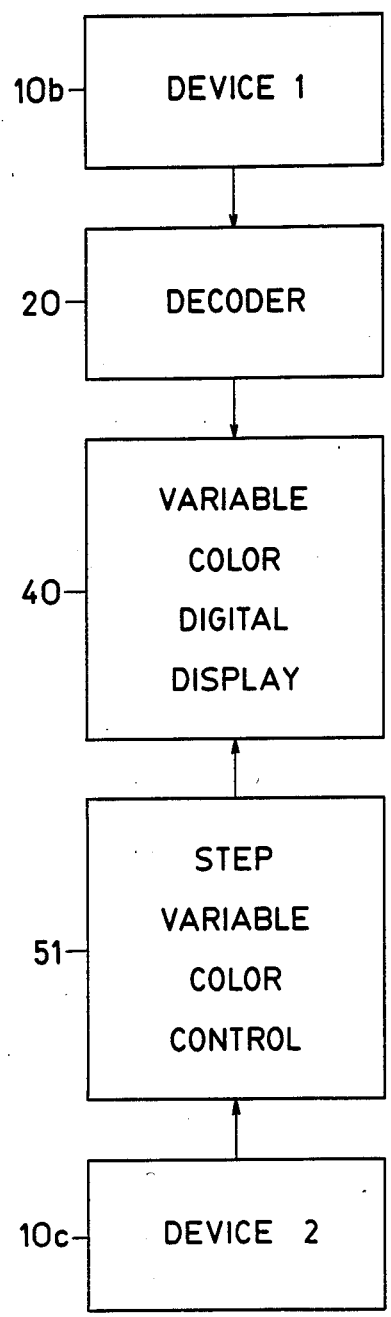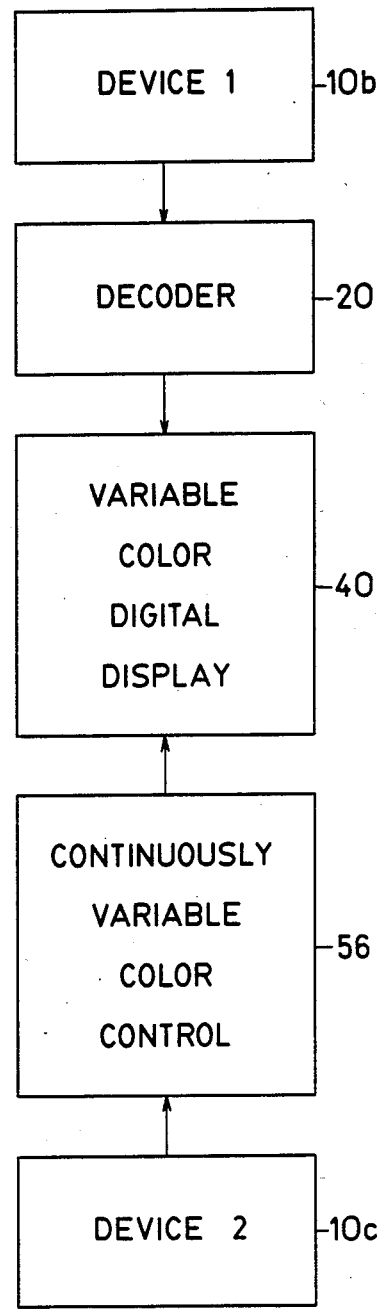

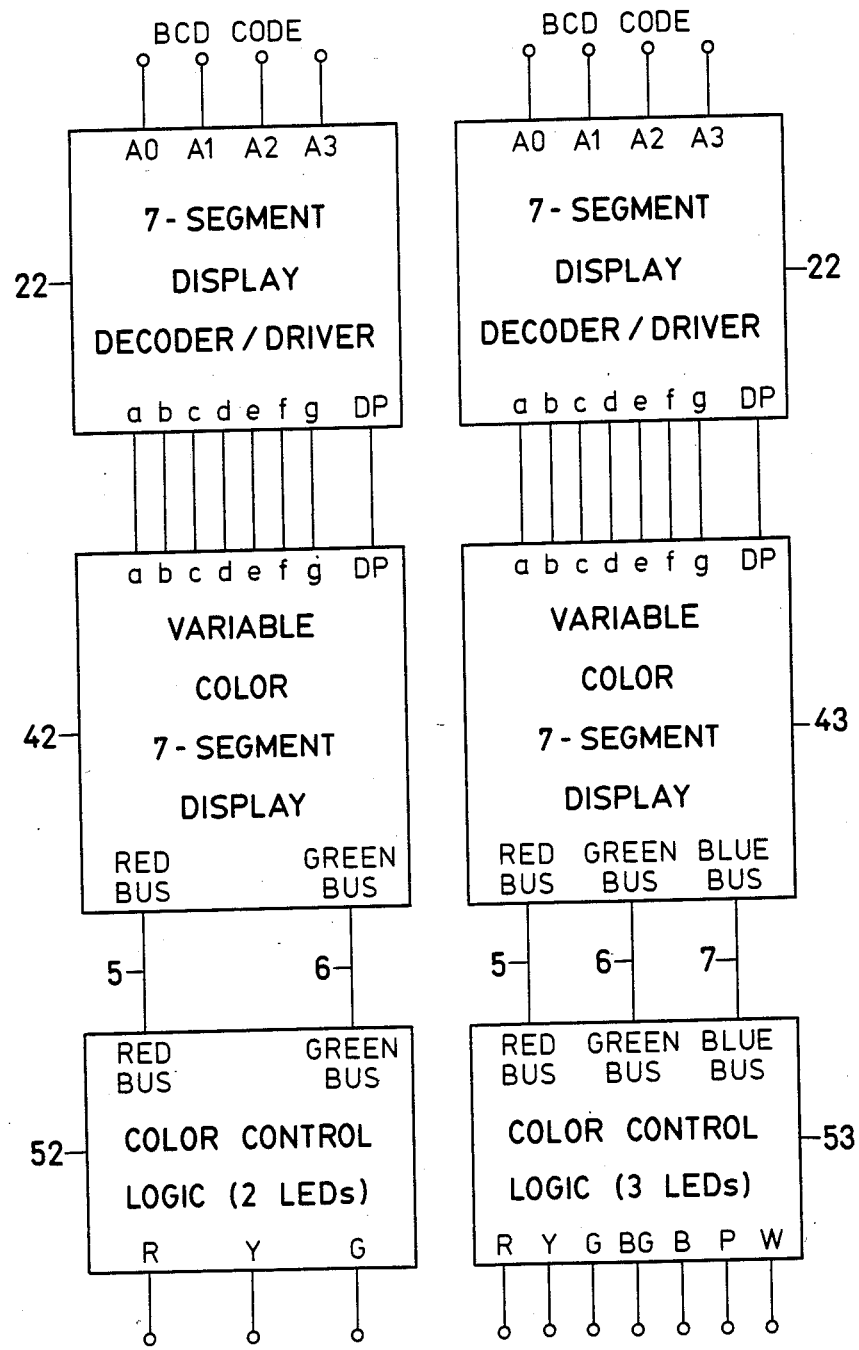

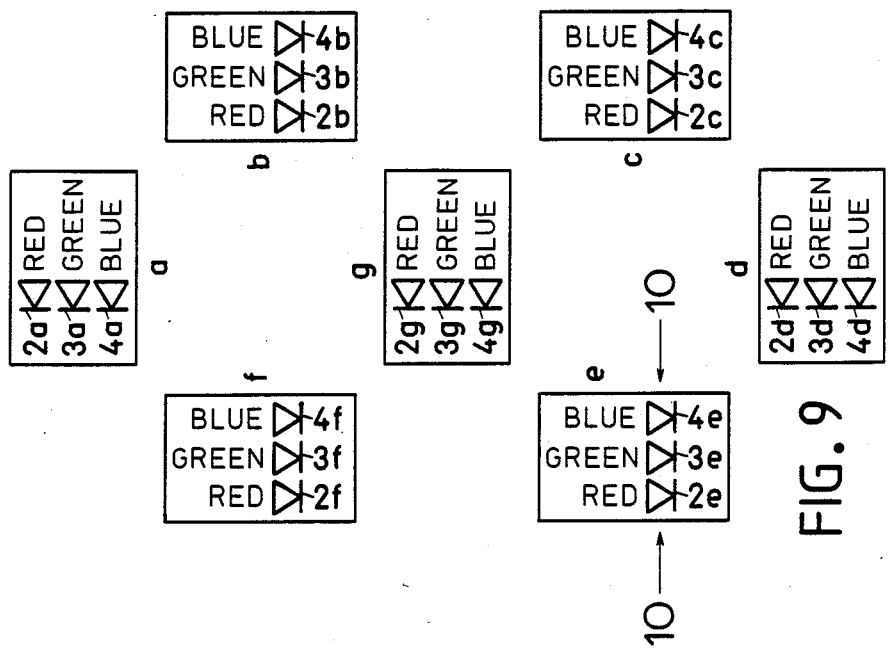
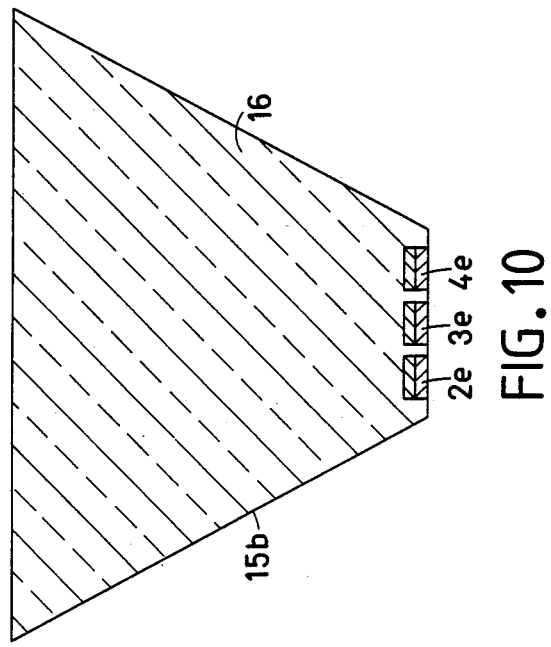
FIG. 9
FIG. 10

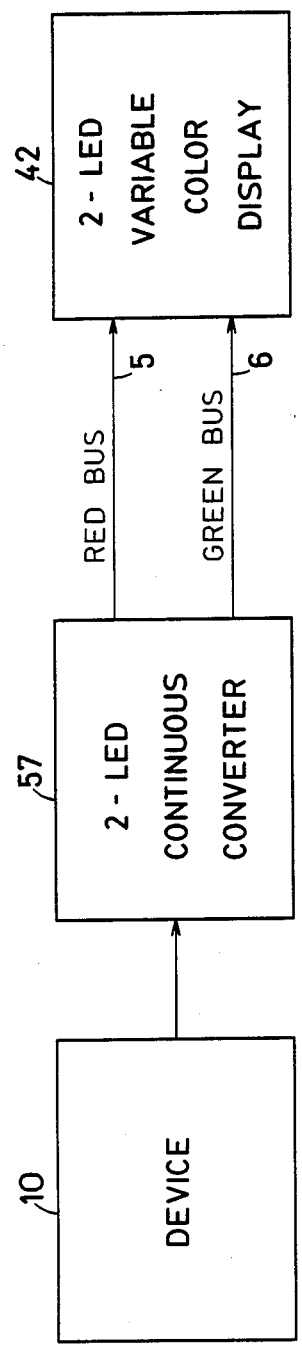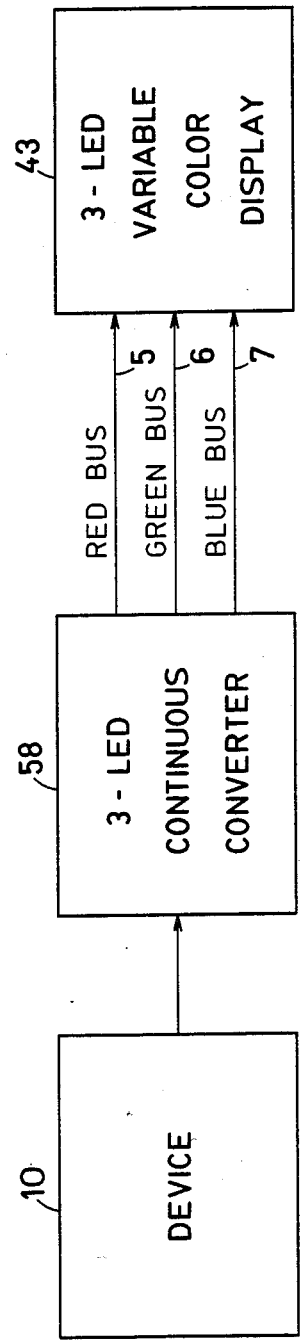
FIG. 27
FIG. 28

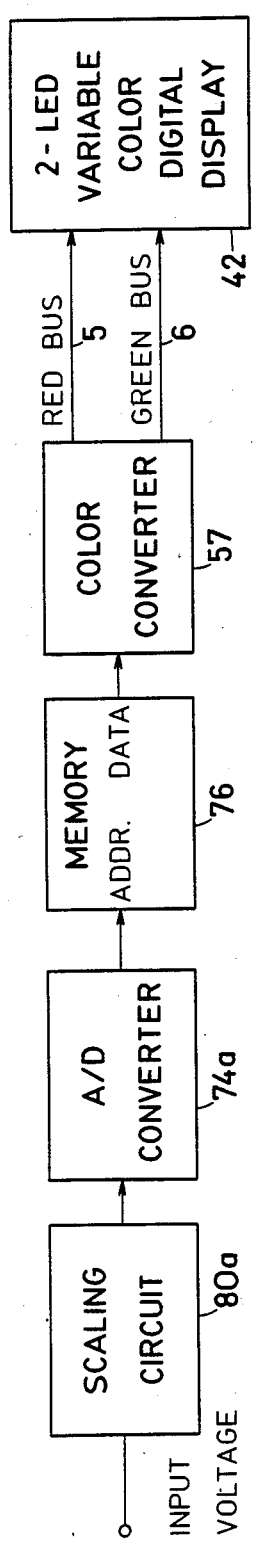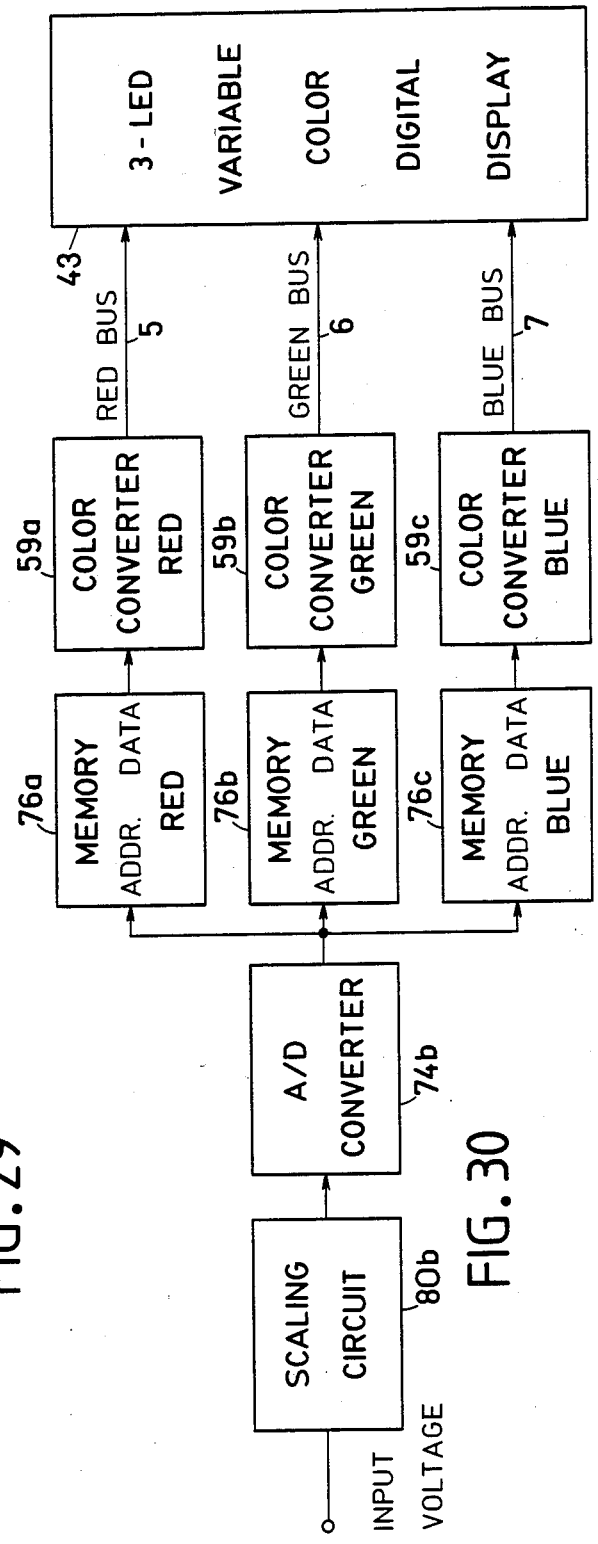
FIG. 29
FIG. 30

ICI CHROMATICITY DIAGRAM

| WAVEFORM TYPE | RMS VALUE | CREST FACTOR |
|---|---|---|
| 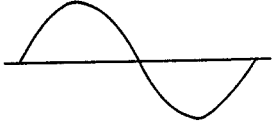 SINE WAVE | 0.707 Vm | 1.414 |
| 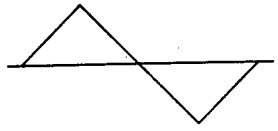 TRIANGULAR WAVE | 0.5 Vm | 1.732 |
|  GAUSSIAN NOISE | RMS | LARGE |
| 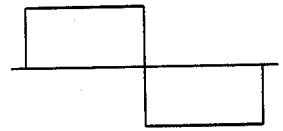 SYMMETRICAL SQUARE WAVE | Vm | 1 |
|  PULSE TRAIN DUTY CYCLE = 0.25 | $Vm\sqrt{n}$ | 2 |
|  PULSE TRAIN DUTY CYCLE = 0.0625 | $Vm\sqrt{n}$ | 4 |
| ———— DC SIGNAL | Vm | 1 |
RMS AND CREST FACTOR CHART
FIG. 77

VARIABLE COLOR DIGITAL MULTIMETER

VARIABLE COLOR DIGITAL MULTIMETER

CROSS-REFERENCE TO RELATED APPLICATIONS

This relates to my application Ser. No. 664,426, filed on Mar. 8, 1976, abandoned.

BACKGROUND OF THE INVENTION

1. Field of the Invention

This invention relates to measuring devices utilizing a variable color digital display.

2. Description of the Prior Art

A display device that can change color and selectively display digits and characters is described in my U.S. Pat. No. 4,086,514, entitled Variable Color Display Device and issued on Apr. 25, 1978. This display device includes display areas arranged in a suitable display font, such as well known 7-segment display font, which may be selectively energized in groups to display all known characters. Each display segment includes three light emitting diodes for emitting light signals of respectively different primary colors, which are blended within the display segment to form a composite light signal. The color of the composite light signal can be controlled by selectively varying the portions of the primary light signals.

Multimeters with monochromatic digital display are well known and extensively used. Such multimeters, however, have a defect in that they are capable of indicating value of only one measured quantity at a time. They are not capable of simultaneously indicating values of two different quantities, nor are they capable of indicating the relationship of instantly displayed measured value to values measured at other times, nor are they capable of indicating the relationship of instantly displayed measured value to measurement limits.

Although the possibility of a variable color digital display has been previously considered, no practical system utilizing such a display has been made available to public use.

SUMMARY OF THE INVENTION

In a broad sense, it is the principal object of this invention to provide a measuring instrument with a variable color digital display.

The present invention provides a new dimension in the digital display art. Completely new, unexpected and heretofore impossible, features may be obtained when a well known monochromatic digital display is substituted with a variable color digital display. In the preferred embodiment, the invention was advantageously incorporated into a digital multimeter. However, the invention is not limited to measuring instruments and may be utilized in a wide variety of devices, without imposing any limitations.

It is another object of the invention to provide step variable 2-primary and 3-primary color control circuit which is capable of illuminating the display in a selected one of several possible colors.

It is further object of the invention to provide continuously variable 2-primary and 3-primary color converter, for converting an input voltage to variable color, which is capable of illuminating the display in any color of the spectrum, in accordance with the magnitude of the input voltage.

Among other objects of the invention are provision of a digital multimeter capable of selectively measuring values of several different measurement quantities and of indicating values of the selected quantity in digital format and in a color unique to the selected measured quantity; provision of a digital multimeter capable of measuring signals by several different measurement methods and of indicating measured values in digital format and in a color depending on the selected measurement method; provision of a digital multimeter capable of making measurements in several different measurement units and of indicating measured values in digital format and in a color depending on the selected measurement unit; provision of a digital multimeter capable of selectively measuring signal values from several different locations and of indicating measured values in digital format and in a color unique to the selected location; provision of a digital multimeter having several different measurement modes and capable of indicating measured values in digital format and in a color unique to the selected measurement mode; provision of a digital multimeter capable of performing several measurement functions and of indicating measured values in digital format and in a color unique to the selected measurement function; provision of a digital multimeter having selectable measurement ranges and capable of indicating measured values in digital format and in a color unique to the selected measurement range; provision of a digital multimeter having several measurement modifiers and capable of indicating measured values in digital format and in a color depending on the selected modifier; provision of a digital multimeter capable of selective measurement control and of indicating measured values in digital format and in a color depending on the selected control; provision of a digital multimeter capable of measuring time and of indicating measured values in digital format and in a color related to time; provision of a digital multimeter having a memory for storing reference values and a comparator for effecting a comparison between the reference values and measured values, and accordingly causing measured values to be indicated in digital format and in a color depending on the results of comparison; provision of a digital multimeter capable of performing repeated measurements and of comparing measured values with reference values and of counting the number of measurement errors, and accordingly causing measured values to be indicated in digital format and in a color having relation to the number of previous measurement errors; provision of a digital multimeter capable of indicating measured values in digital format and in a color different for positive and negative results; provision of a variable color digital display system for emphasizing decimal point in displayed decimal numbers; provision of a variable color digital display system capable of displaying decimal numbers and integers in different colors; provision of a variable color digital barometer with memory, capable of indicating instant atmospheric pressure in digital format and in a color depending on previous measurements; and provision of a dual variable color digital voltmeter capable of simultaneously indicating two different measured values on a single display in different colors.

In another embodiment, an RMS digital voltmeter with a variable color digital display is disclosed which can indicate RMS value of the measured waveform in digital format and in a color variable in accordance with the crest factor of the waveform, to thereby simultaneously indicate its magnitude and shape.

BRIEF DESCRIPTION OF THE DRAWINGS

In the drawings in which are shown several possible embodiments of the invention.

FIG. 3 is a block diagram of a step variable color display system.

FIG. 4 is a block diagram of a continuously variable color display system.

FIG. 5 is a block diagram of 2-primary color digital display.

FIG. 6 is a block diagram of 3-primary color digital display.

FIG. 9 is an enlarged detail of one digit of 3-primary color digital display.

FIG. 10 is an enlarged cross-sectional view of one display segment in FIG. 9, taken along the line 10—10.

FIG. 27 is a block diagram of a continuously variable color display system utilizing two primary colors.

FIG. 28 is a block diagram of a continuously variable color display system utilizing three primary colors.

FIG. 29 is an expanded block diagram of FIG. 27.

FIG. 30 is an expanded block diagram of FIG. 28.

FIG. 77 is the RMS and crest factor chart.

Throughout the drawings, like characters indicate like parts.

BRIEF DESCRIPTION OF THE TABLES

In the tables which show examples of the relationship between an input voltage, memory contents, and resulting color in the color converter of the present invention, TABLE 1 shows the characteristic of a step variable 2-primary color converter.

TABLE 2 shows a rainbow-like characteristic of a continuously variable 3-primary color converter.

Throughout the tables, memory addresses and data are expressed in a well known hexadecimal notation.

DESCRIPTION OF THE PREFERRED EMBODIMENTS

Figure 1:
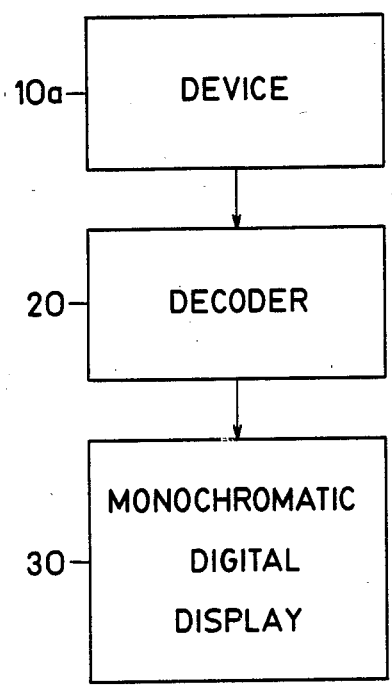
FIG. 1 is a block diagram of a typical prior art monochromatic digital display system.

Referring now, more particularly, to the drawings, in FIG. 1 is shown a block diagram of a typical prior art digital display system which usually includes a device 10a for developing digital data, a suitable decoder 20 for converting the digital data into a displayable code, and a monochromatic digital display 30 for indicating the digital data visually.

Figure 2:
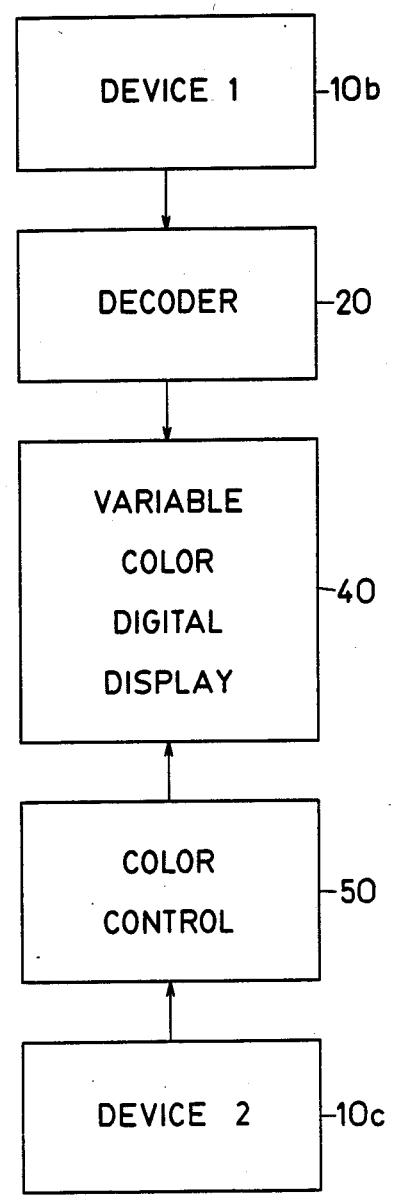
FIG. 2 is a generalized block diagram of a variable color digital display system for the practice of the present invention.

As shown in FIG. 2, the present invention resides in the substitution of a commercially well known monochromatic digital display with variable color digital display 40, and in the addition of a color control circuit 50 for controlling the color of the display 40. The variable color digital display system of this invention can simultaneously indicate the values of two different quantities, from the outputs of respective devices 10b, 10c, by causing the value of the first quantity to be indicated in digital format, and by controlling the color of the display in accordance with the value of the second quantity.

In FIG. 3 is shown a block diagram of another embodiment of a variable color digital display system of the present invention, characterized by a step variable color control circuit 51.

In FIG. 4 is shown a block diagram of still another embodiment of variable color digital display system, characterized by a continuously variable color control circuit 56.

In FIG. 5 is shown a block diagram of a 2-primary color display system including a commercially well known 7-segment display decoder driver 22, variable color 7-segment display 42, and 2-primary color control logic circuit 52. The decoder 22 accepts at its inputs A0, A1, A2, A3, a 4-bit BCD (binary coded decimal) code and develops output drive signals at its outputs a, b, c, d, e, f, g, and DP (decimal point), to drive respective segments of the 7-segment display 42. The color control circuit 52 accepts at its input R (red), Y (yellow), and G (green), color control logic signals and develops at its outputs drive signals for the red bus 5 and green bus 6, respectively, to illuminate the display 42 in a selected color.

In FIG. 6 is shown a block diagram of 3-primary color display system including a 7-segment display decoder driver 22, variable color 7-segment display 43, and 3-primary color control logic circuit 53. The color control circuit 53 accepts at its inputs R (red), Y (yellow), G (green), BG (blue-green), B (blue), P (purple), and W (white), color control logic signals and develops at its outputs drive signals for the red bus 5, green bus 6, and blue bus 7, respectively, to illuminate the display 43 in a selected color.

Figure 7:
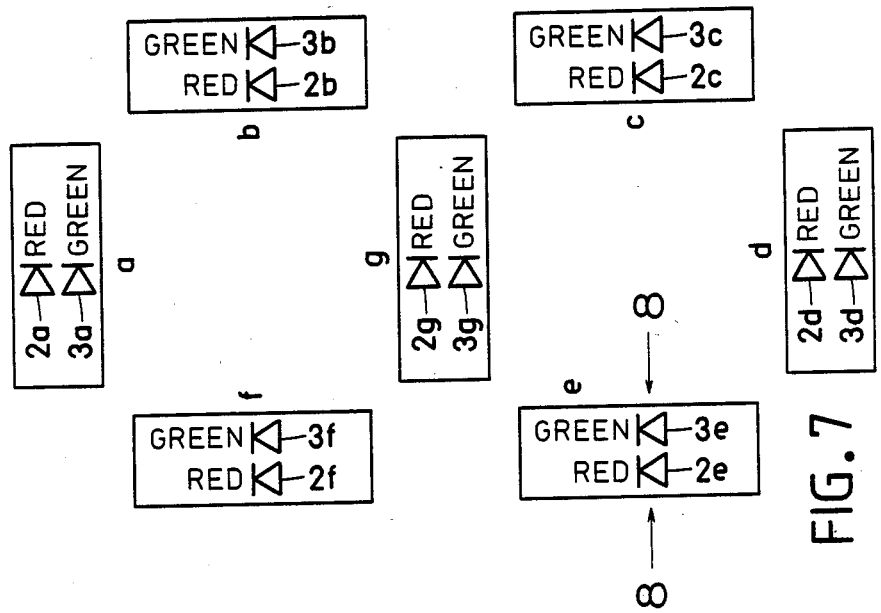
FIG. 7 is an enlarged detail of one digit of 2-primary color digital display.

In FIG. 7, the 2-primary color display element includes seven elongated display segments a, b, c, d, e, f, g, arranged in the conventional pattern, which may be selectively energized in different combinations to display the desired digits. Each display segment includes a pair of LEDs (light emitting diodes): a red LED 2 and green LED 3, which are closely adjacent such that the light signals emitted therefrom are substantially superimposed upon each other to mix the colors. To facilitate the illustration, the LEDs are designated by segment symbols, e.g., the red LED in the segment a is designated as 2a, etc.

Figure 8:
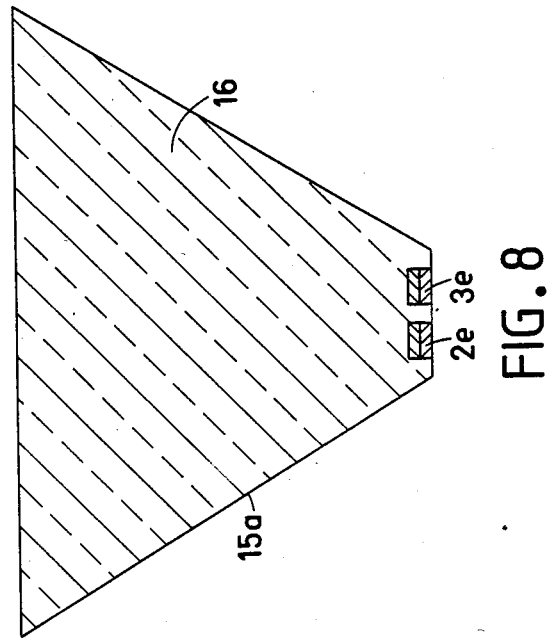
FIG. 8 is an enlarged cross-sectional view of one display segment in FIG. 7, taken along the line 8—8.

In FIG. 8 the light emitting diodes 2e (red) and 3e (green) are placed on the base of the segment body 15a, which is filled with transparent light scattering material 16. When forwardly biased, the LEDs 2e and 3e emit light signals of red and green colors, respectively, which are scattered within the transparent material 16, thereby blending the red and green light signals into a composite light signal that emerges at the upper surface of the segment body 15a. The color of the composite light signal may be controlled by varying portions of the red and green light signals.

In FIG. 9, each display segment of the 3-primary color display element includes a triad of LEDs: a red LED 2, green LED 3, and blue LED 4, which are closely adjacent such that the light signals emitted therefrom are substantially superimposed upon one another to mix the colors.

In FIG. 10 the light emitting diodes 2e (red), 3e (green), and 4e (blue) are placed on the base of the segment body 15b, which is filled with transparent light scattering material 16. Red LEDs are typically manufactured by diffusing a p-n junction into a GaAsP epitaxial layer on a GaAs substrate; green LEDs typically use a GaP epitaxial layer on a GaP substrate; blue LEDs are typically made from SiC material.

When forwardly biased, the LEDs 2e, 3e, and 4e emit light signals of red, green, and blue colors, respectively, which are scattered within the transparent material 16, thereby blending the red, green, and blue light signals into a composite light signal that emerges at the upper surface of the segment body 15b. The color of the composite light signal may be controlled by varying the portions of the red, green, and blue light signals.

Figure 11:
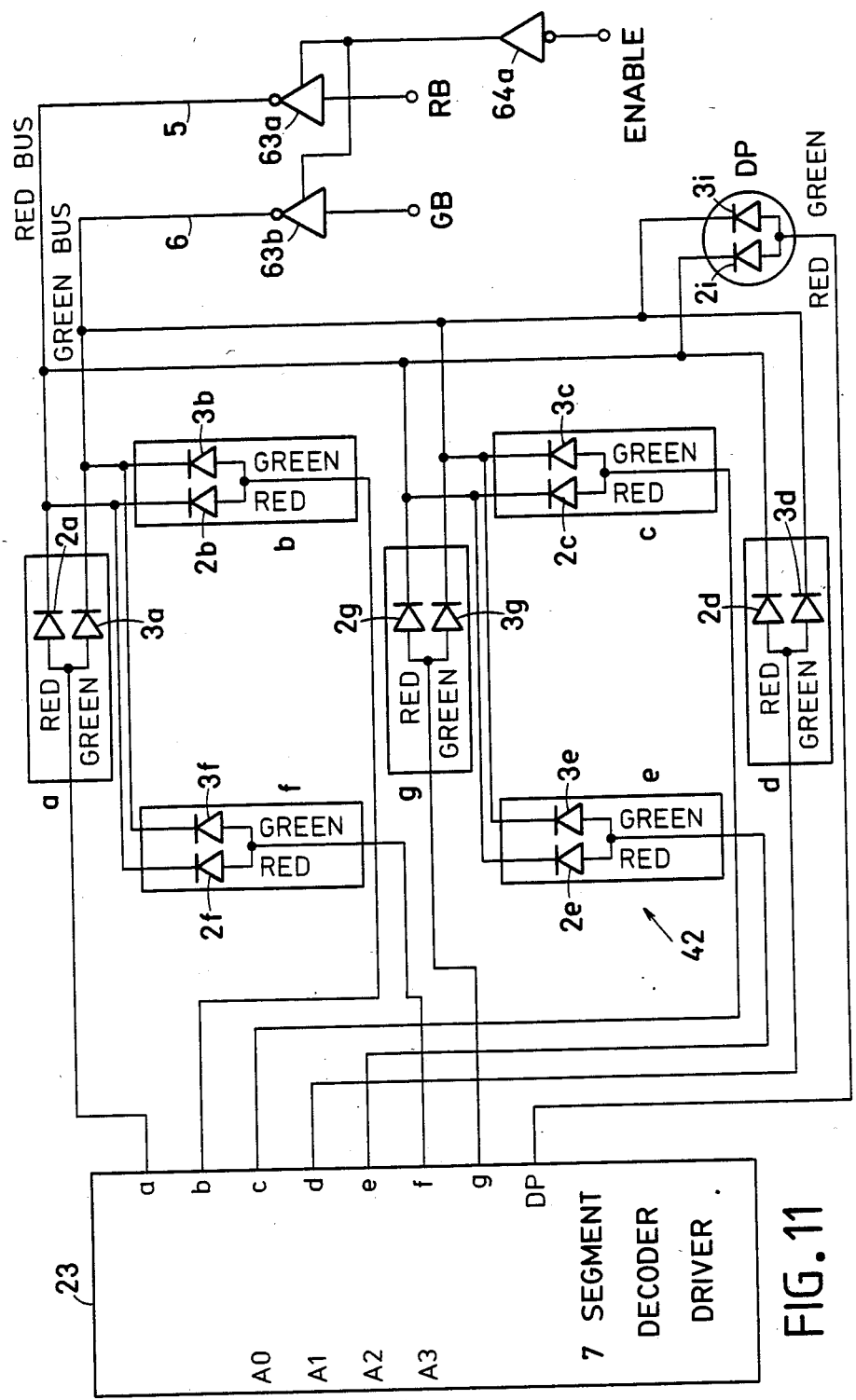
FIG. 11 is a schematic diagram of one digit of one 2-primary color display element.

In FIG. 11 is shown a complete schematic diagram of a one-character 2-primary color common cathodes 7-segment display element which can selectively display various digital fonts in different colors. The anodes of all red and green LED pairs are interconnected in each display segment and are electrically connected to respective outputs of a commercially well known common-cathode 7-segment decoder driver 23. The cathodes of all red LEDs 2a, 2b, 2c, 2d, 2e, 2f, 2g, and 2i are interconnected to a common electric path referred to as a red bus 5. The cathodes of all green LEDs 3a, 3b, 3c, 3d, 3e, 3f, 3g, and 3i are interconnected to a like common electric path referred to as a green bus 6.

The red bus 5 is connected to the output of a tri-state inverting buffer 63a, capable of sinking sufficient current to forwardly bias all red LEDs in the display. The green bus 6 is connected to the output of a like buffer 63b. The two buffers 63a, 63b can be simultaneously enabled by applying a logic low level signal to the input of the inverter 64a, and disabled by applying a logic high level signal therein. When the buffers 63a, 63b are enabled, the conditions of the red and green buses can be selectively controlled by applying suitable logic control signals to the bus control inputs RB (red bus) and GB (green bus), to illuminate the display in a selected color. When the buffers 63a, 63b are disabled, both red and green buses are effectively disconnected and the display is completely extinguished.

Figure 12:
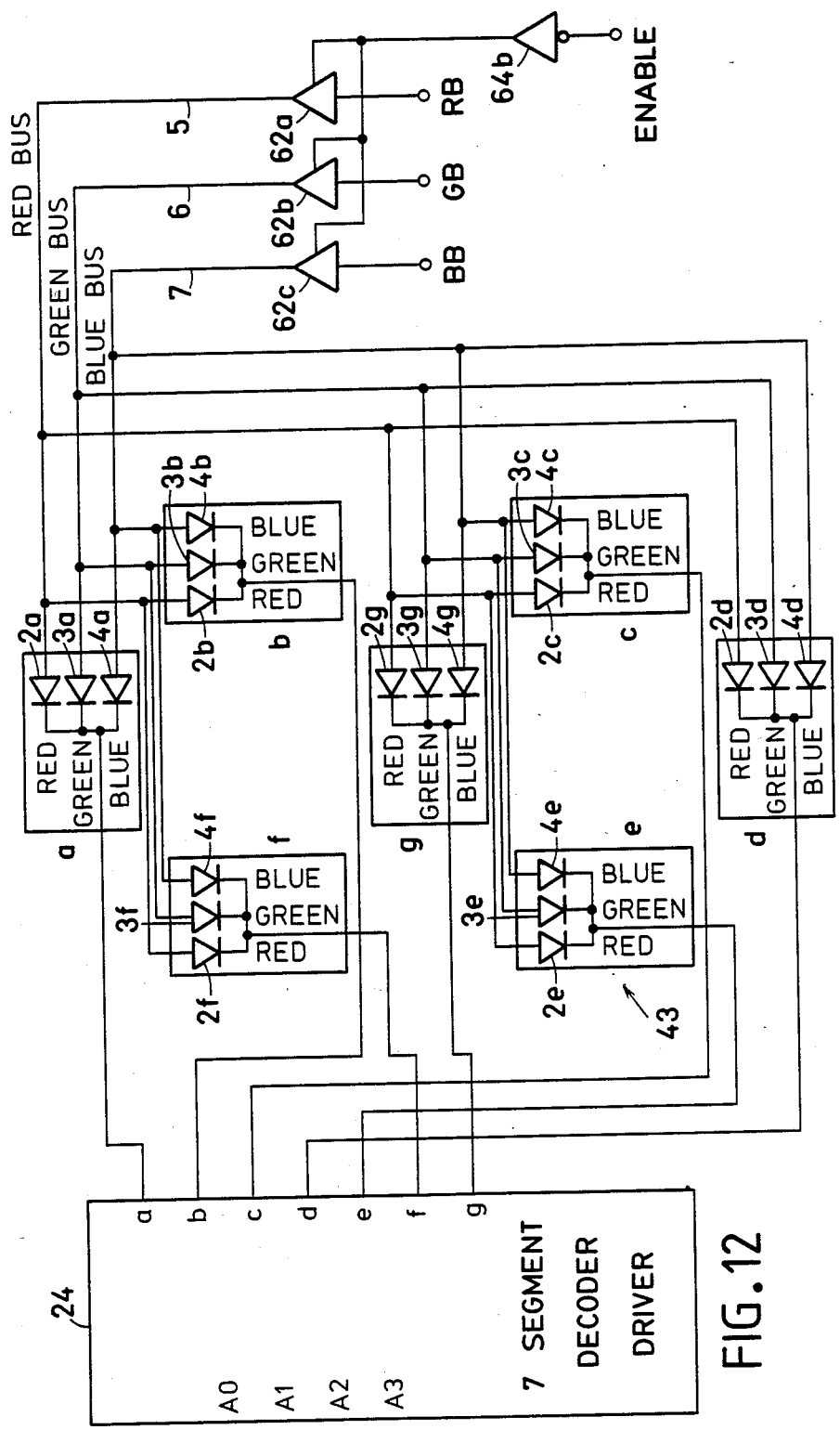
FIG. 12 is a schematic diagram of one digit of one 3-primary color display element.

In FIG. 12 is shown a complete schematic diagram of a one-character 3-primary color common anodes 7-segment display element which can selectively display digital fonts in different colors. The cathodes of all red, green, and blue LED triads in each display segment are interconnected and electrically connected to respective outputs of a commercially well known common anode 7-segment decoder driver 24. The anodes of all red LEDs 2a, 2b, 2c, 2d, 2e, 2f, 2g are interconnected to form a common electric path referred to as a red bus 5. The anodes of all green LEDs 3a, 3b, 3c, 3d, 3e, 3f, 3g are interconnected to form a like common electric path referred to as a green bus 6. The anodes of all blue LEDs 4a, 4b, 4c, 4d, 4e, 4f, 4g are interconnected to form a like common electric path referred to as a blue bus 7.

The red bus 5 is connected to the output of a non-inverting tri-state buffer 62a, capable of sourcing sufficient current to illuminate all red LEDs in the display. The green bus 6 is connected to the output of a like buffer 62b. The blue bus 7 is connected to the output of a like buffer 62c. The three buffers 62a, 62b, 62c can be simultaneously enabled, by applying a logic low level signal to the input of the inverter 64b, and disabled by applying a logic high level signal therein. When the buffers 62a, 62b, 62c are enabled, the conditions of the red, green, and blue buses can be selectively controlled by applying valid combinations of logic level signals to the bus control inputs RB (red bus), GB (green bus), and BB (blue bus), to illuminate the display in a selected color. When the buffers 62a, 62b, 62c are disabled, all three buses are effectively disconnected and the display is completely extinguished.

STEP VARIABLE COLOR CONTROL

Figure 13:
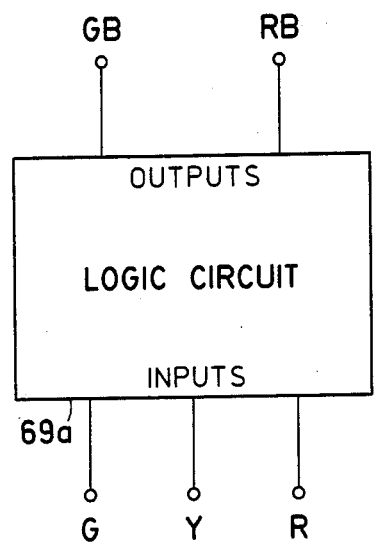
FIG. 13 is a block diagram of a color control logic circuit for controlling 2-primary color display.

In FIG. 13 is shown a logic circuit 69a for developing drive signals for the red bus 5 and green bus 6, to control the color of the display element 42 shown in FIG. 11. Two voltage levels, referred to as logic high and low, respectively, are used throughout the description of the digital circuits. The color of the display 42 may be controlled by applying valid combinations of logic level signals to its color control inputs R (Red), Y (Yellow), and G (Green). The logic circuit 69a combines the input signals in a logic fashion and develops output drive signals RB (Red Bus) and GB (Green Bus), for activating the red bus 5 and green bus 6, respectively, of the display 42.

Figure 14:
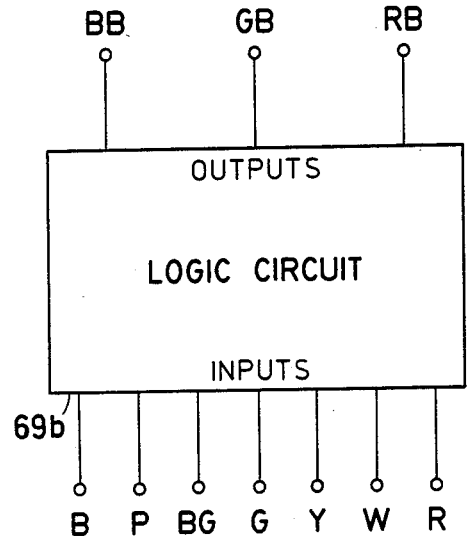
FIG. 14 is a block diagram of a color control logic circuit for controlling 3-primary color display.

In FIG. 14 is shown a like logic circuit 69b for developing drive signals for the red bus 5, green bus 6, and blue bus 7, to control the color of the display element 43 shown in FIG. 12. The color of the display 43 may be controlled by applying valid combinations of logic level signals to its color control inputs B (Blue), P (Purple), BG (Blue-Green), G (Green), Y (Yellow), W (White), and R (Red). The logic circuit 69b combines the input signals in a logic fashion and develops output drive signals RB (Red Bus), GB (Green Bus), and BB (Blue Bus), for activating the red bus 5, green bus 6, and blue bus 7, respectively, of the display 43.

Figure 15:
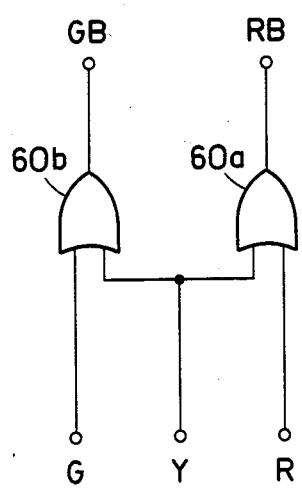
FIG. 15 is a schematic diagram of a color control logic circuit for controlling 2-primary color display.
Figure 16:
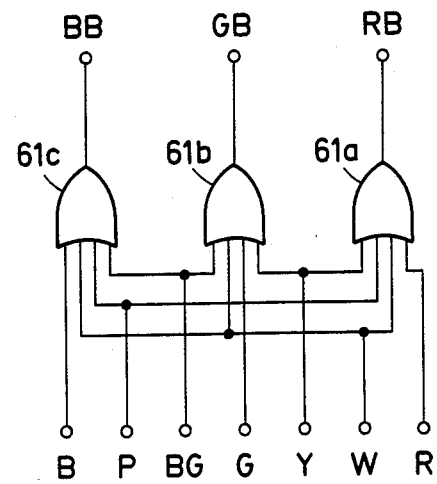
FIG. 16 is a schematic diagram of a color control logic circuit for controlling 3-primary color display.

Exemplary schematic diagrams of the color control logic circuits shown in FIGS. 15 and 16 consider active high logic levels, which means that only the selected color control input are maintained at a high logic level, while all remaining color control inputs are maintained at a low logic level. The circuit in FIG. 15 is a detail of the color control logic circuit 69a employing 2-input logic OR gates 60a, 60b, interposed between the color control inputs R, Y, G and bus control outputs RB, GB, in a manner which will become more apparent from the description below. A like circuit in FIG. 16 is a detail of the color control logic circuit 69b employing 4-input logic OR gates 61a, 61b, 61c similarly interposed between the color control inputs B, P, BG, G, Y, W, R and bus control outputs RB, GB, BB. It will be obvious to those skilled in the art that other types of logic devices may be effectively used.

Figure 17:
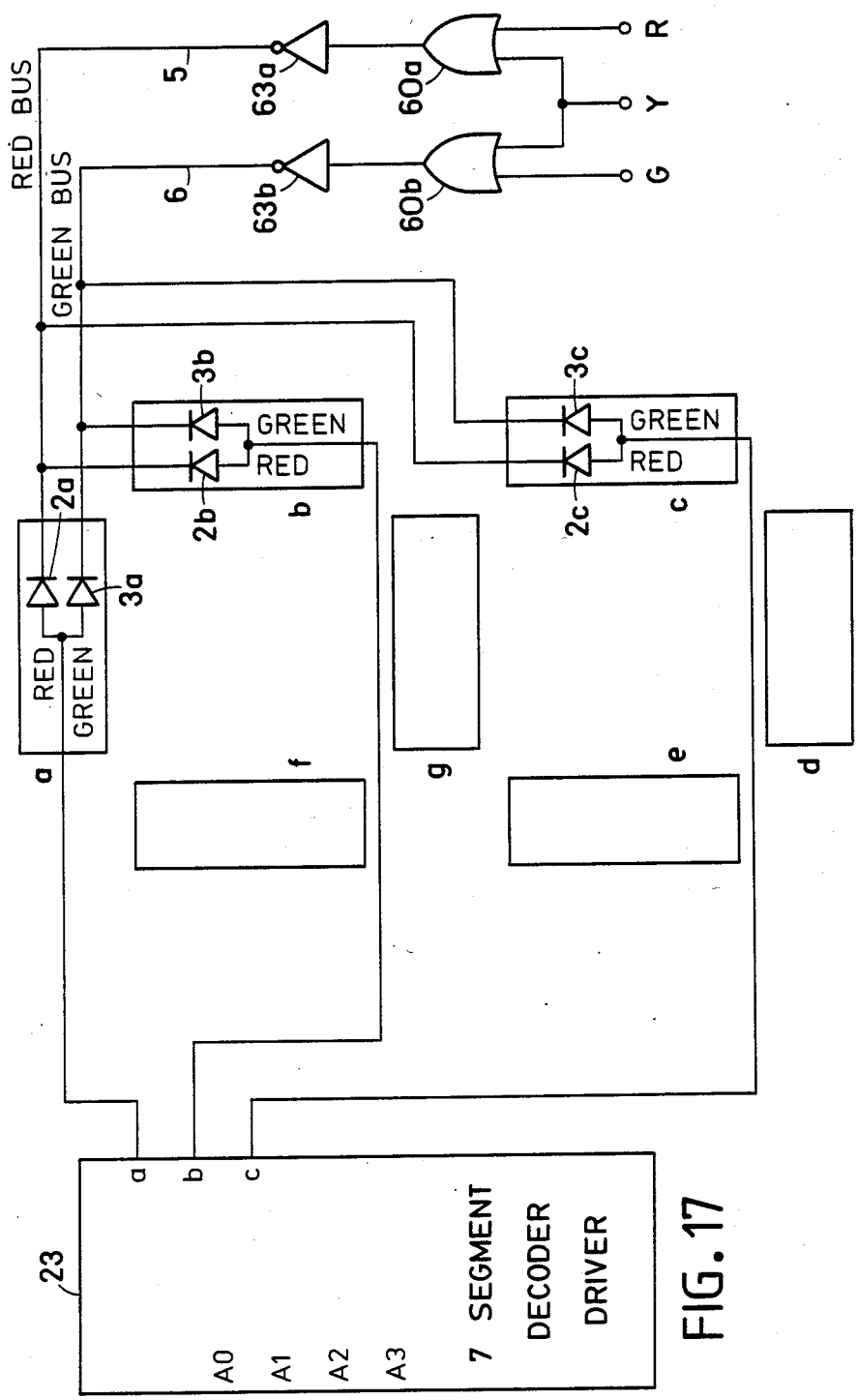
FIG. 17 is a simplified schematic diagram, similar to FIG. 11, showing how number '7' can be displayed in three different colors.

The operation of the 2-primary color 7-segment display will be now explained in detail on example of illuminating the digit '7' in three different colors. A simplified schematic diagram to facilitate the explanation is shown in FIG. 17. Any digit between 0 and 9 can be selectively displayed by applying the appropriate BCD code to the inputs A0, A1, A2, A3 of the common-cathode 7-segment decoder driver 23. The decoder 23 will develop at its outputs a, b, c, d, e, f, g, and DP, the drive signals for energizing selected groups of the segments to thereby visually display the selected number, in a manner well known to those having ordinary skill in the art. To display decimal number '7', a BCD code 0111 is applied to the inputs A0, A1, A2, A3. The decoder 23 will develop high voltage levels at its outputs a, b, c, to illuminate the respective segments a, b, c, and low voltage levels at all remaining outputs (not shown), to extinguish all remaining segments.

To illuminate the display in red color, the color control input R is raised to a high logic level, and the color control inputs Y and G are maintained at a low logic level. As a result, the output of the OR gate 60a will rise to a high logic level, thereby causing the output of the buffer 63a to drop to a low logic level. The current will flow from the output a of the decoder 23, via red LED 2a, red bus 5, to the current sinking output of the buffer 63a. Similarly, the current will flow from the output b of the decoder 23, via red LED 2b, red bus 5, to the output of the buffer 63a. The current from the output c of the decoder 23 will flow via red LED 2c, red bus 5, to the output of the buffer 63a. As a result, the segments a, b, c will illuminate in red color, thereby causing a visual impression of a character '7'. The green LEDs 3a, 3b, 3c will remain extinguished because the output of the buffer 63b is at a high logic level, thereby disabling the green bus 6.

To illuminate the display in green color, the color control input G is raised to a high logic level, while the color control inputs R and Y are maintained at a low logic level. As a result, the output of the OR gate 60b will rise to a high logic level, thereby causing the output of the buffer 63b to drop to a low logic level. The current will flow from the output a of the decoder 23, via green LED 3a, green bus 6, to the current sinking output of the buffer 63b. Similarly, the current will flow from the output b of the decoder 23, via green LED 3b, green bus 6, to the output of the buffer 63b. The current from the output c of the decoder 23 will flow, via green LED 3c, green bus 6, to the output of the buffer 63b. As a result, the segments a, b, c will illuminate in green color. The red LEDs 2a, 2b, 2c will remain extinguished because the output of the buffer 63a is at a high logic level, thereby disabling the red bus 5.

To illuminate the display in yellow color, the color control input Y is raised to a high logic level, while the color inputs R and G are maintained at a low logic level. As a result, the outputs of both OR gates 61a, 61b will rise to a high logic level, thereby causing the outputs of both buffers 63a, 63b to drop to a low logic level. The current will flow from the output a of the decoder 23, via red LED 2a, red bus 5, to the current sinking output of the buffer 63a, and, via green LED 3a, green bus 6, to the current sinking output of the buffer 63b. Similarly, the current from the output b of the decoder 23 will flow, via red LED 2b, red bus 5, to the output of the buffer 63a, and, via green LED 3b, green bus 6, to the output of the buffer 63b. The current from the output c of the decoder 23 will flow, via red LED 2c, red bus 5, to the output of the buffer 63a, and, via green LED 3c, green bus 6, to the output of the buffer 63b. As a result of blending light of red and green color in each segment, the segments a, b, c will illluminate in substantially yellow color.

Figure 18:
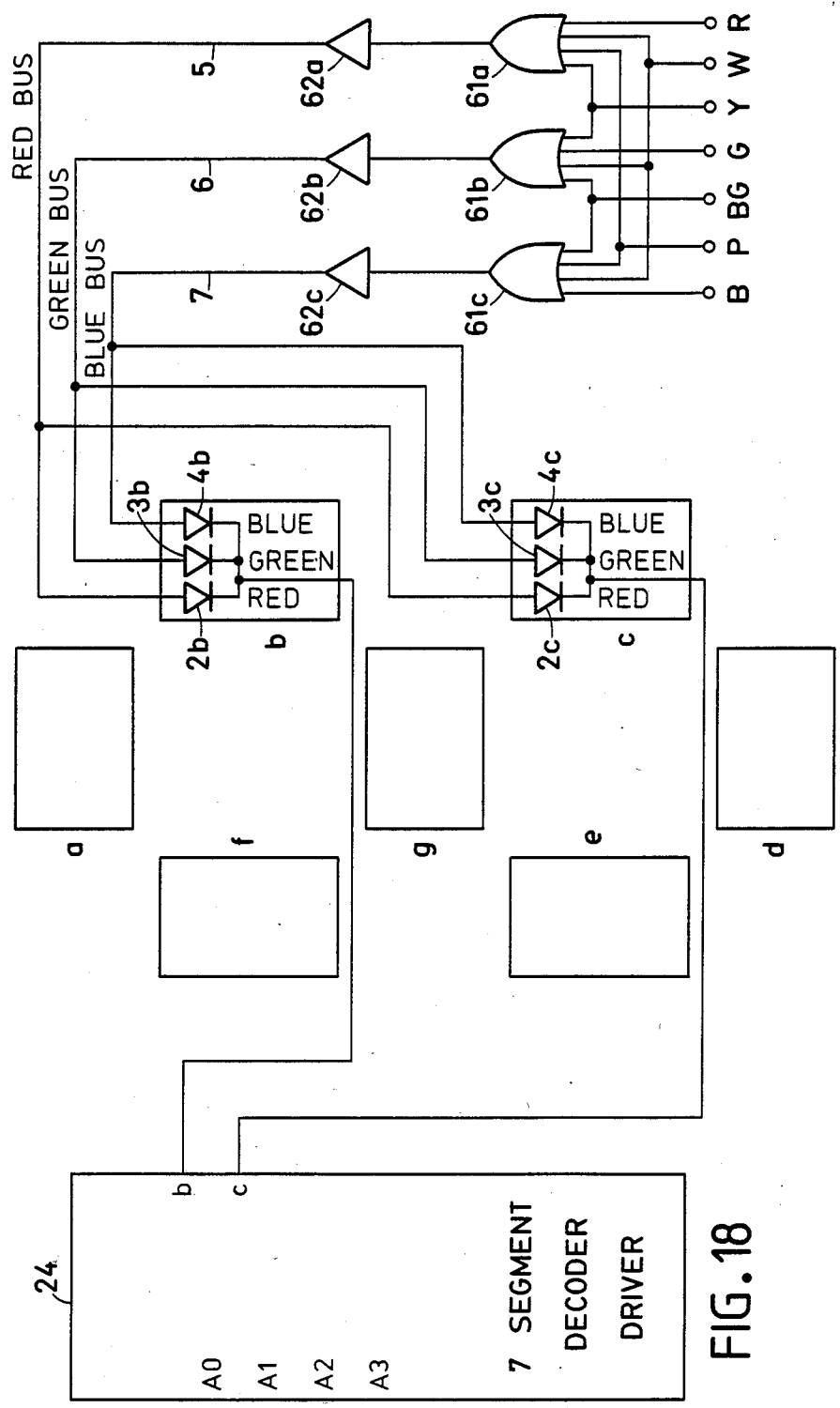
FIG. 18 is a simplified schematic diagram, similar to FIG. 12, showing how number '1' can be displayed in seven different colors.

The operation of the 3-primary color 7-segment display shown in FIG. 12 will be now explained in detail on example of illuminating the digit '1' in seven different colors. A simplified schematic diagram to facilitate the explanation is shown in FIG. 18. To display decimal number '1', a BCD code 0001 is applied to the inputs A0, A1, A2, A3 of the common anode 7-segment decoder driver 24. The decoder 24 will develop low voltage levels at its outputs b, c to illuminate the segments b, c, and high voltage levels at all remaining outputs (not shown), to extinguish all remaining segments.

To illuminate the display in red color, the color control input R is raised to a high logic level, while all remaining color control inputs are maintained at a low logic level. As a result, the output of the OR gate 61a will rise to a high logic level, thereby causing the output of the buffer 62a to rise to a high logic level. The current will flow from the output of the buffer 62a, via red bus 5, red LED 2b, to the output b of the decoder 24, and, via red LED 2c, to the output c of the decoder 24. As a result, the segments b, c will illuminate in red color, thereby causing a visual impression of a character '1'. The green LEDs 3b, 3c and blue LEDs 4b, 4c will remain extinguished because the green bus 6 and blue bus 7 are disabled.

To illuminate the display in green color, the color control input G is raised to a high logic level, while all remaining color control inputs are maintained at a low logic level. As a result, the output of the OR gate 61b will rise to a high logic level, thereby causing the output of the buffer 62b to rise to a high logic level. The current will flow from the output of the buffer 62b, via green bus 6, green LED 3b, to the output b of the decoder 24, and, via green LED 3c, to the output c of the decoder 24. As a result, the segments b, c will illuminate in green color.

To illuminate the display in blue color, the color control input B is raised to a high logic level, while all remaining color control inputs are maintained at a low logic level. As a result, the output of the OR gate 61c will rise to a high logic level, thereby causing the output of the buffer 62c to rise to a high logic level. The current will flow from the output of the buffer 62c, via blue bus 7, blue LED 4b, to the output b of the decoder 24, and, via blue LED 4c, to the output c of the decoder 24.

As a result, the segments b, c will illuminate in blue color.

To illuminate the display in yellow color, the color control input Y is raised to a high logic level, while all remaining color control inputs are maintained at a low logic level. As a result, the outputs of the OR gates 61a, 61b will rise to a high logic level, thereby causing the outputs of the buffers 62a, 62b to rise to a high logic level. The current will flow from the output of the buffer 62a, via red bus 5, red LED 2b, to the output b of the decoder 24, and, via red LED 2c, to the output c of the decoder 24. The current will also flow from the output of the buffer 62b, via green bus 6, green LED 3b, to the output b of the decoder 24, and, via green LED 3c, to the output c of the decoder 24. As a result of blending light of red and green colors in each segment, the segments b, c will illuminate in substantially yellow color.

To illuminate the display in purple color, the color control input P is raised to a high logic level, while all remaining color control inputs are maintained at a low logic level. As a result, the outputs of the OR gates 61a, 61c will rise to a high logic level, thereby causing the outputs of the buffers 62a, 62c to rise to a high logic level. The current will flow from the output of the buffer 62a, via red bus 5, red LED 2b, to the output b of the decoder 24, and, via red LED 2c, to the output c of the decoder 24. The current will also flow from the output of the buffer 62c, via blue bus 7, blue LED 4b, to the output b of the decoder 24, and, via blue LED 4c, to the output c of the decoder 24. As a result of blending light of red and blue color in each segment, the segments b, c will illuminate in substantially purple color.

To illuminate the display in blue-green color, the color control input BG is raised to a high logic level, while all remaining color control inputs are maintained at a low logic level. As a result, the outputs of the OR gates 61b, 61c will rise to a high logic level, thereby causing the outputs of the buffers 62b, 62c to rise to a high logic level. The current will flow from the output of the buffer 61b, via green bus 6, green LED 3b, to the output b of the decoder 24, and, via green LED 3c, to the output c of the decoder 24. The current will also flow from the output of the decoder 62c, via blue bus 7, blue LED 4b, to the output b of the decoder 24, and, via blue LED 4c, to the output c of the decoder 24. As a result of blending light of green and blue colors in each segment, the segments b, c will illuminate in substantially blue-green color.

To illuminate the display in white color, the color control input W is raised to a high logic level, while all remaining color control inputs are maintained at a low logic level. As a result, the outputs of the OR gates 61a, 61b, 61c will rise to a high logic level, thereby causing the outputs of the respective buffers to rise to a high logic level. The current will flow from the output of the buffer 62a, via red bus 5, red LED 2b, to the output b of the decoder 24, and, via red LED 2c, to the output c of the decoder 24. The current will also flow from the output of the buffer 62b, via green bus 6, green LED 3b, to the output b of the decoder 24, and, via green LED 3c, to the output c of the decoder 24. The current will also flow from the output of the buffer 62c, via blue bus 7, blue LED 4b, to the output b of the decoder 24, and, via blue LED 4c, to the output c of the decoder 24. As a result of blending light of red, green, and blue colors in each segment, the segments b, c will illuminate in substantially white color.

Since the outputs of the 7-segment decoder 24 may be overloaded by driving a triad of LEDs in parallel in the display 43, rather than a single LED in a monochromatic display, it would be obvious to employ suitable buffers to drive respective color display segments (not shown).

Figure 19:
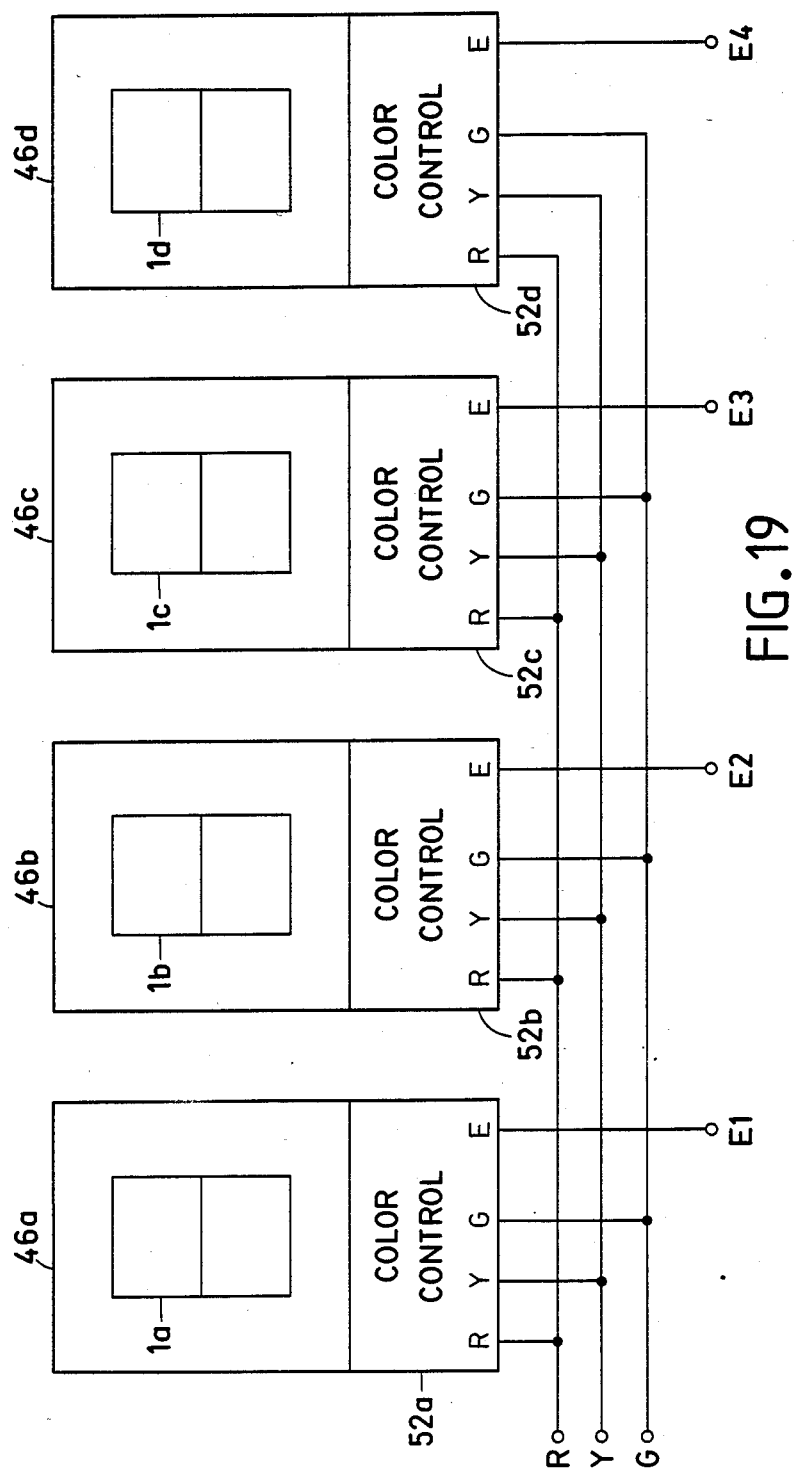
FIG. 19 is a block diagram of 2-primary color 4-digit display.

To illustrate how the present invention can be utilized in a multi-element variable color display configuration, in FIG. 19 is shown a detail of the interconnection in a 2-primary color 4-digit display. The color control inputs R, Y, G of all display elements 46a, 46b, 46c, 46d are interconnected, respectively, and the enable inputs E1, E2, E3, E4 are used to control the conditions of respective display elements. A high logic level at the enable input E will extinguish the particular display element; a low logic level there will illuminate the element in a color determined by the instant conditions of the color control logic inputs R, Y, G.

Figure 20:
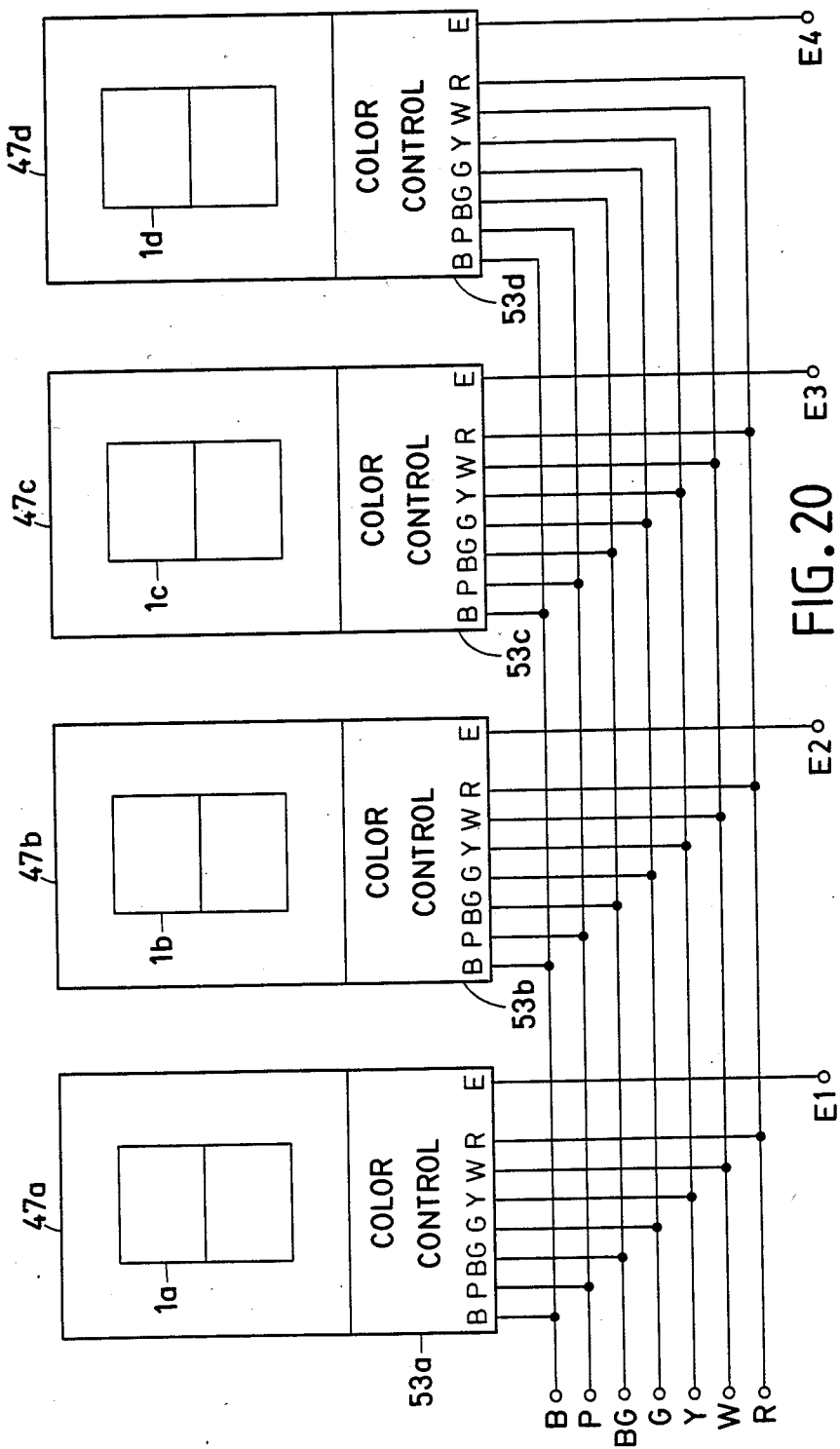
FIG. 20 is a block diagram of 3-primary color 4-digit display.

In FIG. 20 is shown a like detail of the interconnection in a 3-primary color 4-digit display. Similarly, the color control inputs B, P, BG, G, Y, W, R of all display elements 47a, 47b, 47c, 47d are interconnected and the conditions of respective display elements are controlled by the enable inputs E1, E2, E3, E4. A high logic level at the enable input E will extinguish the particular display element; a low logic level therein will illuminate the element in a color determined by the instant conditions of the color control logic inputs B, P, BG, G, Y, W, R.

It is readily apparent that a multi-element variable color digital display may be constructed, in accordance with the principles of the invention, either in a common cathodes or in a common anodes configuration. The exemplary color control circuits described herein will cooperate equally well with both such configurations.

The enable inputs E1, E2, E3, E4 may be utilized to control the variable color multi-digit display in a multiplexed configuration, wherein the color codes for the display digits are presented in a sequence, one at a time, at a relatively fast rate, while the particular display digit is enabled.

Figures 21, 22:
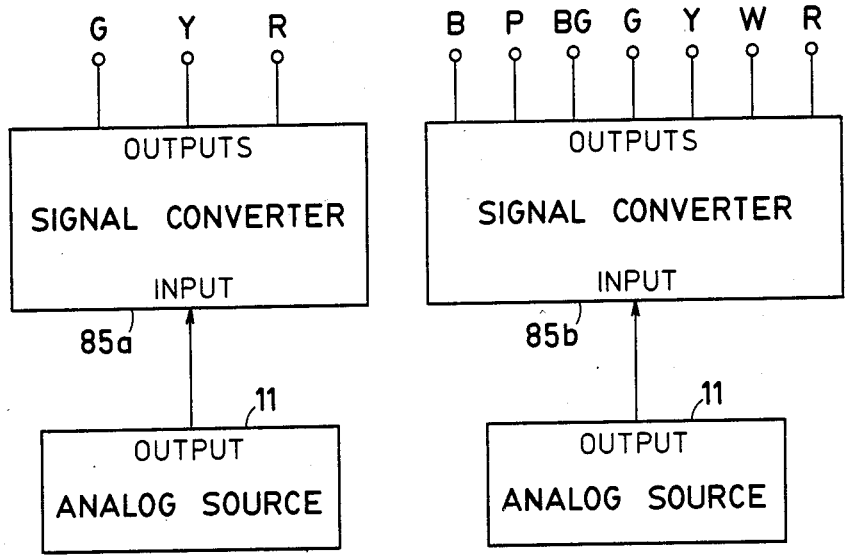
FIG. 21 is a block diagram of a signal converter for 2-primary color display.
FIG. 22 is a block diagram of a signal converter for 3-primary color display.

In FIG. 21 is shown a block diagram of a signal converter for developing color control logic signals for 2-primary color display. The signal converter 85a accepts at its input voltage from a variable analog voltage source 11 and develops at its outputs color control logic signals R, Y, G, having relation to the magnitude of instant input analog voltage, for controlling the color of the variable color display 42, shown in FIGS. 11 and 15, in accordance with the magnitude of input voltage.

In FIG. 22 is shown a block diagram of a like signal converter for developing color control logic signals for 3-primary color display. The signal converter 85b accepts at its inputs voltage from a source 11 and develops output color control logic signals B, P, BG, G, Y, W, R, related to the magnitude of instant input analog voltage, for controlling the color of the variable color display 43, shown in FIGS. 12 and 16, in accordance with the magnitude of input voltage.

Figure 23:
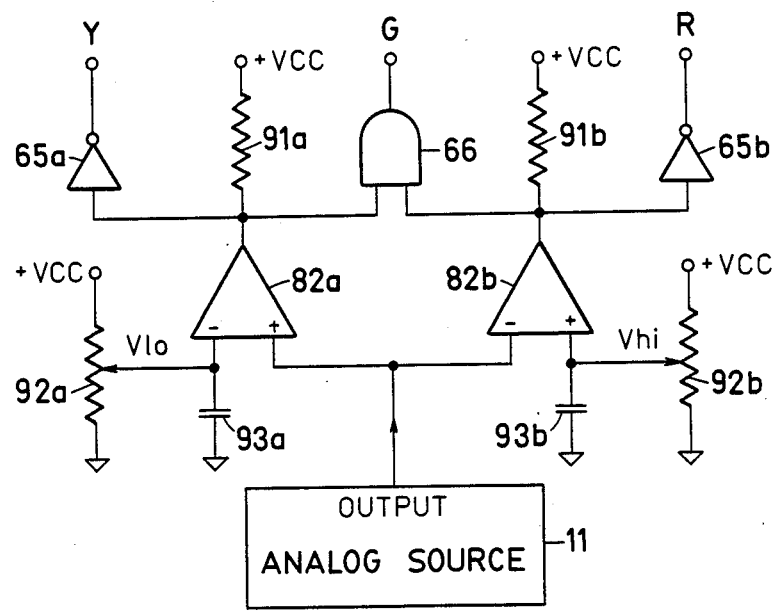
FIG. 23 is a schematic diagram of a comparator circuit for 2-primary color display.

In FIG. 23, the output voltage of a variable analog voltage source 11 is applied to the interconnected inputs of two analog comparators 82a, 82b, in a classic 'window' comparator configuration. When the voltage developed by the source 11 is lower than the low voltage limit Vlo, set by a potentiometer 92a, the output of the comparator 82a will drop to a low logic level, thereby forcing the output of the inverter 65a to rise to a high logic level, to activate the color control logic input Y of the display element 42, shown in FIGS. 11 and 15, to thereby illuminate the display in yellow color.

When the voltage developed by the source 11 is higher than the high voltage limit Vhi, set by a potentiometer 92b, the output of the comparator 82b will drop to a low logic level, thereby forcing the output of the inverter 65b to rise to a high logic level, to activate the color control logic input R, to thereby illuminate the display 42 in red color.

When the voltage developed by the source 11 is between the low voltage limit Vlo and high voltage limit Vhi, the outputs of the comparators 82a, 82b will rise to a high logic level, thereby causing the output of the AND gate 66 to rise to a high logic level, to activate the color control logic input G, to thereby illuminate the display 42 in green color.

Figure 24:
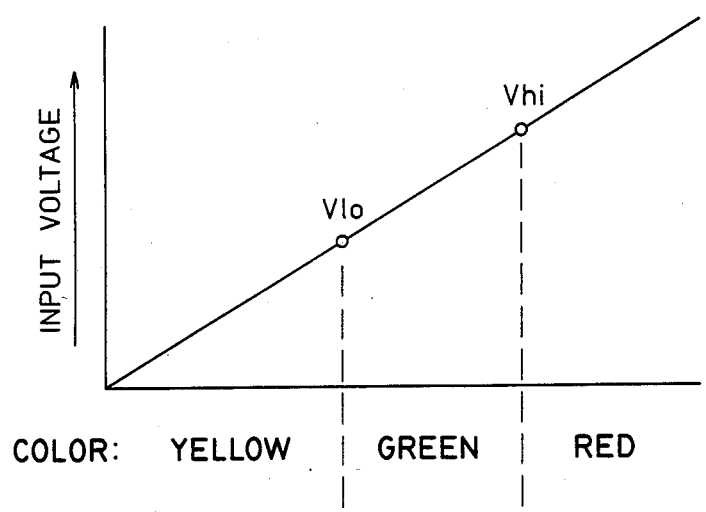
FIG. 24 is a graph showing the relationship between the inputs and outputs of the comparator circuit in FIG. 23.

FIG. 24 is a graph depicting the relationship between the input voltage of the comparator circuit shown in FIG. 23 and the color of the display element shown in FIG. 11. The display element will illuminate in yellow color for the input voltage lower than the limit Vlo, in green color for the input voltage between the limits Vlo and Vhi, and in red color for the input voltage higher than the limit Vhi.

Figure 25:
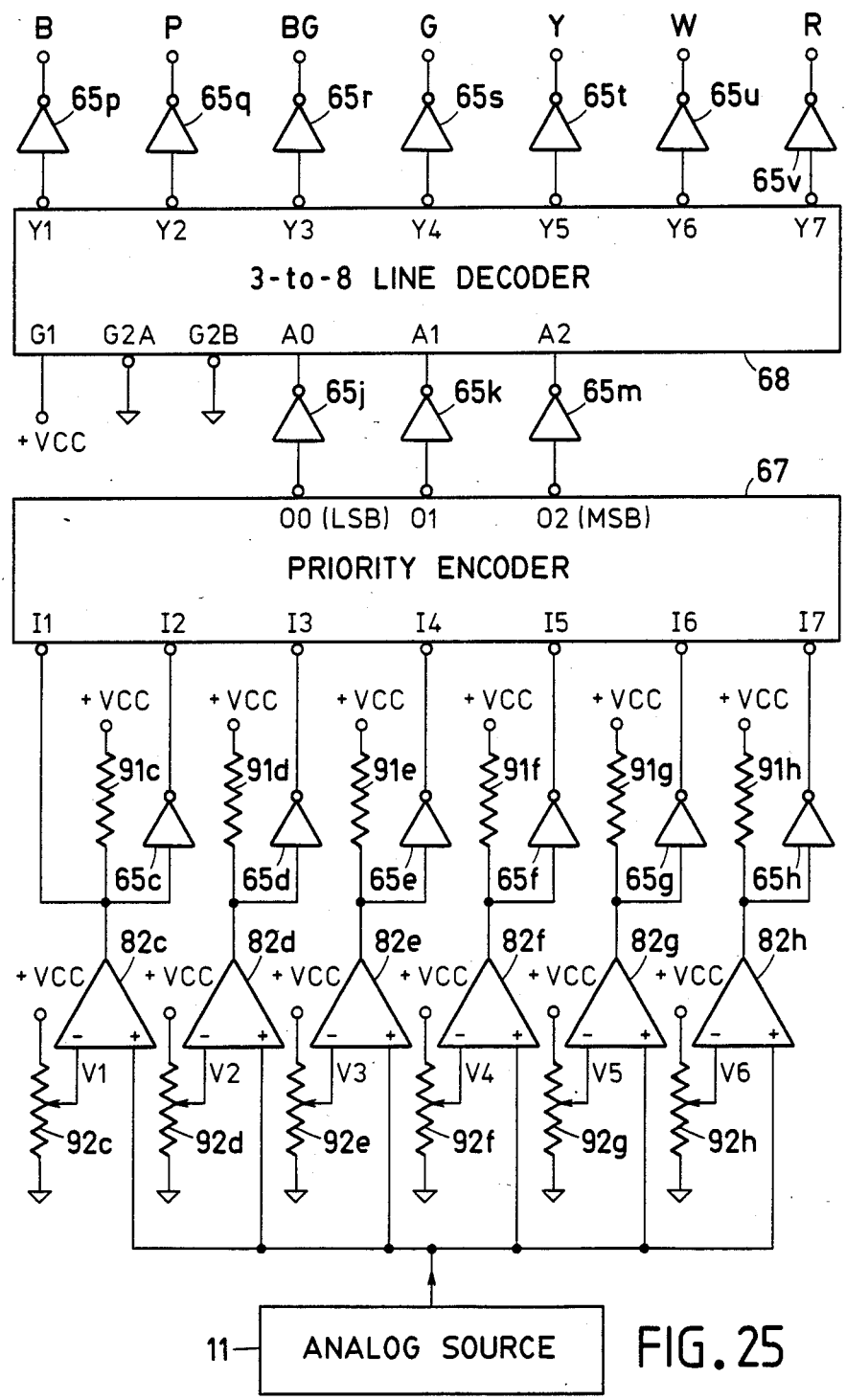
FIG. 25 is a schematic diagram of a comparator circuit for 3-primary color display.

In FIG. 25, the output voltage of a variable analog voltage source 11 is applied to the interconnected '+' inputs of six analog comparators 82c, 82d, 82e, 82f, 82g, 82h, connected in a well known 'multiple aperture window' configuration. There are six progressively increasing voltage limits V1 to V6, set by respective potentiometers 92c to 92h. The outputs of the comparators 82c to 82h are respectively connected, via inverters 65c to 65h, to the inputs I1 to I7 of a priority encoder 67. Each of the inputs I1 to I7 has assigned a certain priority (from I1 being the lowest priority progressively to I7 being the highest one). The priority encoder 67 will develop at its outputs O0, O1, O2 a code identifying the highest priority input activated. The outputs of the encoder 67 are respectively connected, via inverters 65j to 65m, to the inputs A0, A1, A2 of a 3-to-8 line decoder 68, to decode the outputs of the encoder 67 into seven mutually exclusive active logic low outputs Y1 to Y7. The outputs Y1 to Y7 are respectively connected, via inverters 65p to 65v, to the color control logic inputs B, P, BG, G, Y, W, R of the display element 43 shown in the FIGS. 12 and 16.

When the output voltage of the source 11 is lower than the lowest voltage limit V1, the output of the comparator 82c will drop to a low logic level, thereby activating the input I1 of the priority encoder 67. The coder 110 developed at the outputs O0, O1, O2 will be inverted by the inverters 65j to 65m to yield the code 001 which will produce a low logic level at the output Y1, to force, via the inverter 65p, the color control logic input B to a high logic level. The display 43 will illuminate in blue color.

When the output voltage of the source 11 is between the adjacent voltage limits, e.g., V4 and V5, the output of the comparator 82f will rise to a high logic level, thereby activating the input I5 of the priority encoder 67. The code 100 developed at the inputs of the decoder 68 will produce a high logic level at the color control logic input Y and the display 43 will illuminate in yellow color.

Figure 26:
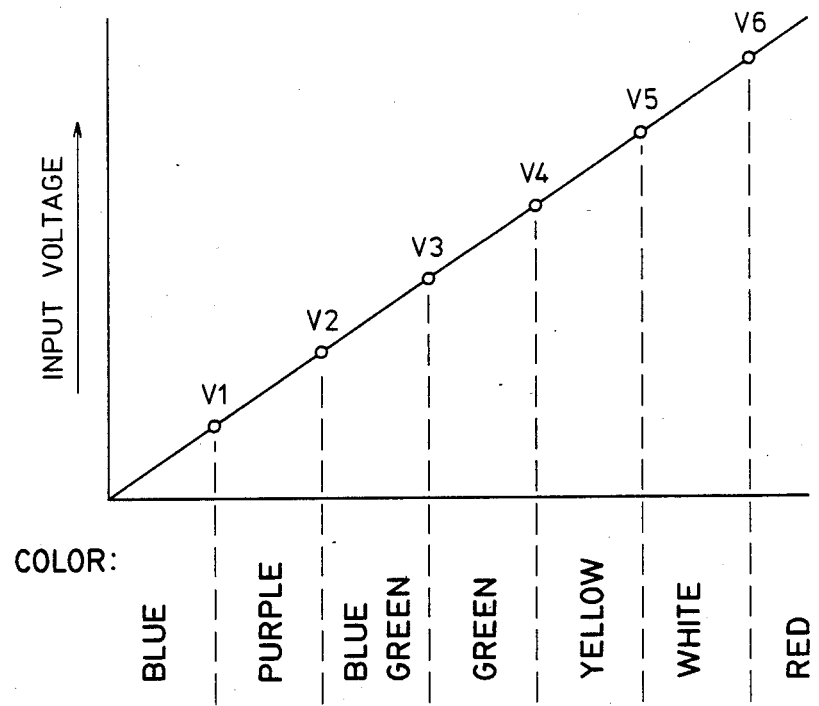
FIG. 26 is a graph showing the relationship between the inputs and outputs of the comparator circuit in FIG. 25.

FIG. 26 is a graph depicting the relationship between the input voltage of the comparator circuit shown in FIG. 25 and the color of the display element shown in FIG. 12. The display element will illuminate in blue color for the input voltage lower than the limit V1, in purple color for the input voltage between the limits V1 and V2, in blue-green color for the input voltage between the limits V2 and V3, in green color for the input voltage between the limits V3 and V4, in yellow color for the input voltage between the limits V4 and V5, in white color for the input voltage between the limits V5 and V6, and in red color for the input voltage higher than the limit V6.

It would be obvious to those having ordinary skill in the art, in the view of this disclosure, that the color sequences could be readily changed by differently interconnecting the outputs of the comparator circuit with the color control logic inputs of the display element.

CONTINUOUSLY VARIABLE COLOR CONVERTER

FIG. 27 is a block diagram of a 2-LED continuously variable color display system, which includes a device 10 for developing electric signals and 2-LED color converter circuit 57 for controlling the red bus 5 and green bus 6, respectively, of the 2-LED variable color display 42 in accordance with the electric signals.

FIG. 28 is a block diagram of 3-LED continuously variable color display system which differs from the like system shown in FIG. 27 in that a 3-LED color converter circuit 58 is utilized to control the red bus 5, green bus 6, and blue bus 7, respectively, of the 3-LED variable color display 43, in accordance with the electric signals developed by the device 10.

The display system shown in FIG. 29 utilizes a scaling circuit 80a which scales input analog voltage levels to a voltage range suitable for an A/D converter 74a, which in turn develops at its outputs digital code having relation to the value of the input analog voltage. The output lines of the A/D converter 74a are connected to the address inputs of a memory 76 having a plurality of addressable locations which contain data indicating the portions of red color for several different values of the input analog voltage. The output data of the memory 76 are applied to the inputs of a color converter 57 which will develop control signals for the red bus 5 and green bus 6, respectively, of the variable color display 42.

The display system shown in FIG. 30 utilizes a scaling circuit 80b and an A/D converter 74b for converting the instant value of input analog voltage to a digital code. The outputs of the A/D converter 74b are connected, in parallel, to the address inputs of a memory 76a, which contains data indicating the portions of red color, to the address inputs of a memory 76b, which contains data indicating the portions of green color, and to the address inputs of a memory 76c, which contains data indicating the portions of blue color. The output data of the memory 76a are applied to the red color converter 59a which will develop control signals for the red bus 5 of the variable color display 43. The output data of the memory 76b are applied to the green color converter 59b which will develop control signals for the green bus 6 of the display 43. The output data of the memory 76c are applied to the blue color converter 59c which will develop control signals for the blue bus 7 of the display 43.

Figure 31:
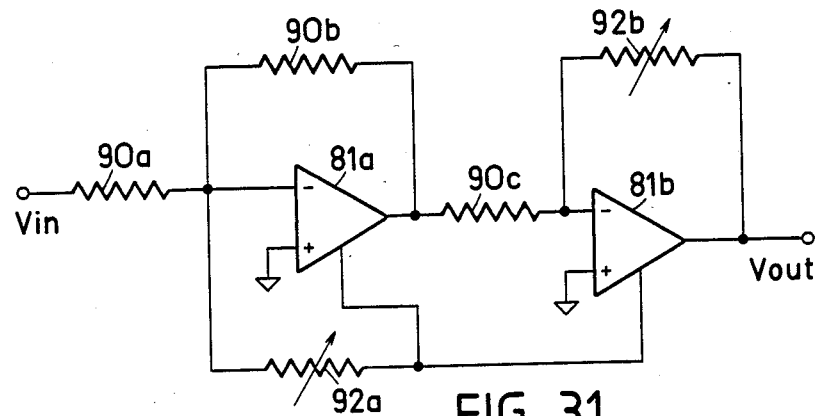
FIG. 31 is a schematic diagram of a scaling circuit.

FIG. 31 is a schematic diagram of a scaling circuit capable of shifting and amplifying the input voltage levels. The circuit utilizes two operational amplifiers 81a, 81b in a standard inverting configuration. The amplifier 81a is set for a unity gain, by using resistors 90a, 90b of equal values; the potentiometer 92a is adjusted to set a desired offset voltage. The amplifier 81b will set the gain, by adjusting the potentiometer 92b, to a desired value. As a result, the input voltage, which may vary between arbitrary limits Vlow and Vhigh, may be scaled and shifted to the range between 0 Volts and 9.961 Volts, to facilitate the use of a commercially available A/D converter.

Figure 32:
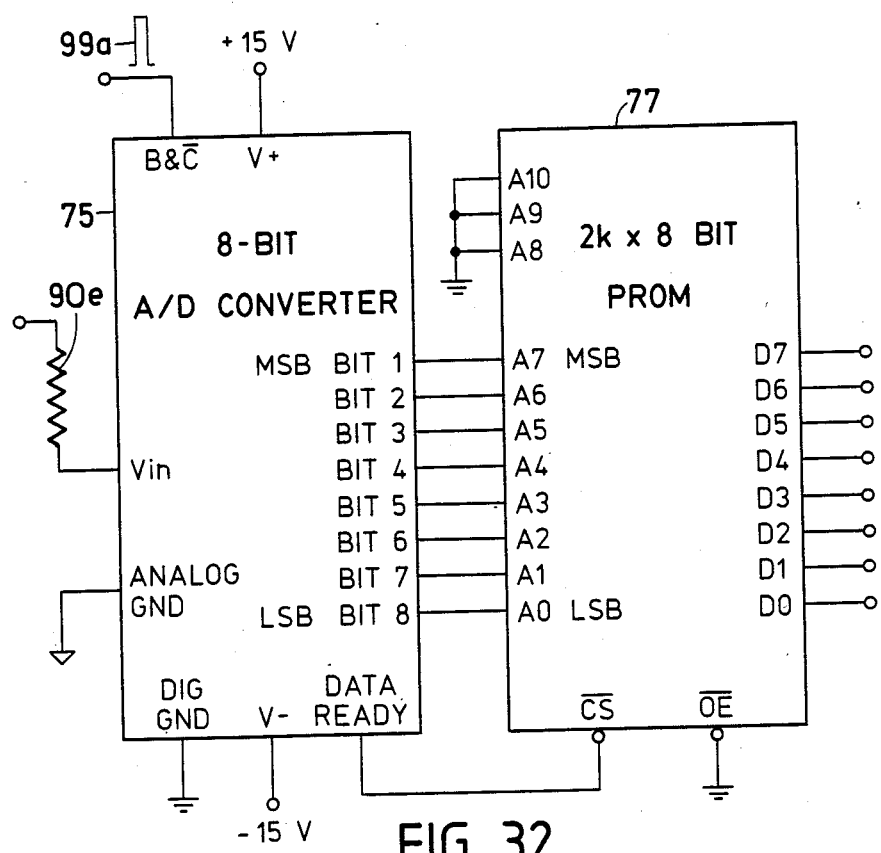
FIG. 32 is a schematic diagram of an A/D converter and memory combination of FIGS. 29 and 30.

FIG. 32 is a schematic diagram of an A/D (analog-to-digital) converter 75 which is capable of converting input analog voltage to 8-bit digital data for addressing a memory 77. The conversion may be initiated from time to time by applying a short positive pulse 99a to the Blank and Convert input B&C. The converter 75 will thereafter perform a conversion of the instant input voltage to 8-bit data indicative of its value. When the conversion is completed, the Data Ready output DR drops to a low logic level, thereby indicating that the data is available at the outputs Bit 1 to Bit 8, which are directly connected to respective address inputs A0 to A7 of the memory 77. When the DR output drops to a low logic level, the Chip Select input CS of the memory 77 is activated, the memory 77 is enabled, and the data, residing at the address selected by the instant output of the converter 75, will appear at its data outputs D0 to D7.

Figure 33:
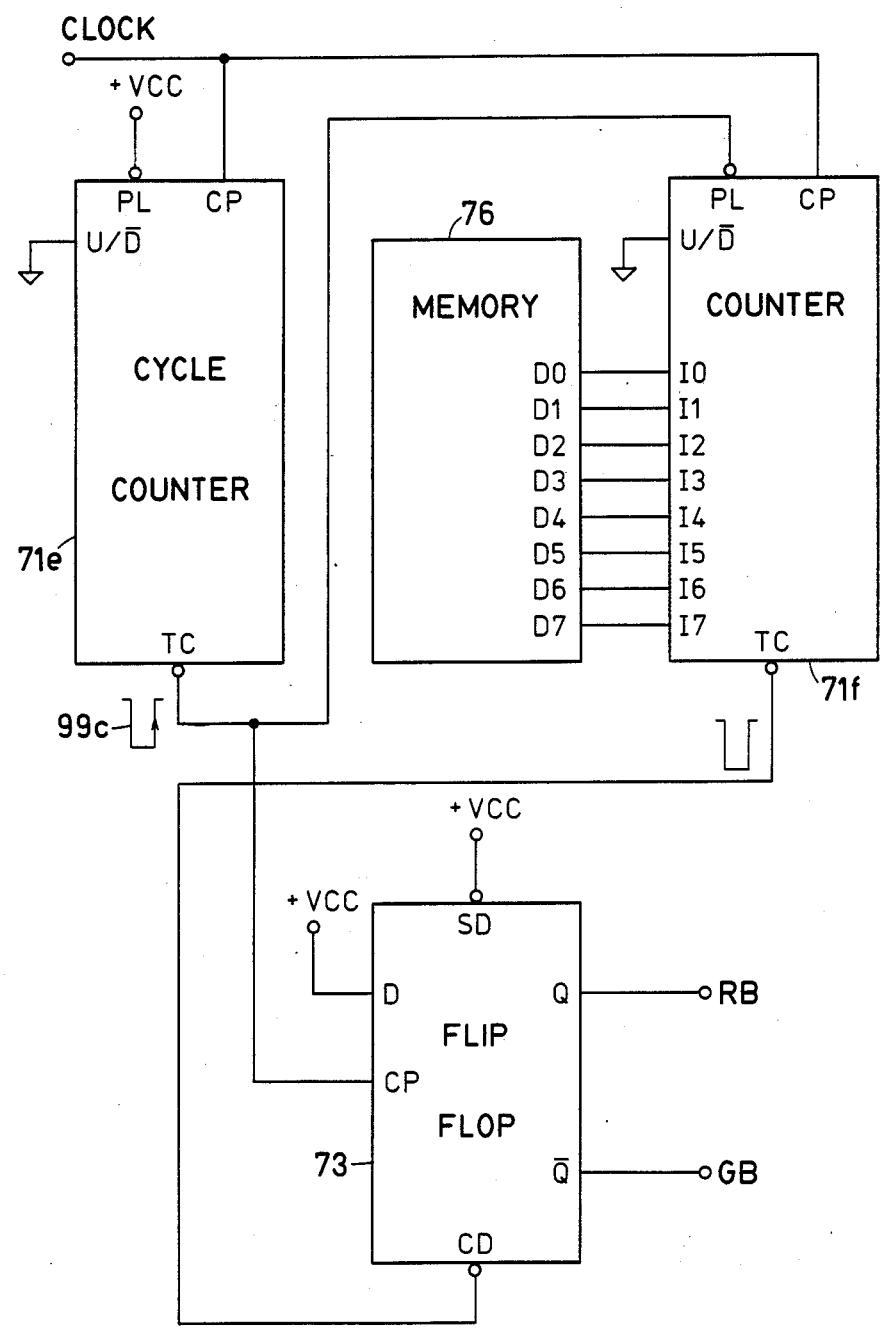
FIG. 33 is a schematic diagram of a memory and color converter combination of FIG. 29.
Figure 34:
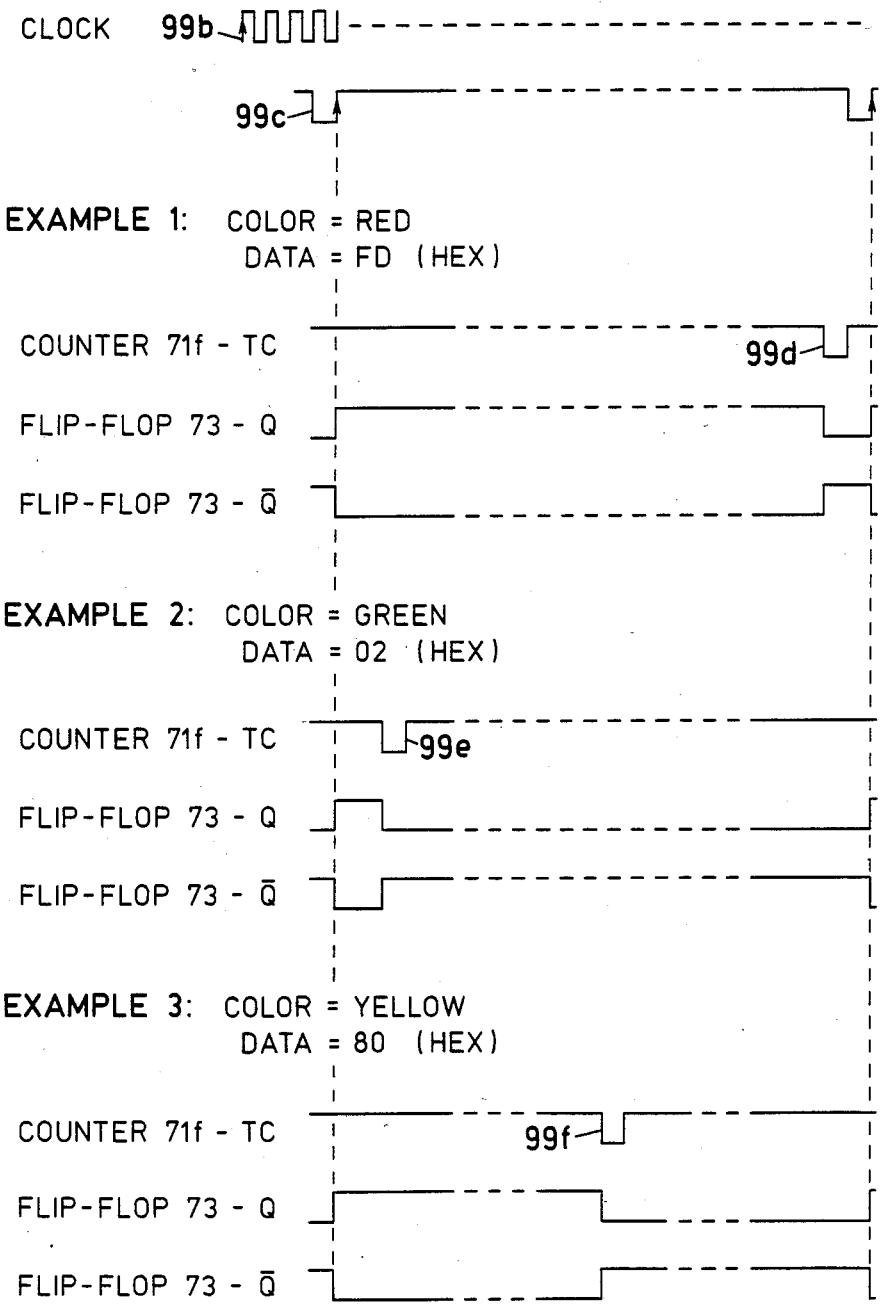
FIG. 34 is a timing diagram of the circuit shown in FIG. 33.

The description of the schematic diagram in FIG. 33 should be considered together with its accompanying timing diagram shown in FIG. 34. A clock signal 99b of a suitable frequency (e.g., 10 kHz), to provide a flicker-free display, is applied to the Clock Pulse inputs CP of the 4-bit binary counters 71e, 71f, to step same down. At the end of each counter cycle, which takes 256 clock cycles to complete, the Terminal Count output TC of the counter 71e will drop to a low logic level for one clock cycle, to thereby indicate that the lowest count was reached. The negative pulse 99c in the TC output of the counter 71e, which is connected to the Parallel Load input PL of the counter 71f, will cause the instant data at the outputs of the memory 76 to be loaded into the counter 71f. The data at the memory represent the portion of the red color; the portion of the green color is complementary. The rising edge of the TC pulse 99c will trigger the flip-flop 73 into its set condition wherein its output Q rises to a high logic level.

The counter 71f will count down, from the loaded value, until it reaches zero count, at which moment its TC output will drop to a low logic level. The negative pulse at the TC output of the counter 71f, which is connected to the Clear Direct input CD of the flip-flop 73, will cause the latter to be reset and to remain in its reset condition until it is set again at the beginning of the next 256-count cycle. It is thus obvious that the Q output of the flip-flop 73 will be at a high logic level for a period of time proportional to the data initially loaded into the counter 71f. The complementary output $\overline{Q}$ will be at a high logic level for a complementary period of time.

The Q and $\overline{Q}$ outputs of the flip-flop 73 are connected to the red bus 5 and green bus 6, respectively, via suitable buffers 63a, 63b, shown in detail in FIG. 11, to energize the respective buses for variable time periods, depending on the data stored in the memory 76.

By referring now, more particularly, to the timing diagram shown in FIG. 34, in which the waveforms are compressed to facilitate the illustration, the EXAMPLE 1 considers the memory data 'FD', in a standard hexadecimal notation, to generate light of substantially red color. At the beginning of the counter cycle, the pulse 99c will load the data 'FD' into the counter 71f. Simultaneously, the flip-flop 73 is set by the rising edge of the pulse 99c. The counter 71f will be thereafter stepped down, by clock pulses 99b, until it reaches zero count, 2 clock cycles before the end of the counter cycle. At that instant a short negative pulse 99d will be produced at its output TC to reset the flip-flop 73, which will remain reset for 2 clock cycles and will be set again by the pulse 99c at the beginning of the next counter cycle, which will repeat the process. It is readily apparent that the flip-flop 73 was set for 254 clock cycles, or about 99% of the time, and reset for 2 clock cycles, or about 1% of the time. Accordingly, the red bus 5 of the display 42 will be energized for about 99% of the time, and the green bus 6 will be energized for the remaining about 1% of the time. As a result, the display 42 will illuminate in substantially red color.

The EXAMPLE 2 considers the memory data '02' (HEX) to generate light of substantially green color. At the beginning of the counter cycle, the data '02' will be loaded into the counter 71f, and, simultaneously, the flip-flop 73 will be set. The counter 71f will count down and will reach zero count after 2 clock cycles. At that instant it will produce at its output TC a negative pulse 99e to reset the flip-flop 73. It is readily apparent that the flip-flop 73 was set for 2 clock cycles, or about 1% of the time, and reset for 254 clock cycles, or about 99% of the time. Accordingly, the red bus 5 of the display 42 will be energized for about 1% of the time, and the green bus 6 will be energized for the remaining about 99% of the time. As a result, the display 42 will illuminate in substantially green color.

The EXAMPLE 3 considers the memory data '80' (HEX) to generate light of substantially yellow color. At the beginning of the counter cycle, the data '80' will be loaded into the counter 71f, and, simultaneously, the flip-flop 73 will be set. The counter 71f will count down, and will reach zero count after 128 clock cycles. At that instant it will produce at its output TC a negative pulse 99f to reset the flip-flop 73. It is readily apparent that the flip-flop 73 was set for 128 clock cycles, or about 50% of the time, and reset for 128 clock cycles, or about 50% of the time. Accordingly, the red bus 5 of the display 42 will be energized for about 50% of the time, and the green bus 6 will be energized for the remaining about 50% of the time. As a result of blending substantially equal portions of red and green colors, the display 42 will illuminate in substantially yellow color.

Figure 35:
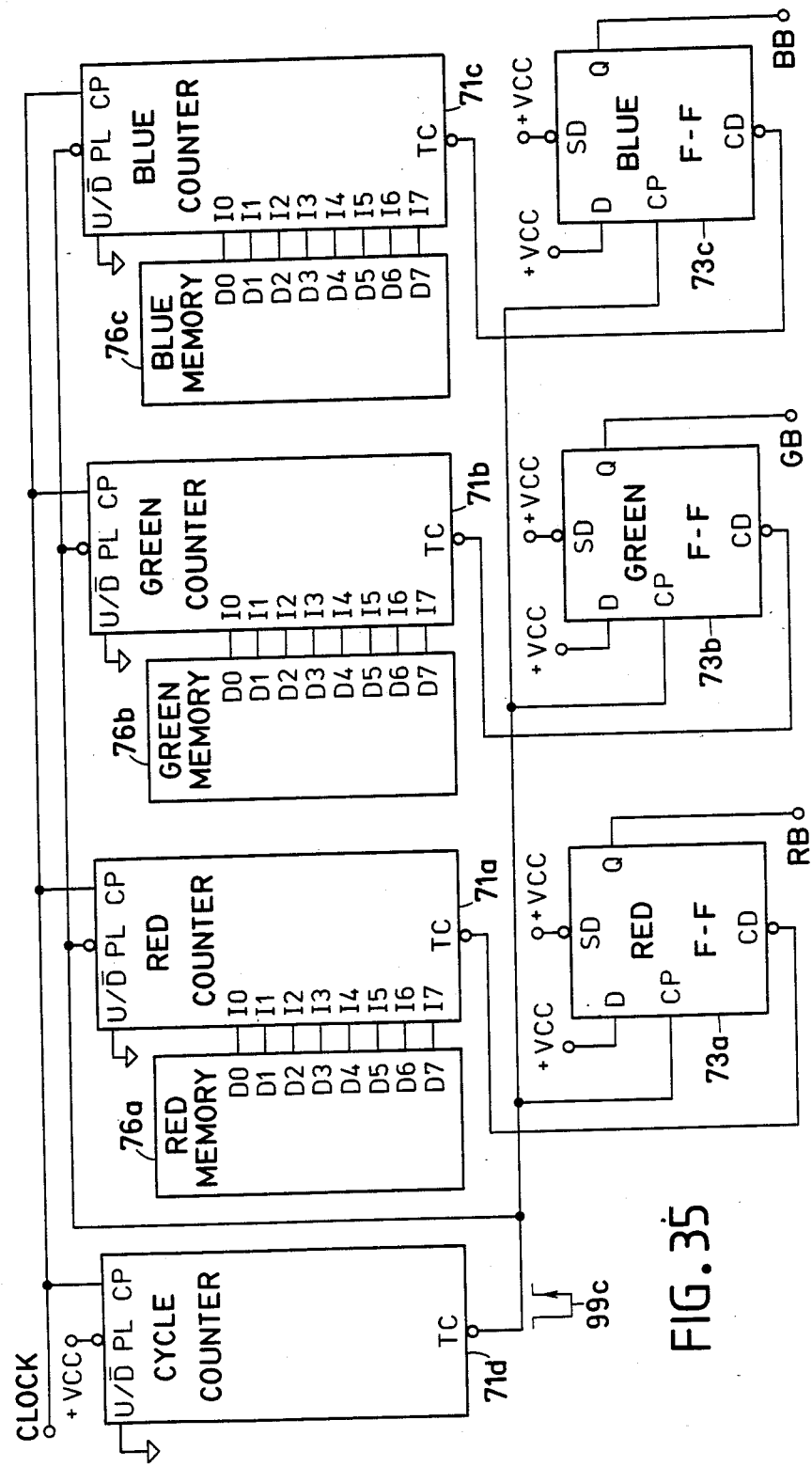
FIG. 35 is a schematic diagram of a memory and color converter combination of FIG. 30.
Figure 36:
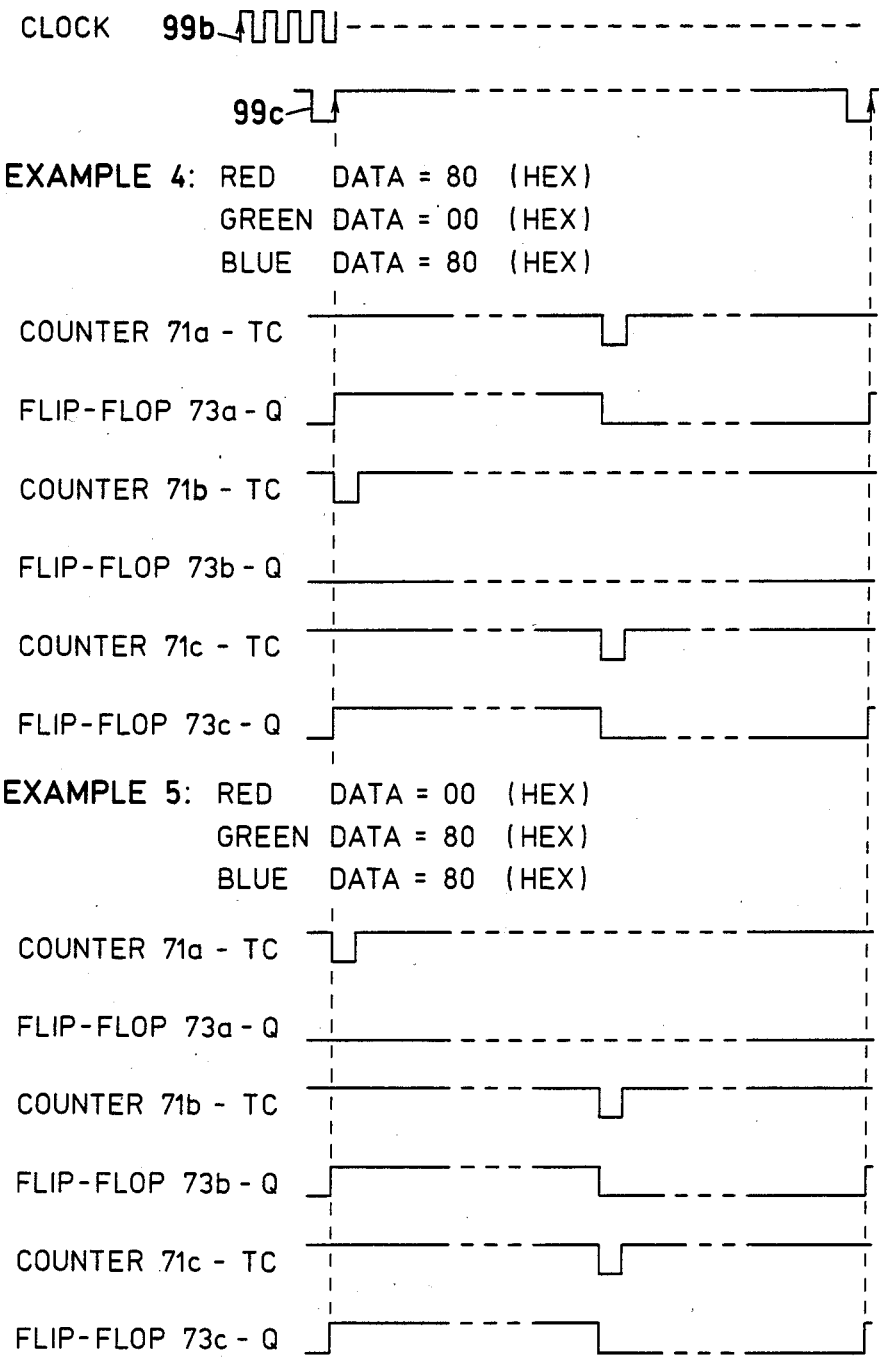
FIG. 36 is a timing diagram of the circuit shown in FIG. 35.
Figure 37:
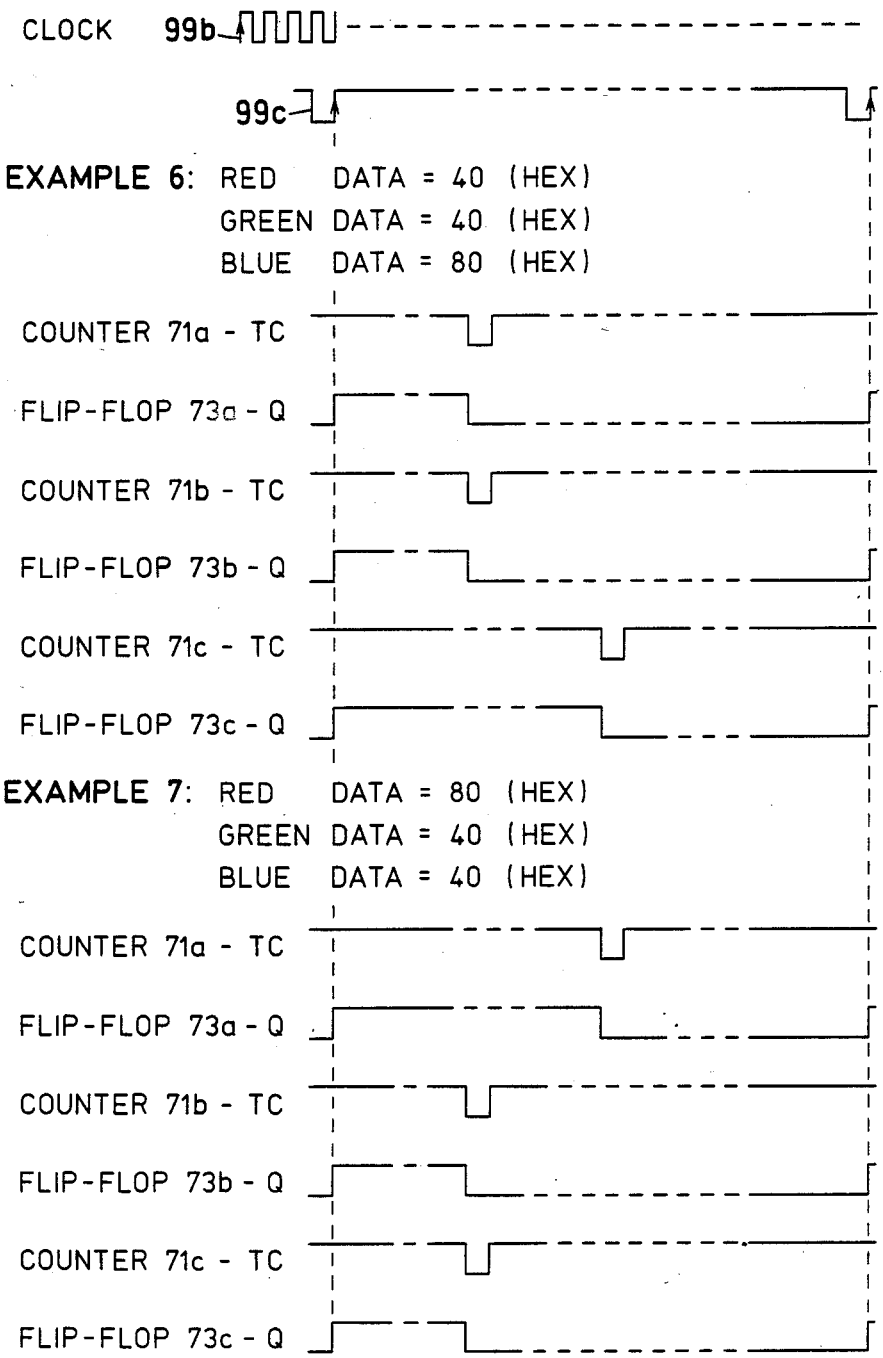
FIG. 37 is a continuation of the timing diagram of FIG. 36.

The description of the schematic diagram of a 3-LED color converter in FIG. 35 should be taken together with its accompanying timing diagrams shown in FIGS. 36 and 37. A clock signal 99b is applied to the CP inputs of the counters 71d, 71a, 71b, 71c, to step same down. Every 256 counts a negative pulse 99c is generated at the TC output of the counter 71d, to load data into the counters 71a, 71b, 71c from respective memories 76a, 76b, 76c, and to set the flip-flops 73a, 73b, 73c. The data in the RED memory 76a represent the portions of the red color, the data in the GREEN memory 76b represent the portions of the green color, and the data in the BLUE memory 76c represent the portions of the blue color to be blended together.

The counters 71a, 71b, 71c will count down, from the respective loaded values, until zero counts are reached. When the respective values of the loaded data are different, the length of time of the count-down will be different for each counter. When a particular counter reaches zero count, its TC output will momentarily drop to a low logic level, to reset its associated flip-flop (the RED counter 71a resets its RED flip-flop 73a, etc.). Eventually, all three flip-flops 73a, 73b, 73c will be reset. The Q outputs of the flip-flops 73a, 73b, 73c are connected to the red bus 5, green bus 6, and blue bus 7, respectively, via suitable buffers 62a, 62b, 62c, as shown in FIG. 12, to energize the respective buses for variable periods of time.

By referring now more particularly to the timing diagram shown in FIGS. 36 and 37, the EXAMPLE 4 considers the red memory data '80', green memory data '00', and blue memory data '80', all in hexadecimal notation, to generate light of substantially purple color. At the beginning of the counter cycle, the pulse 99c will simultaneously load the data '80' from the red memory 77a into the red counter 71a, data '00' from the green memory 77b into the green counter 71b, and data '80' from the blue memory 77c into the blue counter 71c. The counters 71a, 71b, 71c will be thereafter stepped down. The red counter 71a will reach its zero count after 128 clock cycles; the green counter 71b will reach its zero count immediately; the blue counter 71c will reach its zero count after 128 clock cycles.

It is readily apparent that the red flip-flop 73a was set for 128 clock cycles, or about 50% of the time, the green flip-flop 73b was never set, and the blue flip-flop 73c was set for 128 clock cycles, or about 50% of the time. Accordingly, the red bus 5 of the display 43 will be energized for about 50% of the time, green bus 6 will never be energized, and blue bus 7 will be energized for about 50% of the time. As a result of blending together substantially equal portions of red and blue colors, the display 43 will illuminate in substantially purple color.

The EXAMPLE 5 considers the red memory data '00', green memory data '80', and blue memory data '80', to generate light of substantially blue-green color. At the beginning of the counter cycle, the data '00' is loaded into the red counter 71a, data '80' is loaded into the green counter 71b, and data '80' is loaded into the blue counter 71c. The red counter 71a will reach its zero count immediately, the green counter 71b will reach its zero count after 128 clock periods, and so will the blue counter 71c.

The red flip-flop 73a was never set, the green flip-flop 73b was set for 128 clock pulses, or about 50% of the time, and so was the blue flip-flop 73c. Accordingly, the green bus 5 of the display 43 wil be energized for about 50% of the time, and so will be the blue bus. As a result, the display 43 will illuminate in substantially blue-green color.

The EXAMPLE 6 considers the red memory data '40', green memory data '40', and blue memory data '80', to generate light of substantially cyan color. At the beginning of the counter cycle, the data '40' is loaded into the red counter 71a, data '40' is loaded into the green counter 71b, and data '80' is loaded into the blue counter 71c. The red counter 71a will reach its zero count after 64 clock cycles, and so will the green counter 71b. The blue counter 71c will reach its zero count after 128 clock cycles.

The red flip-flop 73a was set for 64 clock cycles, or about 25% of the time, and so was the green flip-flop 73b. The blue flip-flop 73c was set for 128 clock periods, or about 50% of the time. Accordingly, the red bus 5 and green bus 6 of the display 43 will be energized for about 25% of the time, and the blue bus 7 will be energized for about 50% of the time. As a result of blending about 50% of blue color, 25% of red color, and 25% of green color, the display 43 will illuminate in substantially cyan color.

The EXAMPLE 7 considers the red memory data '80', green memory data '40', and blue memory data '40', to generate light of substantially magenta color. At the beginning of the counter cycle, the data '80' is loaded into the red counter 71a, data '40' is loaded into the green counter 71b, and data '40' is loaded into the blue counter 71c. The red counter 71a will reach its zero count after 128 clock cycles, the green counter 71b will reach its zero count after 64 clock cycles, and so will the blue counter 71c.

The red flip-flop 73a was set for 120 clock cycles, or about 50% of the time, the green flip-flop 73b and blue flip-flop 73c were set for 64 clock cycles, or about 25% of the time. Accordingly, the red bus 5 of the display 43 will be energized for about 50% of the time, green bus 6 and blue bus 7 will be energized for about 25% of the time. As a result, the display 43 will illuminate in substantially magenta color.

Figure 38:
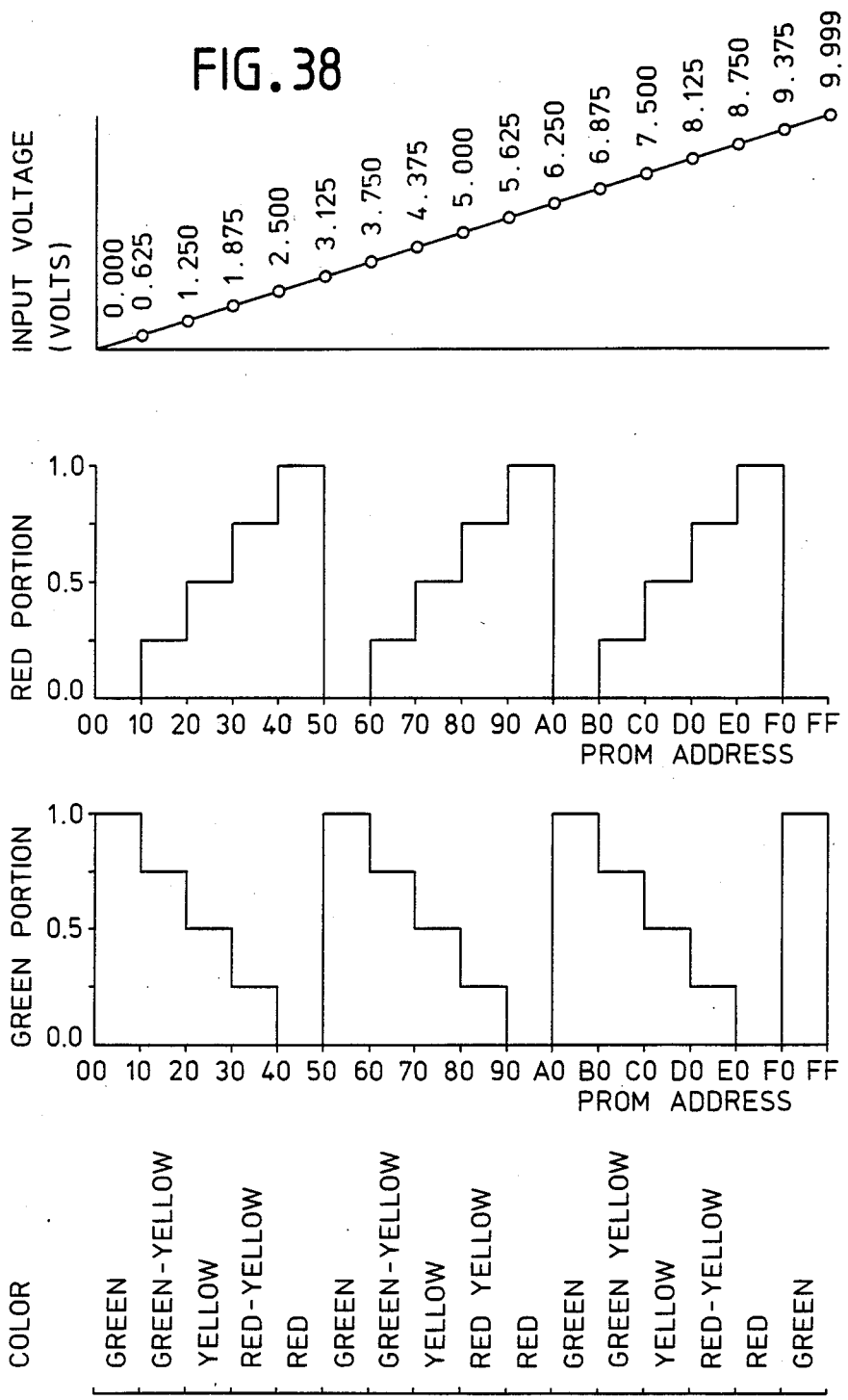
FIG. 38 is a graphic representation of TABLE 1.
Figure 39:
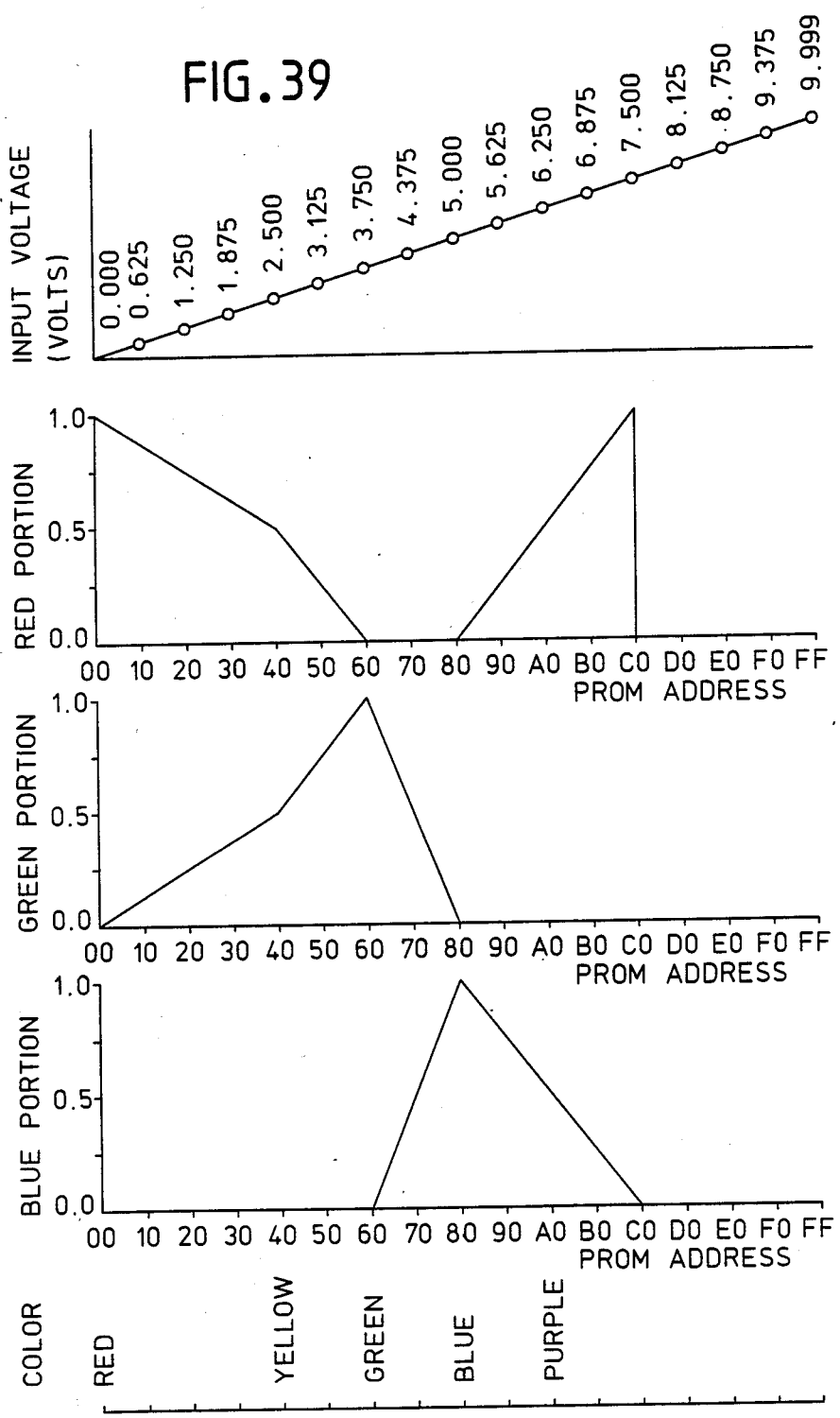
FIG. 39 is a graphic representation of TABLE 2.

By referring now more particularly to FIGS. 38 and 39, which are graphic representations of the TABLES 1 and 2, respectively, the data at each memory address are a digital representation of the portion of the particular primary color. All examples consider an 8-bit wide PROM (Programmable Read Only Memory). However, the principles of the invention could be applied to other types of memories.

In FIG. 38, the RED PORTION indicates the portion of red primary color; the GREEN PORTION indicates the portion of green primary color. The RED PORTION for a particular memory address was calculated by dividing the actual value of data residing at that address by the maximum possible data 'FF' (HEX). The GREEN PORTION for the same memory address is complementary; it was obtained by subtracting the calculated value of the RED PORTION from number 1.0.

In FIG. 38 is shown the characteristic of a like 2-primary color converter, defined in Table 1, for developing color variable in steps: pure green for input voltages less than 0.625 V, substantially yellow for voltages between 1.25 V and 1.875 V, pure red for voltages between 2.5 V and 3.125 V, and of intermediate colors therebetween, this sequence being repeated three times over the voltage range.

In FIG. 39, the RED PORTION indicates the portion of red primary color; the GREEN PORTION indicates the portion of green primary color; the BLUE PORTION indicates the portion of blue primary color. The RED PORTION for a particular memory address was calculated by dividing the value of RED data residing at such address by the maximum possible data 'FF' (HEX). Similarly, the GREEN PORTION for that memory address was obtained by dividing the value of GREEN data by 'FF' (HEX). The BLUE PORTION was obtained by dividing the value of BLUE data by 'FF' (HEX).

In FIG. 39 is shown the characteristic of 3-primary color converter, defined in Table 2, for developing color continuously variable from pure red, through substantially orange and yellow, pure green, pure blue, to substantially purple, in a rainbow-like fashion.

In the examples of the characteristics of color converters, shown in Table 1 and Table 2, the data values stored in the red, green, and blue memories are so designed that the sums of the red data, green data, and blue data are constant for all memory addresses, to provide uniform light intensities for all colors. It is further contemplated that data stored in the red, green, and blue memories may be modified in order to compensate for different efficiencies of red, green, and blue LEDs. By way of an example, data values for a low efficiency LED may be proportionally incremented such that time of energization is proportionally increased, to effectively provide equal luminances for LEDs of unequal efficiencies.

Figure 40:
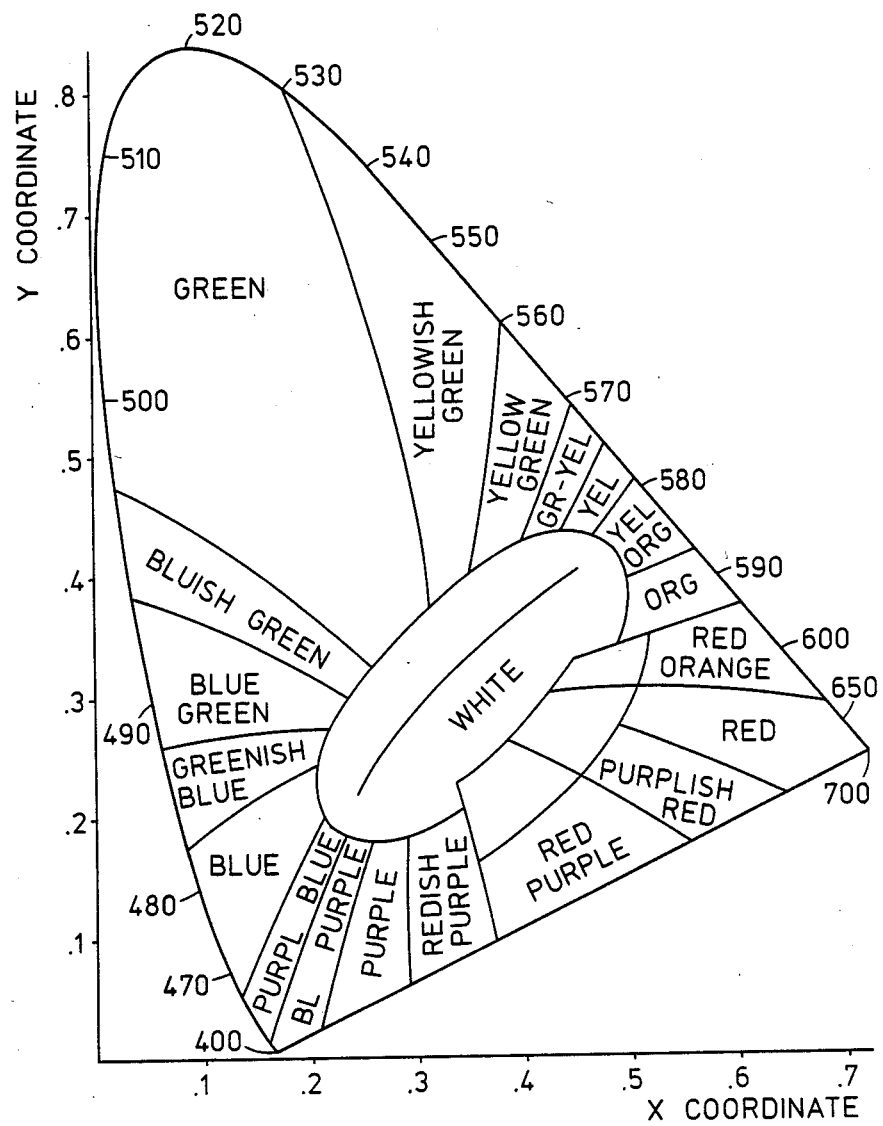
FIG. 40 is a graph of the ICI chromaticity diagram.

With reference to FIG. 40 there is shown the ICI (International Committee on Illumination) chromaticity diagram designed to specify a particular color in terms of x and y coordinates. Pure colors are located along the horseshoe-like periphery. Reference numbers along the periphery indicate wavelength in nanometers. When relative portions of three primary colors are known, the color of light produced by blending their emissions can be determined by examining the x and y values of ICI coordinates.

DIGITAL MULTIMETER

Figure 41:
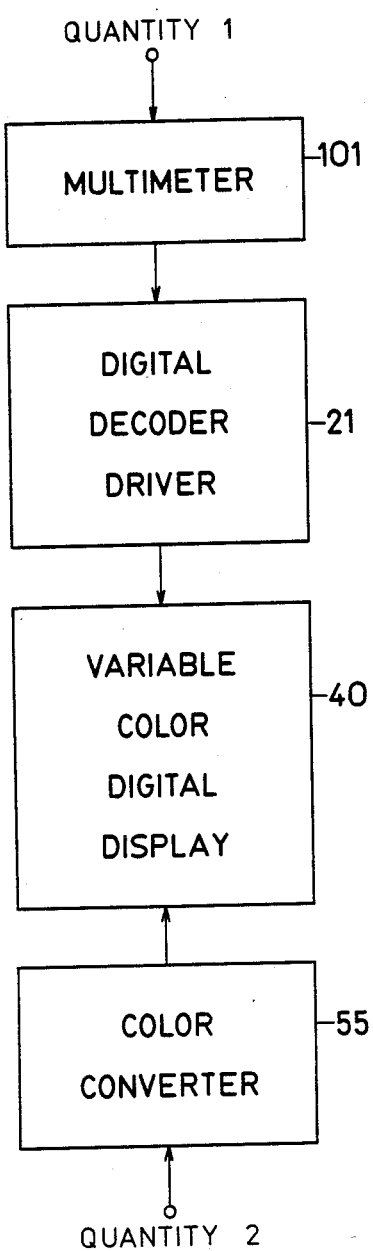
FIG. 41 is a block diagram of a multimeter with variable color digital display.

FIG. 41 is a generalized block diagram of a multimeter with a variable color digital display which includes a multimeter 101 for measuring values of the QUANTITY 1, digital decoder driver 21 for converting the multimeter's output data into a displayable code, and variable color digital display 40 for indicating the measured values in digital format. The invention resides in the addition of a color converter circuit 55 for converting values of the QUANTITY 2 to color control signals for controlling the color of the display 40. The display 40 will thus simultaneously indicate values of the QUANTITY 1, in digital format, and values of the QUANTITY 2, in variable color.

Figure 42:
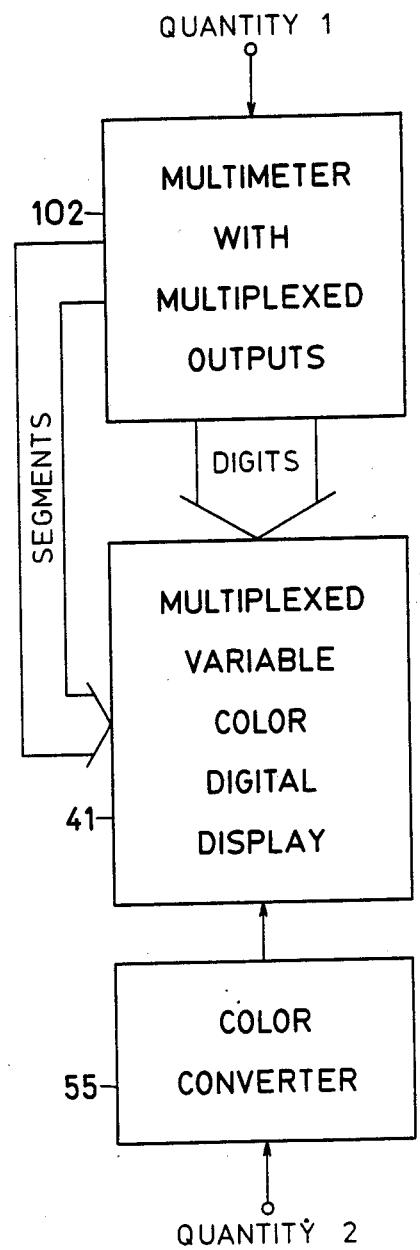
FIG. 42 is a block diagram of a multimeter with multiplexed variable color digital display.

FIG. 42 is a generalized block diagram of a like multimeter system with a multiplexed variable color digital display 41, which differs from the diagram shown in FIG. 41 in that the multimeter 102 develops at its outputs multiplexed signals to directly drive the display 41.

Figure 43:
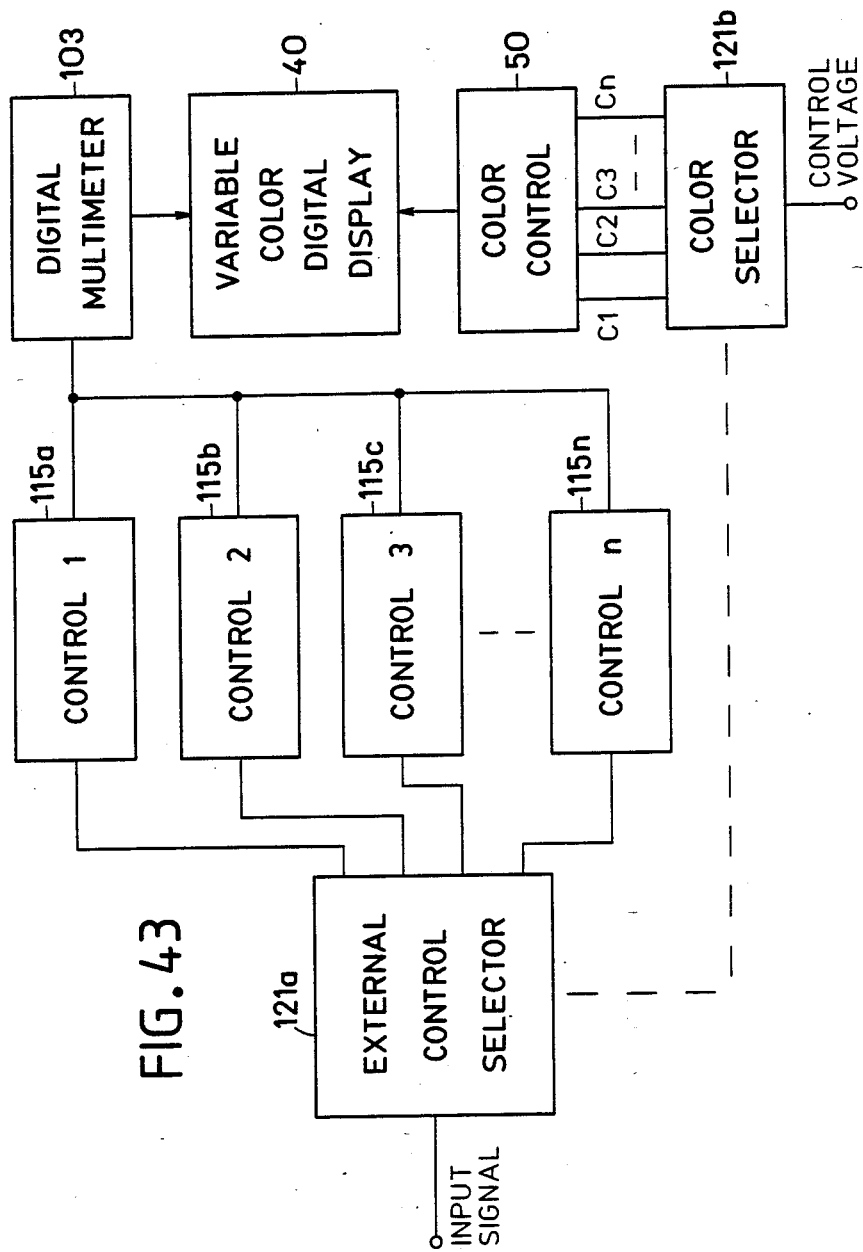
FIG. 43 is a block diagram of a digital multimeter with a display that can change color in accordance with external control.

A digital multimeter shown in a block diagram configuration in FIG. 43 is capable of selectively setting certain of its external controls by an external control selector 121a. The invention resides in the addition of associated color selector 121b for causing the variable color digital display 40 to illuminate in a color corresponding to the selected external control. The measurements performed with different external controls may be displayed in respectively different colors. The selectors 121a, 121b may include relays, mechanical switches, electronic and optical elements, devices for executing program of instructions, and the like. The association between the selectors 121a and 121b may be, in its simplest form, a direct coupling, whereby the selector 121b is always in the same position as the selector 121a, or a more sophisticated association in space, time, hardware, and software. The external controls may comprise measurement modes, such are local, remote, 2-wire, and 4-wire; measurement functions, such as DC voltage, AC voltage, DC current, AC current, resistance, capacitance, and inductance; measurement ranges for selectively scaling measured signals, and the like.

Figure 44:
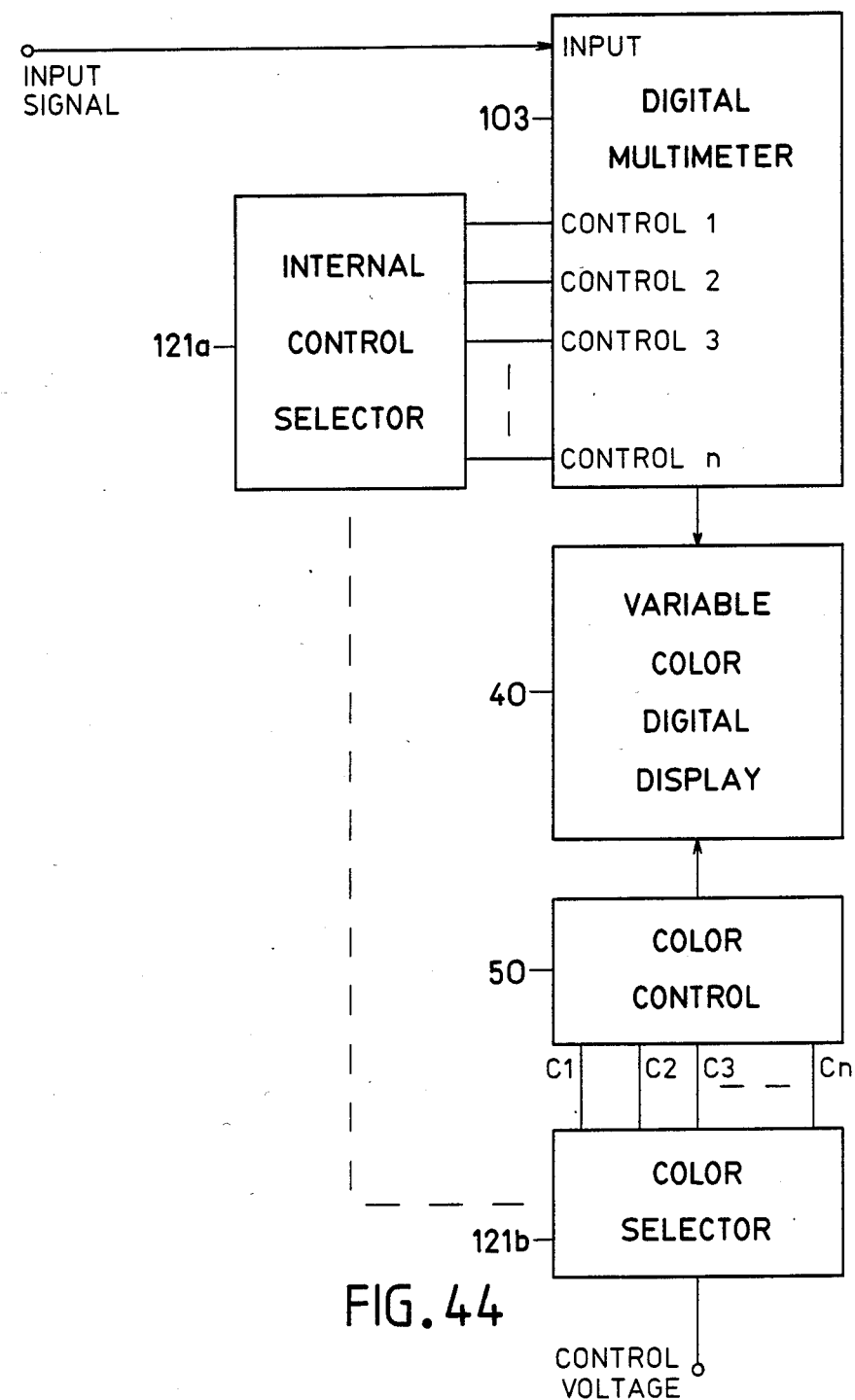
FIG. 44 is a block diagram of a digital multimeter with a display that can change color in accordance with internal control.

In FIG. 44 is shown a block diagram of a like digital multimeter capable of selectively setting certain of its internal measurement controls by an internal control selector 121a. The associated color selector 121b will cause the display 40 to illuminate in a color corresponding to the selected internal control, such that the measurements performed with different internal controls may be displayed in respectively different colors. The internal controls may comprise measurement modifiers, such are single, continuous, synchronous, and asynchronous triggering, sample rate, filter, offset, external reference, and scaling; measurement methods, units, and the like.

Figure 45:
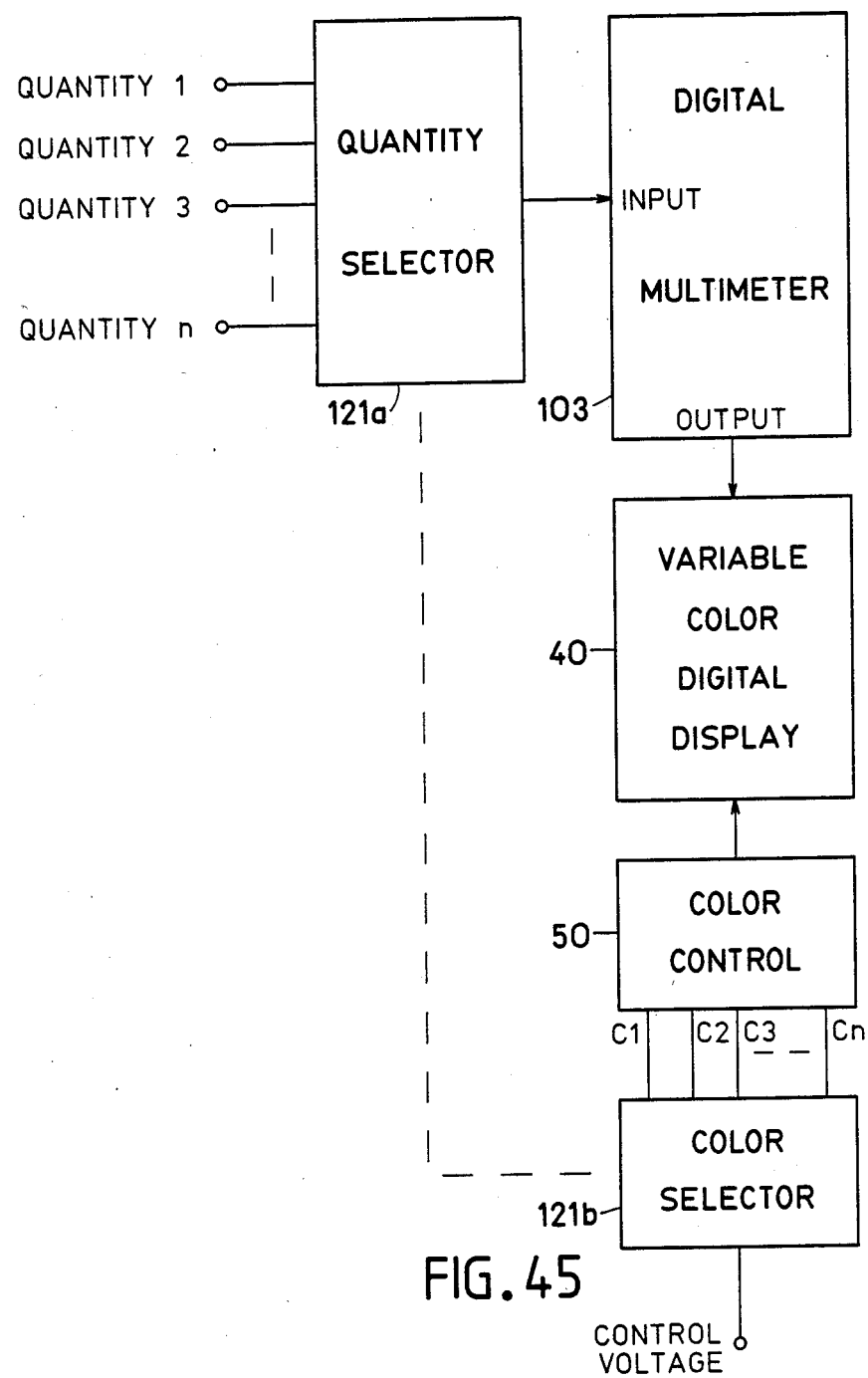
FIG. 45 is a block diagram of a digital multimeter with a display that can change color in accordance with measurement quantity.

FIG. 45 is a block diagram of a digital multimeter with measurement quantity selection. By way of an example, when the quantity selector 121a is in its second position, thereby selecting the QUANTITY 2 to the input of the digital multimeter 103, the associated color selector 121b is also in its second position, thereby applying the control voltage to the color control input C2, to cause the measured values of the QUANTITY 2 to be indicated on the display 40 in the color C2. The measurements of different quantities may be indicated in respectively different colors.

Figure 46:
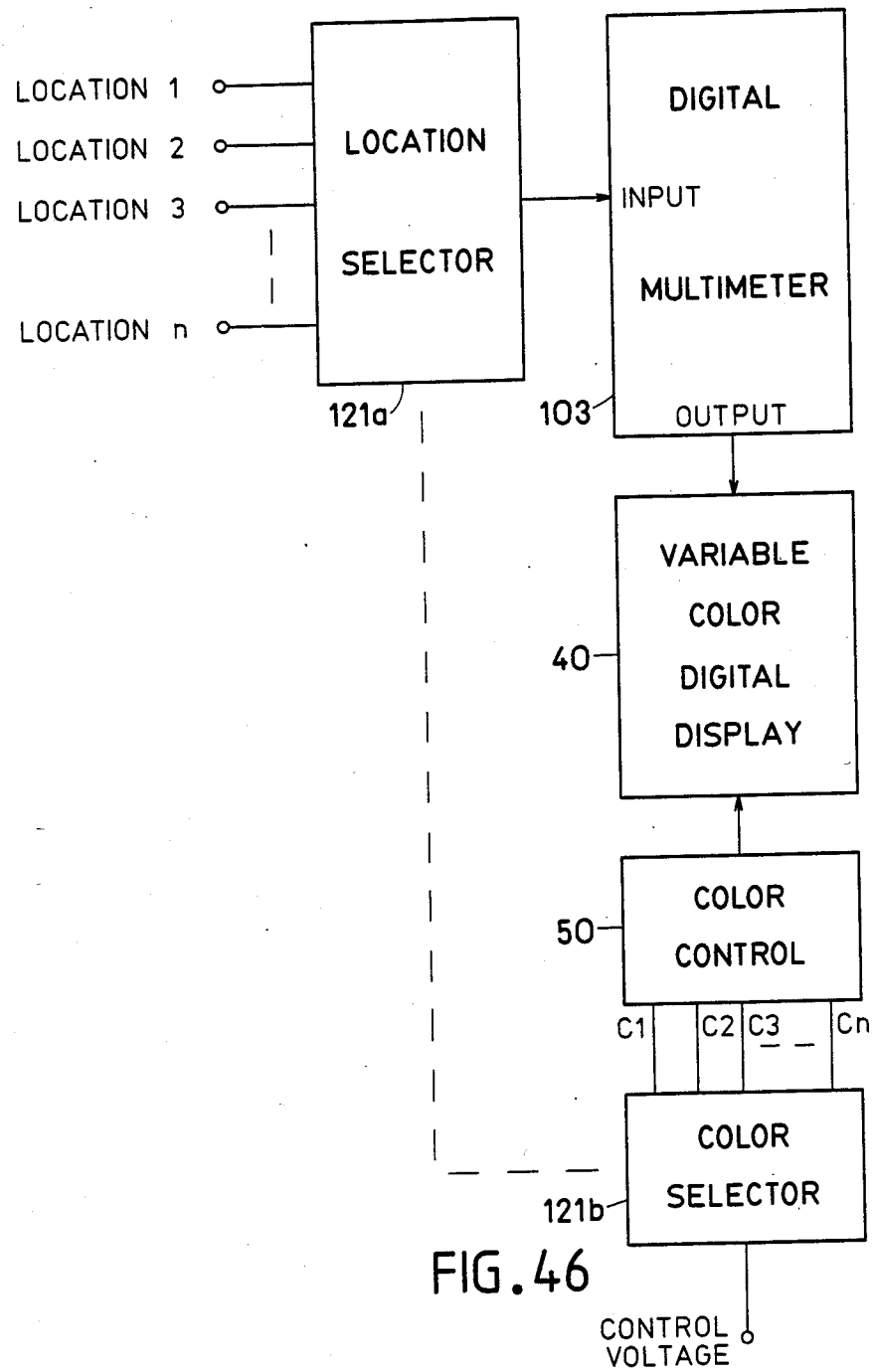
FIG. 46 is a block diagram of a digital multimeter with a display that can change color in accordance with measurement location.

FIG. 46 is a block diagram of a digital multimeter with input location selection. By way of an example, when the location selector 121a is in its third position, thereby selecting for the input of the multimeter 103 signals from the LOCATION 3, the associated color selector 121b is also in its third position, thereby applying the control voltage to the color control input C3, to cause the measured values from the LOCATION 3 to be indicated on the display 40 in the color C3. The measurements from different locations may be indicated in respectively different colors.

Figure 47:
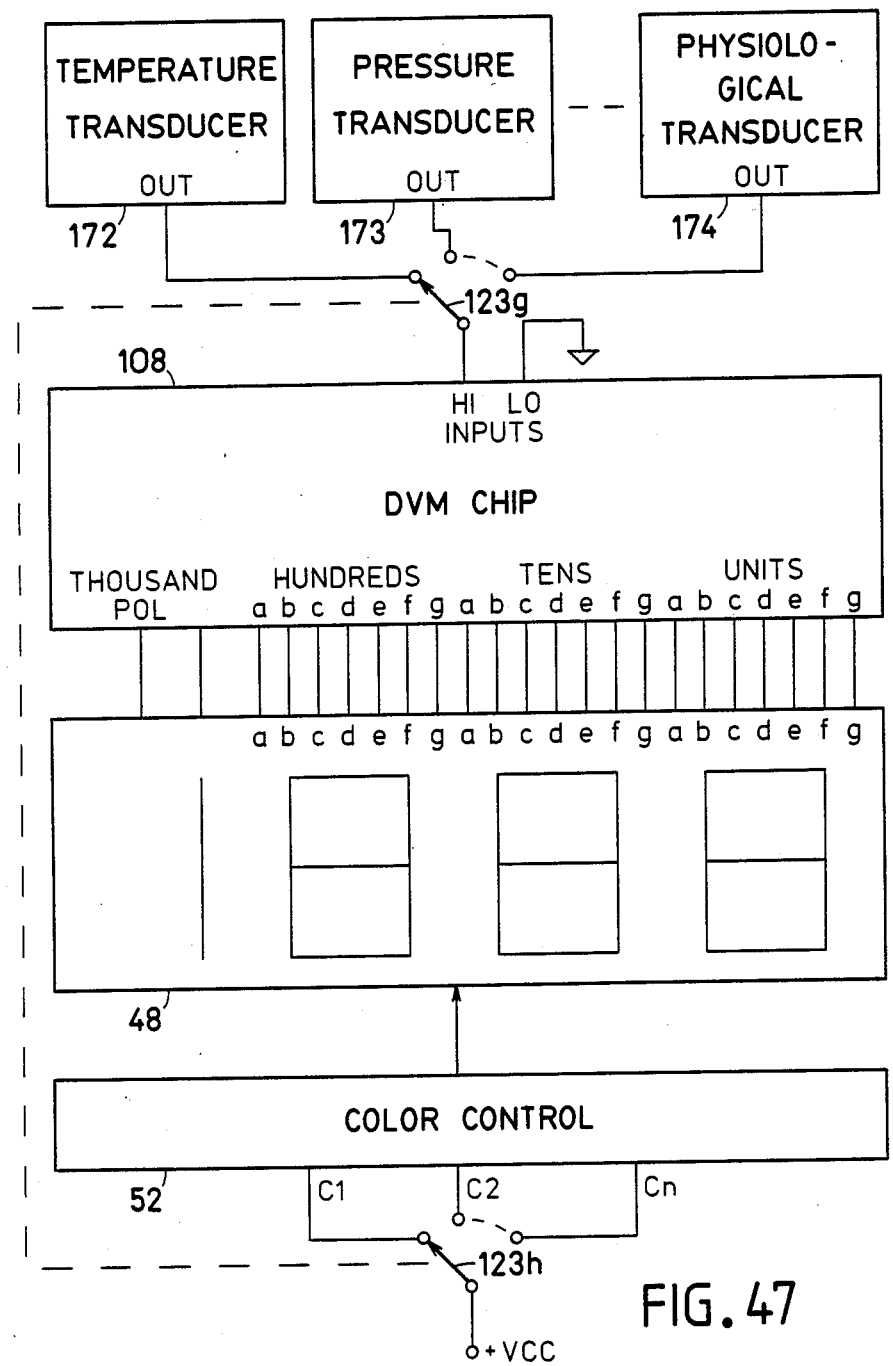
FIG. 47 is a simplified schematic diagram of a variable color digital multimeter for measuring outputs of different transducers.

In FIG. 47 is shown an exemplary simplified schematic diagram of a digital multimeter for selectively measuring values of several different quantities from outputs of a temperature transducer 172, which converts temperature to voltage, pressure transducer 173, which converts atmospheric pressure to voltage, and physiological transducer 174, which converts physiological information to voltage. The term transducer, as used throughout the description of the invention, is used in its widest sense so as to include every type of a device for performing a conversion of one form of energy to another. The principles of the invention may be applied to various displacement, motion, force, pressure, sound, flow, temperature, humidity, weight, magnetic, and physiological transducers, and the like. When the switch 123g is in its first position, thereby selecting the temperature transducer 172, the digital voltmeter 108 will measure the output voltage of the transducer 172, which is proportional to ambient temperature, and the display 48 will indicate the measured temperature in digital format. The associated switch 123h will be also in its first position, thereby connecting the control voltage +VCC to the color control input C1 of the color control circuit 42, to cause the display 48 to illuminate in the color C1. When the switch 123g is in its second position, thereby selecting the pressure transducer 173, the display 48 will indicate the measured atmospheric pressure in digital format and in the color C2. When the switch 123g is in its last position, thereby selecting the physiological transducer 174, the display 48 will indicate the measured physiological information, such as blood pressure, heart beat, and the like, in digital format and in the color Cn. Measured values of different quantities are thus displayed in respectively different colors.

Figure 48:
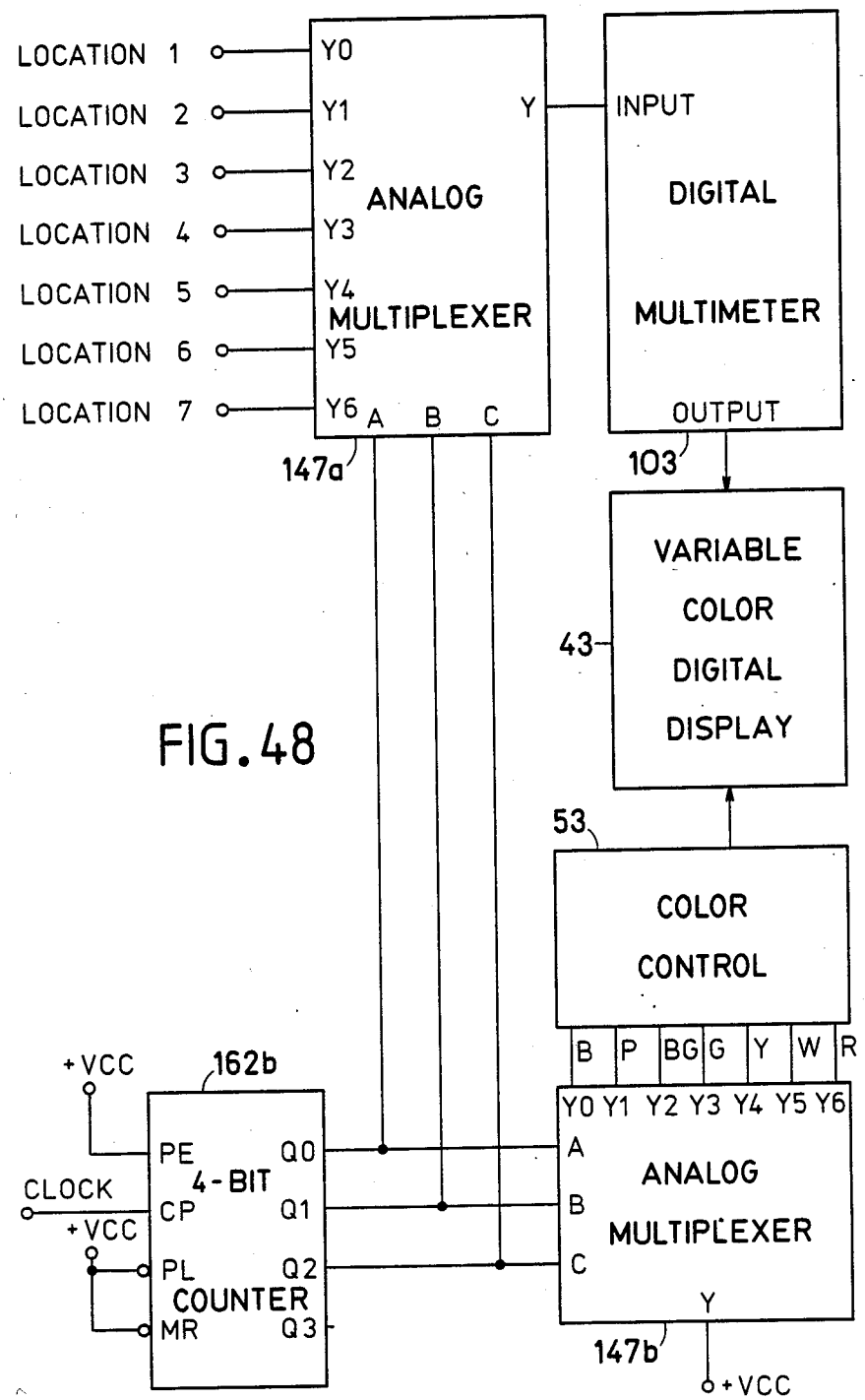
FIG. 48 is a simplified schematic diagram of a variable color digital multimeter for measuring signals from different locations.

In FIG. 48 is shown an exemplary simplified schematic diagram of a digital multimeter capable of measuring signals from seven different locations and of indicating the measured results in seven different colors, respectively. The outputs Q0, Q1, Q2 and a 4-bit binary counter 162b, which may be from time to time incremented by a clock pulse, are connected, in parallel, to the address inputs A, B, C of analog multiplexers 147a, 147b, respectively, to cause the multiplexer 147a to internally route signals from its selected input, e.g., Y1, to its output Y, and, simultaneously, to apply the control voltage +VCC from the terminal Y of the multiplexer 147b, via its selected terminal, e.g., Y1, to one of the color control inputs B to R. The measured signals from the selected location will be indicated on the display 40 in a digital format and in a color unique to the selected location. The indicated color sequences are merely exemplary; it would be obvious to devise other color sequences by differently interconnecting the terminals Y1 to Y7 of the multiplexer 147b with the color control inputs.

Figure 49:
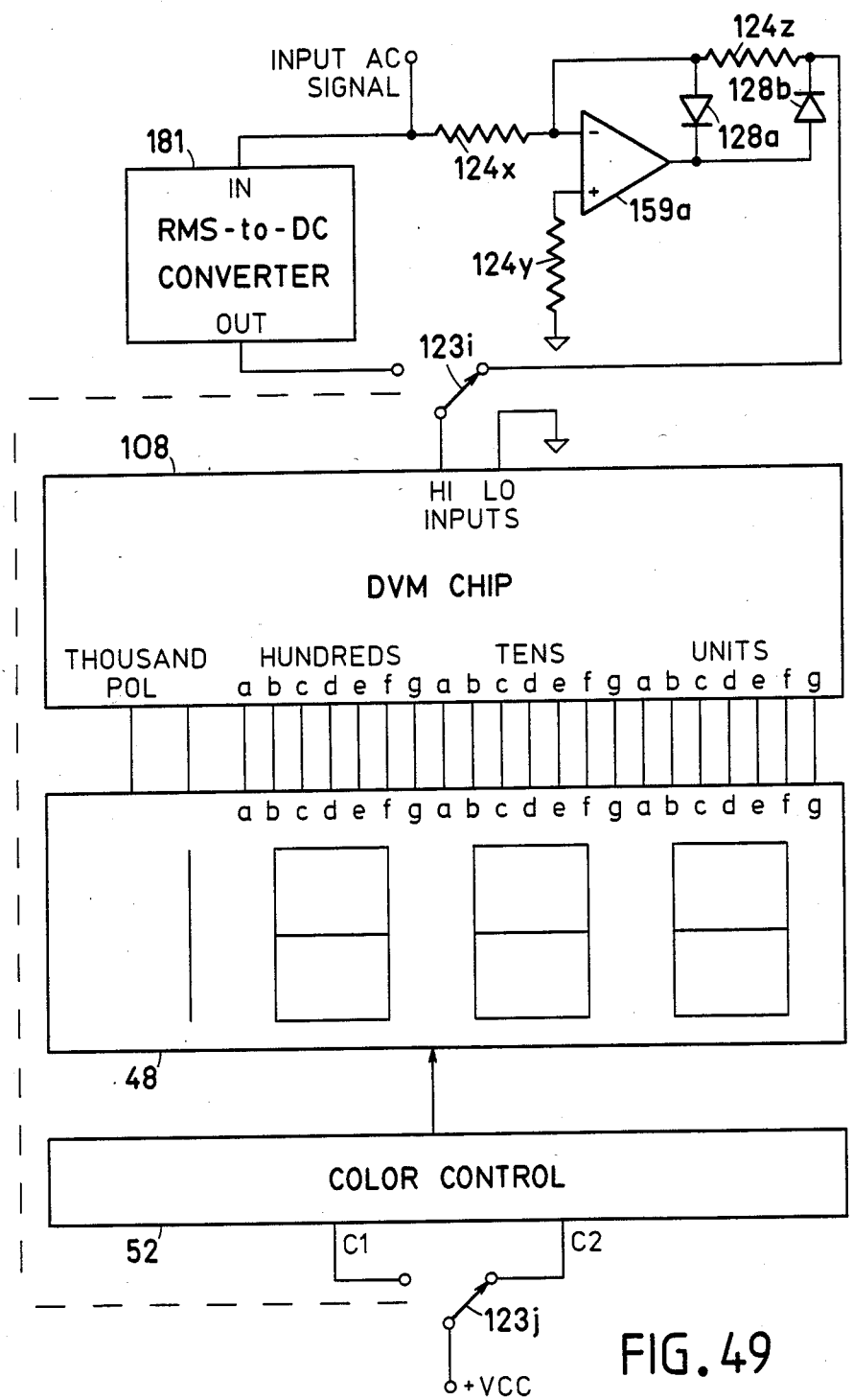
FIG. 49 is a simplified schematic diagram of a variable color digital multimeter for measuring signals by different methods.

In FIG. 49 is shown a simplified schematic diagram of an AC digital voltmeter for selectively measuring an RMS (Root Mean Square) or MAV (Mean Average Value) of a measured waveform. An RMS measurement provides a power content of the measured signal, as will be more fully explained later, for a waveform of any shape. Since the MAV measured value may differ from the RMS value for certain waveform shapes, it would be desirable to know which measurement method is being employed. A switch 123i will select either the output of the RMS converter 181, or the output of the precision rectifier circuit, consisting of an op amp 159a, resistors 124x, 124y, 124z and diodes 128a, 128b, to the input of the digital voltmeter 108. An associated switch 123j will select one of the color control inputs C1, C2, in accordance with the selection of the measurement method. The display 48 will indicate the magnitude of the measured AC waveform in a digital format and in a color unique to the selected measurement method.

Figure 50:
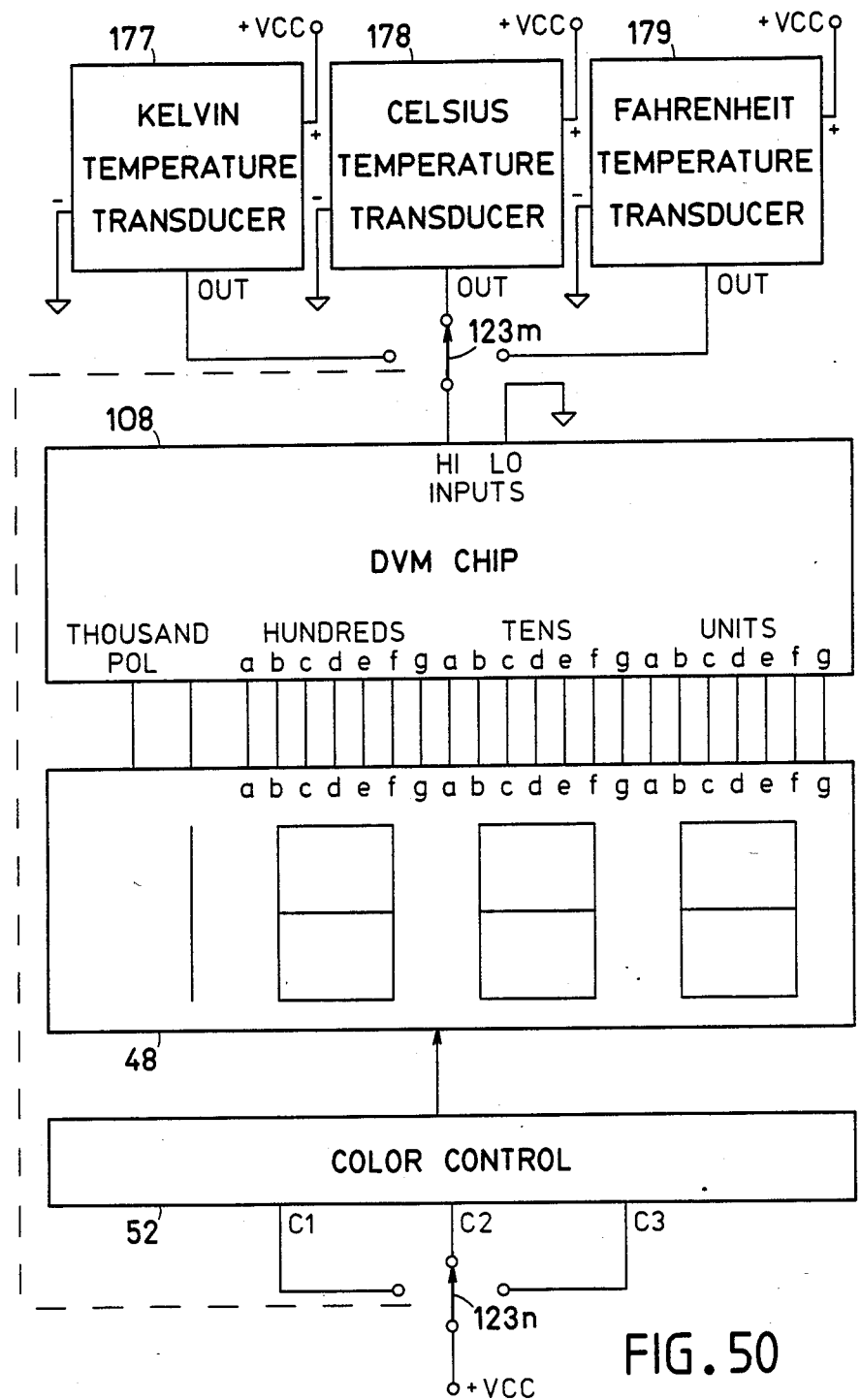
FIG. 50 is a simplified schematic diagram of a variable color digital thermometer.

In FIG. 50 is shown a simplified schematic diagram of a digital thermometer which can selectively measure temperature in the Kelvin, Celsius, or Fahrenheit scale, by connecting the output of one of temperature transducers 177, 178, 179, via a switch 123m, to the input of the digital voltmeter 108. An associated switch 123n will apply the control voltage +VCC to one of the color control inputs C1, C2, C3, of the color control circuit 52, to thereby illuminate the display 48 in a color unique to the selected temperature scale. The output voltage of the Kelvin temperature transducer 177 is linearly proportional to temperature in the Kelvin scale. The output voltage of the like Celsius temperature transducer 178 is linearly proportional to temperature in the Celsius scale. The output voltage of the like Fahrenheit temperature transducer 179 is linearly proportional to temperature in the Fahrenheit scale.

Figure 51:
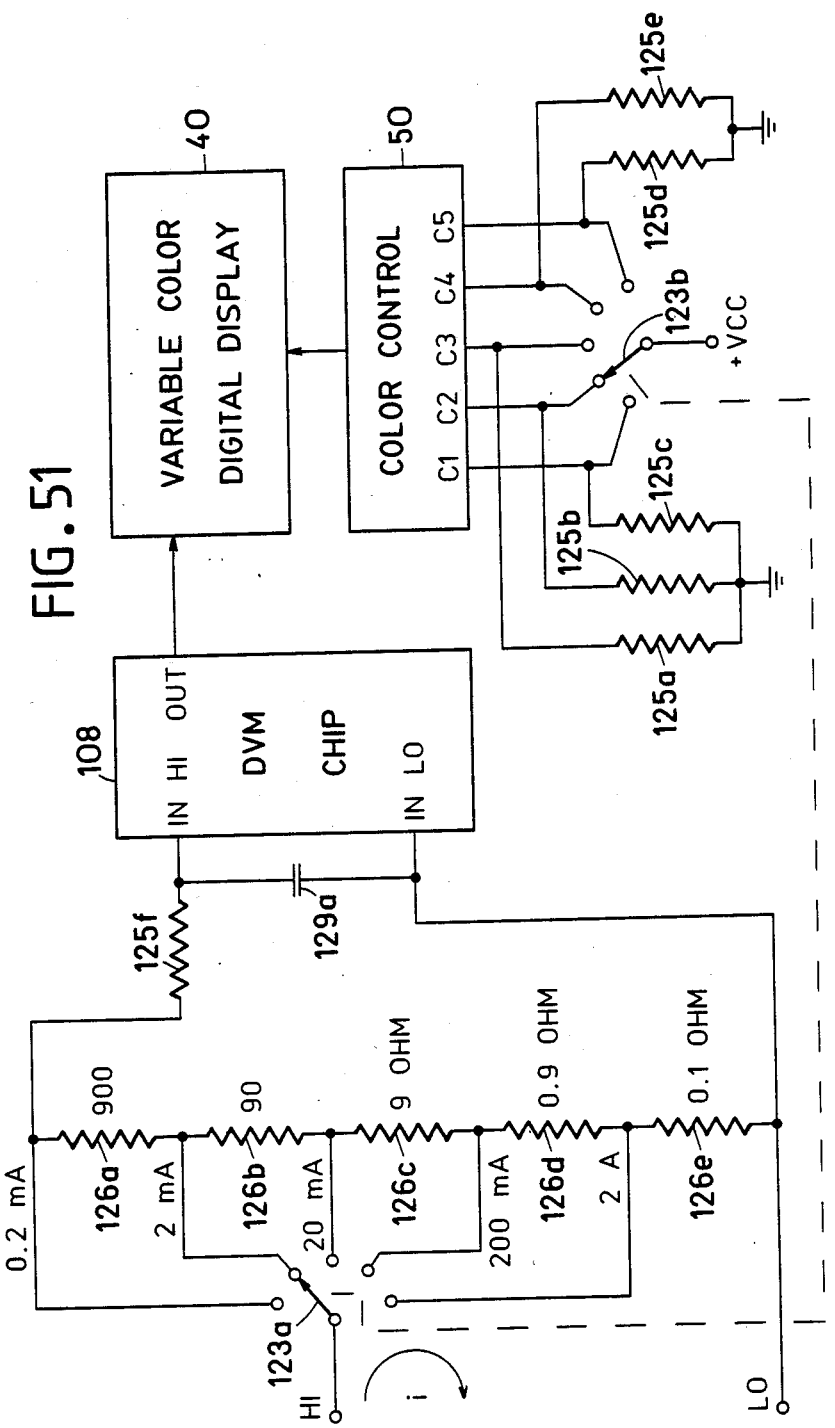
FIG. 51 is a simplified schematic diagram of a digital ampermeter with variable color range indication.

In FIG. 51 is shown a simplified schematic diagram of a digital ampermeter with variable color range indication. The precision shunt resistors 126a, 126b, 126c, 126d, 126e, connected in series, convert measured current to voltage, which is applied, via a resistor 125f of suitable value, to the input terminal of a digital voltmeter 108. The current range is selectable by a rotary switch 123a, in a manner well known to those skilled in the art. The invention resides in the addition of a second rotary switch 123b, associated with the switch 123a such that both switches are always in the same position, to connect the reference voltage +VCC to the selected one of the color control inputs, in accordance with the selected current range. The remaining color control inputs are tied to ground via suitable pull down resistors 125a, 125b, 125c, 125d, 125e. By way of an example, the display 40 may indicate measured current values on the 0.2 mA range in blue color, on 2 mA range in purple color, on 20 mA range in green color, on 200 mA range in yellow color, and on 2 A range in red color.

Figure 52:
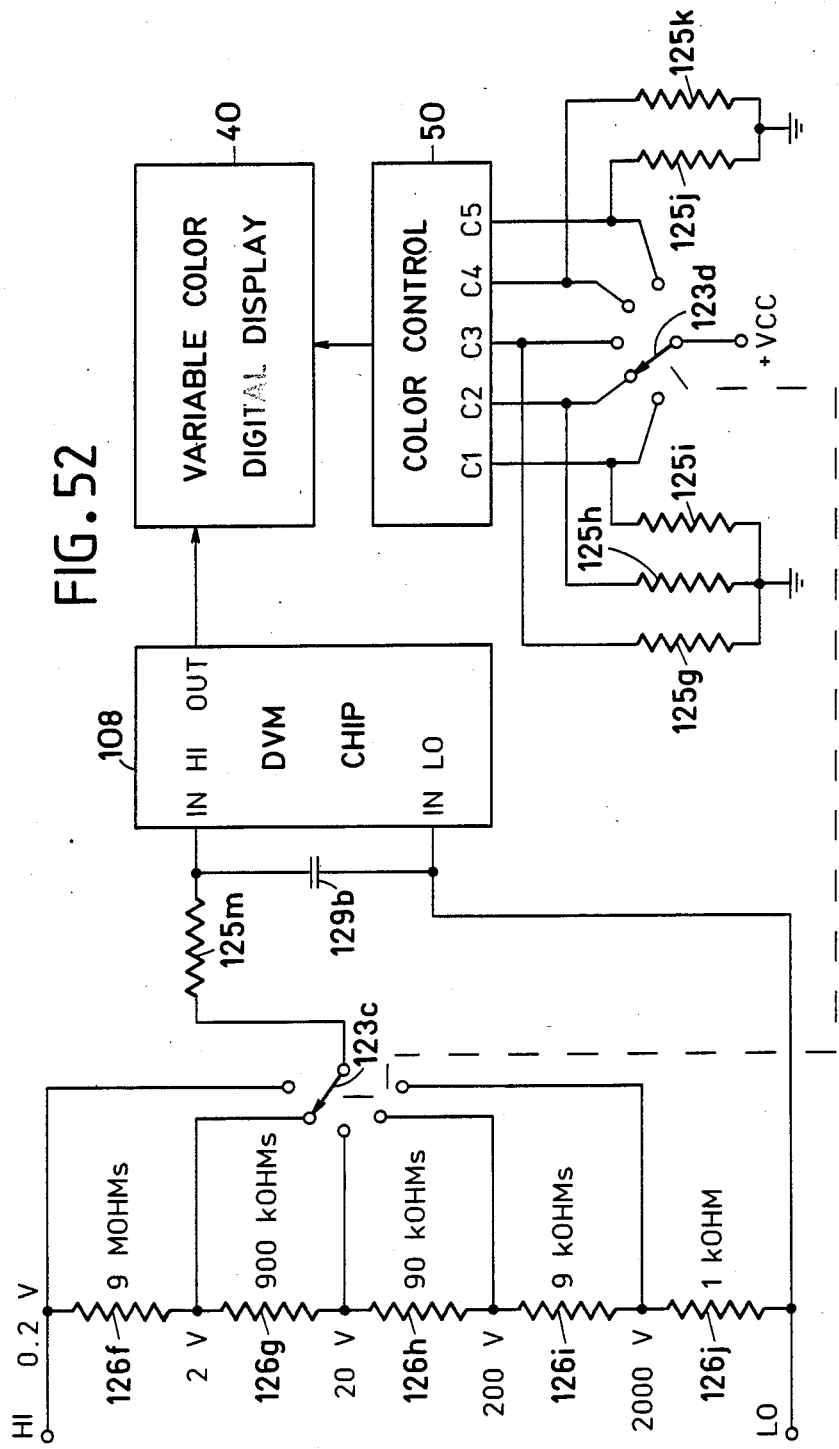
FIG. 52 is a simplified schematic diagram of a digital voltmeter with variable color range indication.

In FIG. 52 is shown a simplified schematic diagram of a digital voltmeter with variable color range indication. The precision voltage attenuating resistors 126f, 126g, 126h, 126i, 126j are connected in series and the voltage range is selected by a rotary switch 123c, in a manner well understood by those skilled in the art. The invention resides in the addition of a second rotary switch 123d, associated with the switch 123c, to apply the reference voltage +VCC to the selected color control input. By way of an example, the display 40 may indicate measured values on the 0.2 V range in white color, on 2 V range in yellow color, on 20 V range in green color, on 200 V range in blue-green color, and on 2000 V range in red color.

Figure 53:
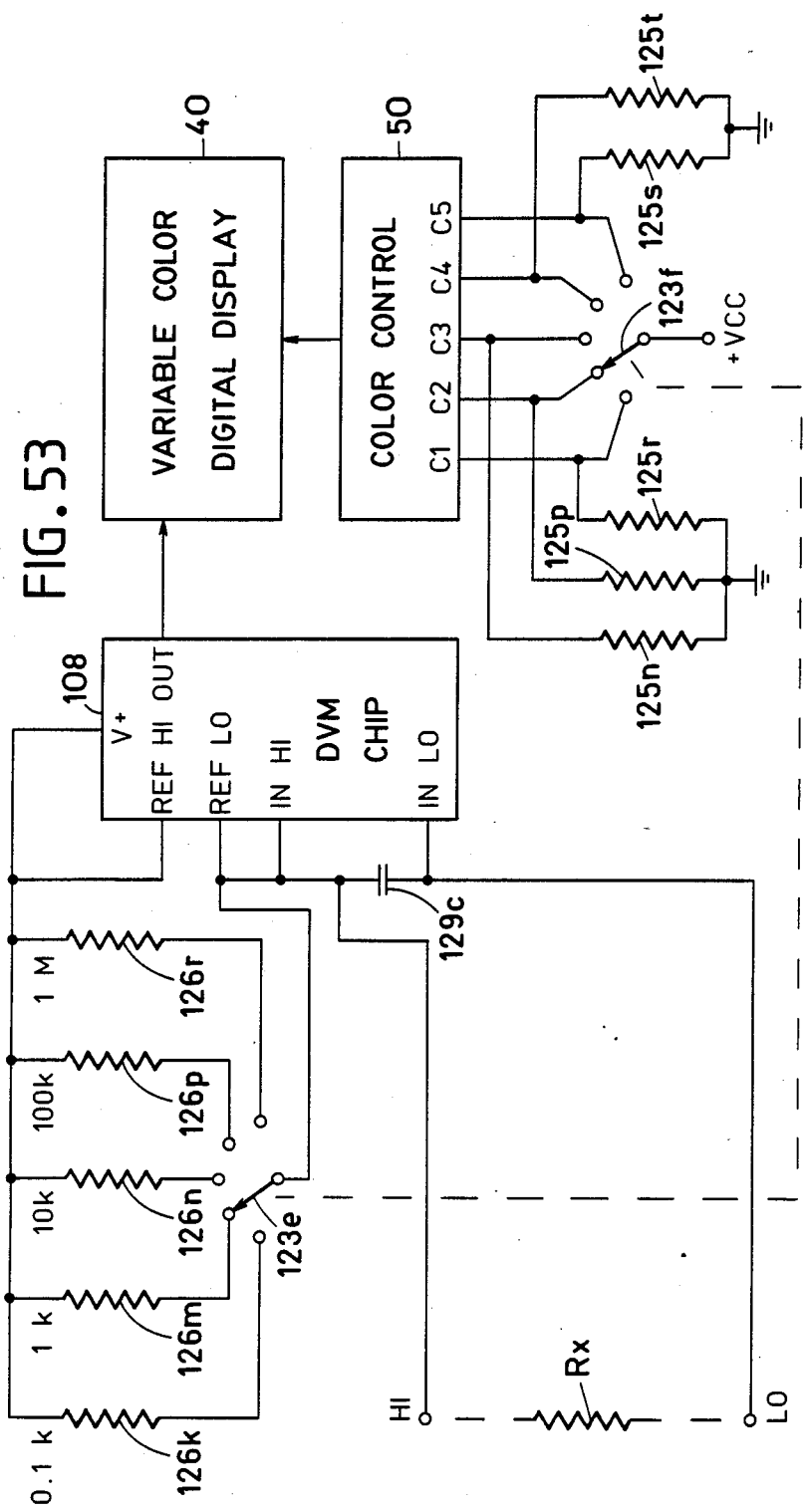
FIG. 53 is a simplified schematic diagram of a digital ohmmeter with variable color range indication.

In FIG. 53 is shown a simplified schematic diagram of a digital ohmmeter with variable color range indication. The precision standard resistors 126k, 126m, 126n, 126p, 126r, selectable by a rotary range switch 123e, are connected such that the selected one of the standard resistors is in series with the measured resistance Rx, in a well known ratiometric arrangement. The invention resides in the addition of a second switch 123f, associated with the switch 123e, to connect the reference voltage +VCC to the selected one of the color control inputs, in accordance with the selected resistance range. By way of an example, the display 40 may indicate measured resistance values on the 0.1k range in yellow color, an 1k range in green color, on 10k range in blue color, on 100k range in purple color, and on 1M range in red color.

The examples of range and precision resistor values shown in FIGS. 51, 52, 53 should be considered merely as exemplary. Although the switches 123 are shown as rotary switches, they may, alternatively, be of any other type, such as pushbutton switches and relay contacts. Another modification envisions that only certain of the display digits may change color in accordance with the measurement range, while the remaining display digits may change color in accordance with a different quantity. It is readily apparent that the principles of the invention may be effectively applied to autoranging multimeters.

Figure 54:
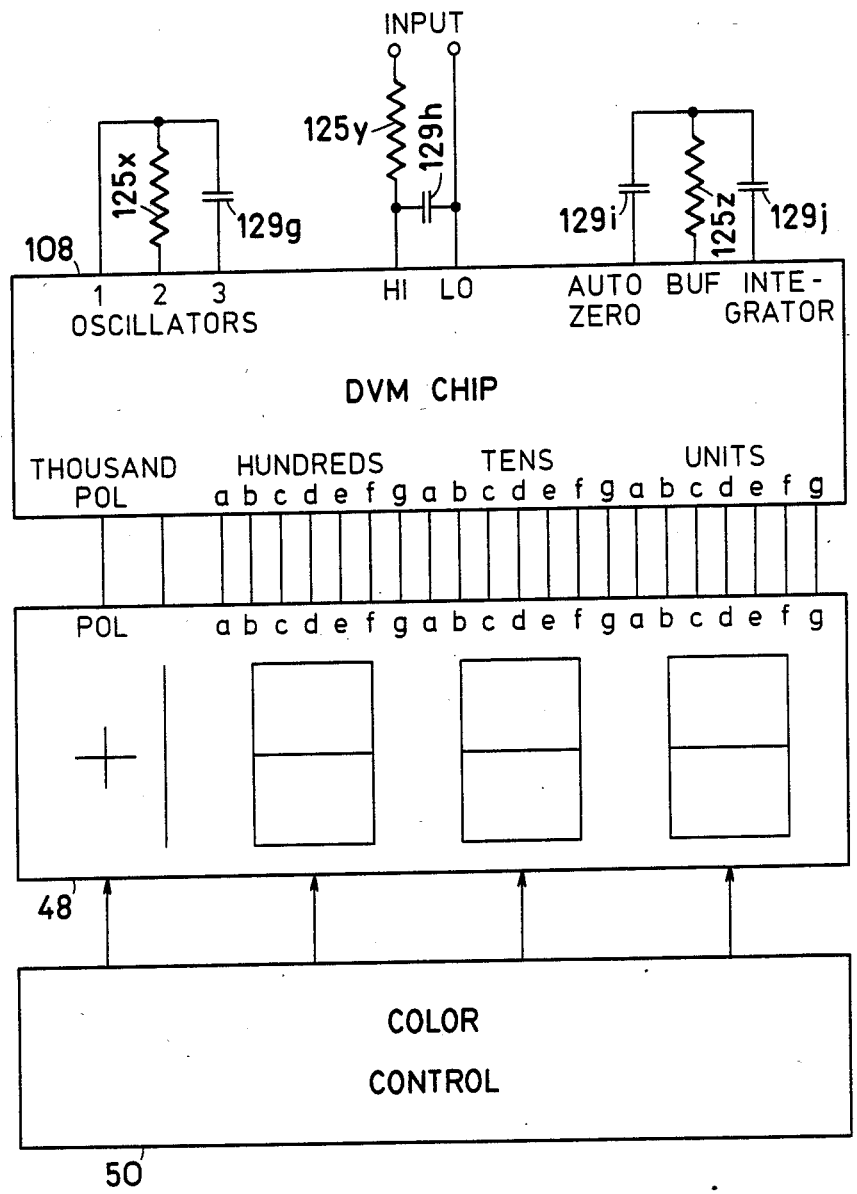
FIG. 54 is a detail of the multimeter shown in FIGS. 51, 52, and 53.

In FIG. 54 is shown a detail of the multimeter of FIGS. 51, 52, 53 which include a DVM chip 108 capable of converting analog voltage applied to its input HI and LO into signals for directly driving respective segments of a 3½ digit 7-segment variable color display 48. The color control 50 will cause the display 48 to illuminate in a selected color, as described previously.

Figure 55:
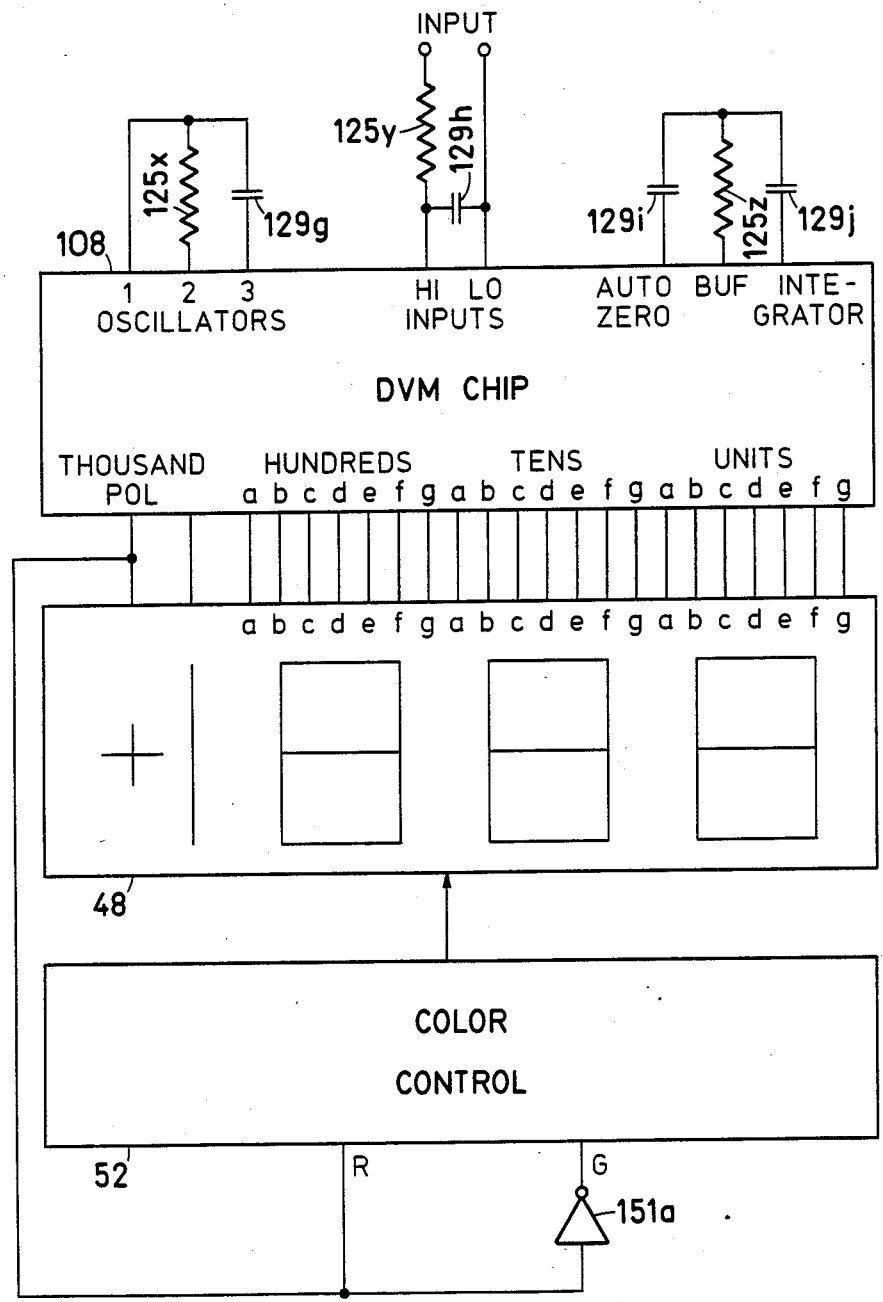
FIG. 55 is a simplified schematic diagram of a digital voltmeter for displaying positive and negative measurement results in respectively different colors.

Commercially known digital multimeters are capable of indicating negative measured results, by displaying a small negative sign at the most significant digit, and positive measured results, usually by not displaying the minus sign. When a series of measurements is performed, it is difficult to distinguish between the positive and negative measurement results displayed on a long character string, particularly when the measurements are performed at a relatively fast rate. In FIG. 55 is shown how this problem may be effectively solved by displaying positive and negative measurement results in respectively different colors on a 3½ digit common cathodes variable color display 48, which is capable of displaying a minus sign, e.g., by illuminating the segment g in the most significant digit. The polarity output POL of the digital voltmeter 108 is directly connected to the color control input R, and, via an inverter 151a, to the color control input G, of the color control circuit 52. When the POL output is at a low logic level, to indicate that the displayed number is positive, the minus sign is extinguished. A logic low level at the POL output will force the output of the inverter 151a to rise to a high logic level, to activate the color control input G, to thereby illuminate the display 48 in green color. When the POL output rises to a high logic level, to indicate that the displayed number is negative, the minus sign is illuminated. A logic high level at the POL output will activate the color control input R, to thereby illuminate the display 48 in red color. It would be obvious, in the view of the present disclosure, to devise other color combinations.

Figure 56:
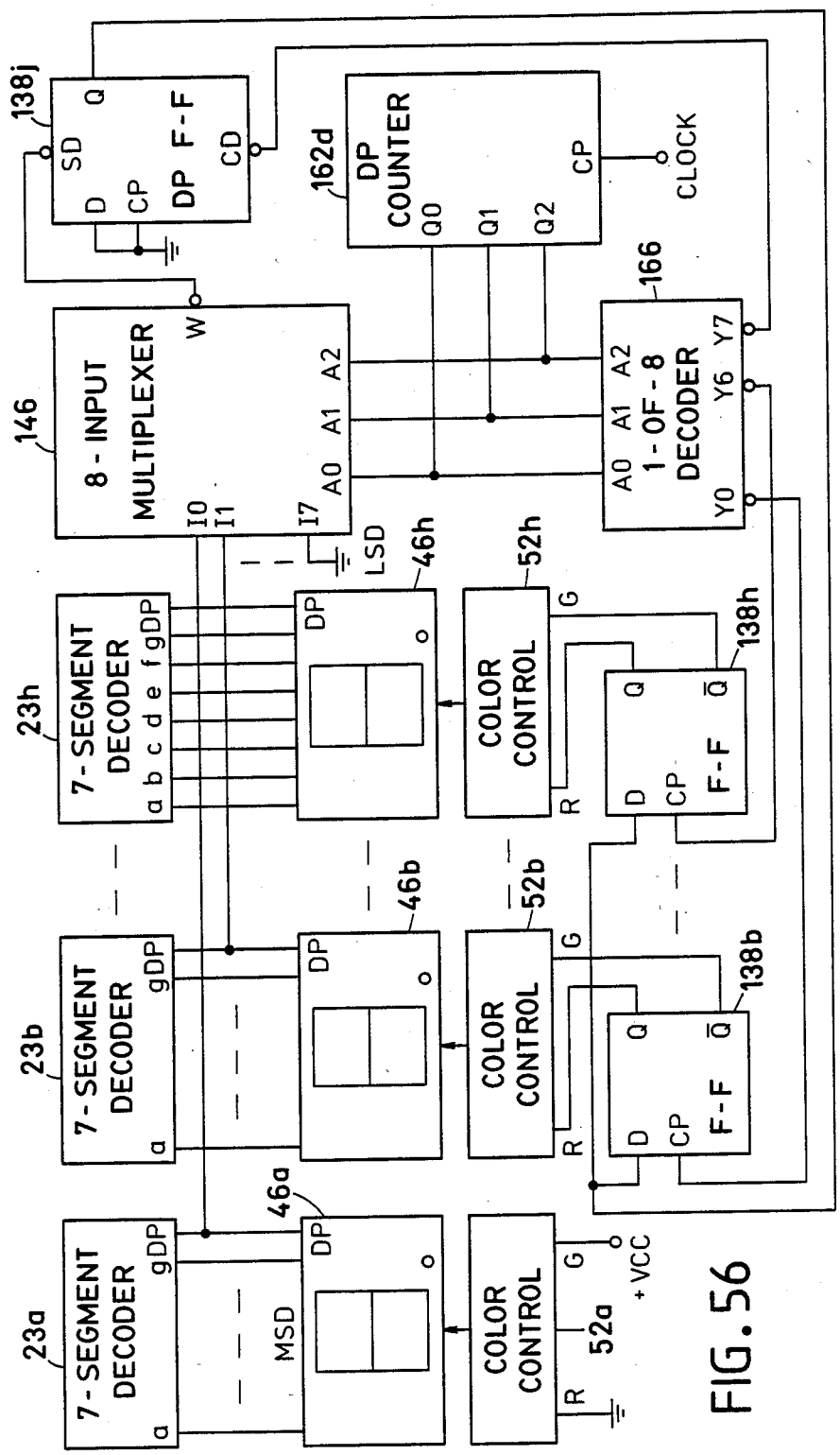
FIG. 56 is a simplified schematic diagram of a variable color display system for displaying decimal numbers such that digits preceding and following the decimal point are displayed in respectively different colors.
Figure 57:
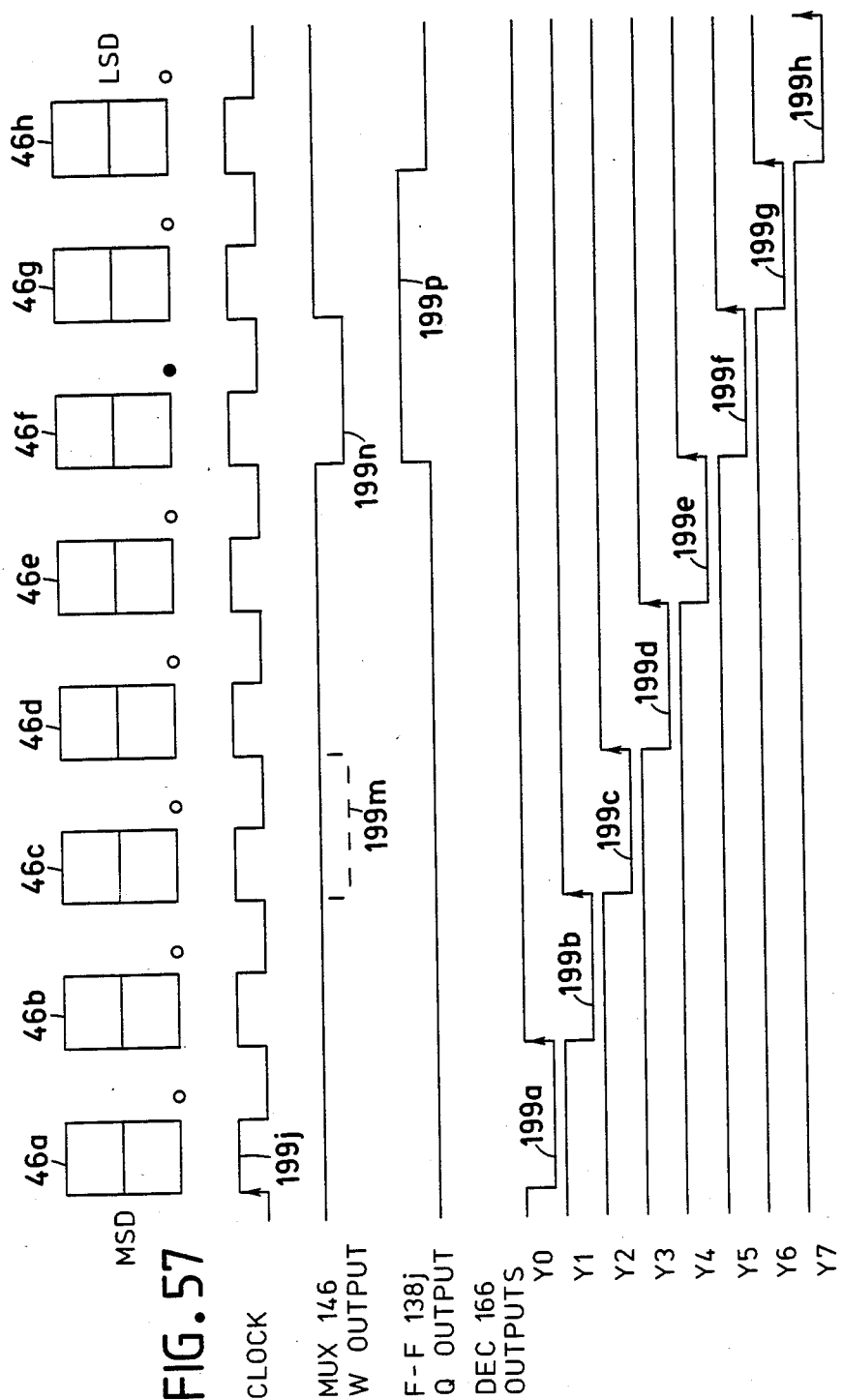
FIG. 57 is a timing diagram of the circuit shown in FIG. 56.

The description of a variable color digital display system shown in FIG. 56, which is capable of emphasizing the position of decimal point in a string of digits, should be considered together with its accompanying timing diagram shown in FIG. 57. The display system, which in its exemplary embodiment utilizes eight single-digit variable color displays 46a to 46h, which are only partially shown, is capable of detecting the position of decimal point in a string of displayed digits and of displaying all digits that precede the decimal point in a first color and all digits that follow the decimal point in a second color. The decimal point outputs DP of the common-cathodes 7-segment decoders 23a to 23h, which may receive displayable data in a conventional manner (not shown), are continuously scanned in a sequence by a multiplexer 146 which is incremented by a counter 162d driven by a clock 199j of suitable frequency. When an active high DP output is detected on certain of the decoders 23a to 23h, the inverting output W of the multiplexer 146, which is connected to the set direct input SD of the DP flip-flop 138j, will drop to a low logic level 199n, to force the latter to its set condition. The Q output of the DP flip-flop 138j, which is connected to the D inputs of all flip-flops 138b to 138h, will rise to a high logic level for the remaining time of the scanning cycle, to thereby indicate, as may be best observed in FIG. 57 in the line designated F—F 138j Q OUTPUT at waveform 199p, the position of the detected decimal point in reference to the scanning cycle. A decoder 166 is incremented synchronously with the multiplexer 146, and, as a result, its outputs Y0 to Y7 are sequentially driven to a low logic level, to trigger in a sequence the flip-flops 138b to 138h to states determined by the conditions of their D inputs, respectively, at the time of triggering, as may be best observed in FIG. 57 in the lines designated DEC 166 OUTPUTS Y0 to Y7 at waveforms 199a to 199h. All flip-flops 138b to 138h, which were triggered before the decimal point was located during each scanning cycle, will be triggered to their reset states, while all remaining flip-flops 138b to 138h, which were triggered after the decimal point was located, will be triggered to their set states. The Y7 output of the decoder 166 is connected to the clear direct input CD of the DP flip-flop 138j, to force the latter to its reset condition at the end of each scanning cycle. The outputs Q and $\bar{Q}$ of the flip-flops 138b to 138h are respectively connected to color control inputs R and G of the color control circuits 52b to 52h, to thereby cause all display digits 46b to 46h that precede the instant decimal point to be illuminated in green color, and all remaining display digits that follow the decimal point to be illuminated in red color. It would be obvious that other color combinations may be devised.

Figure 58:
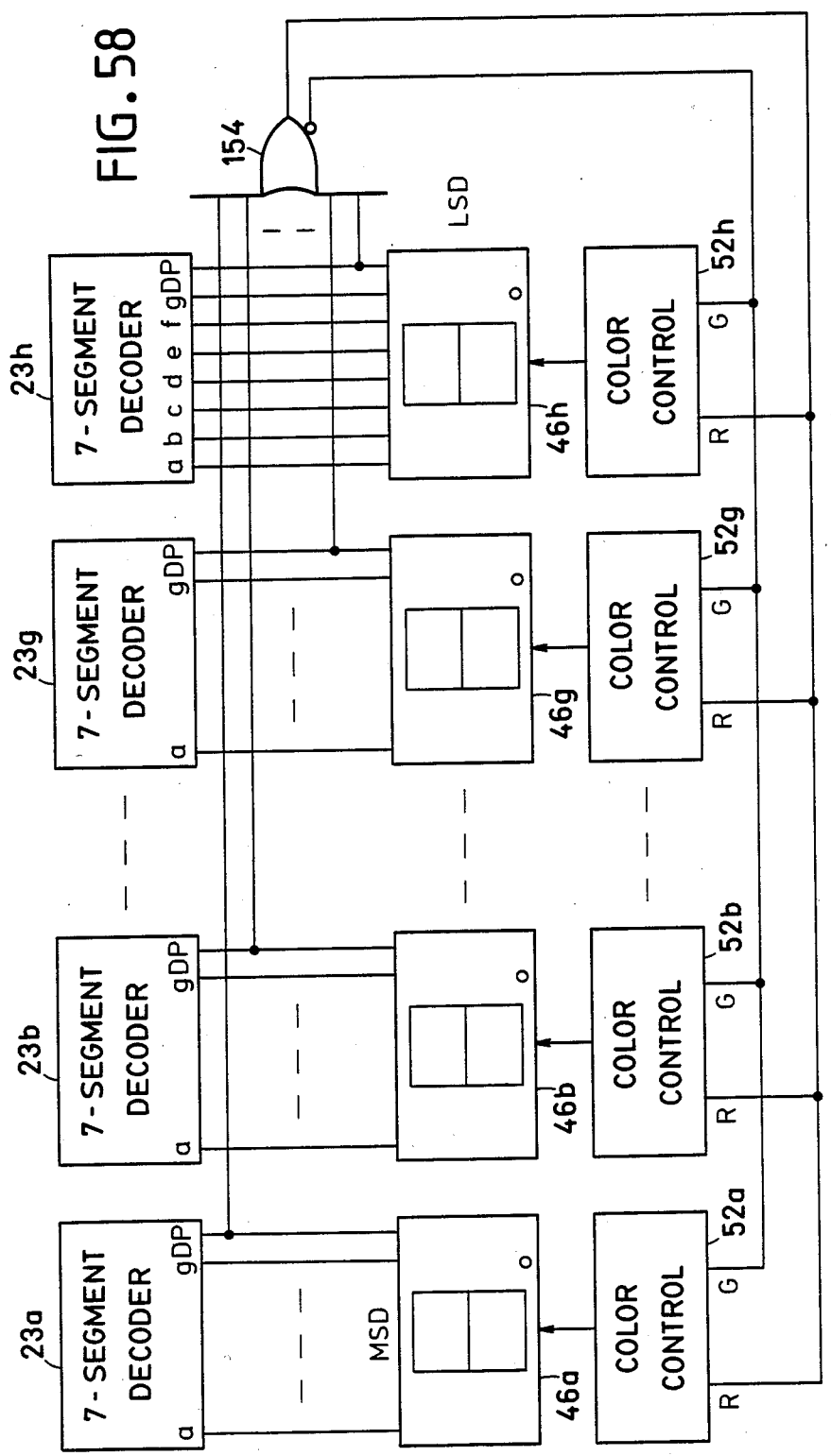
FIG. 58 is a simplified schematic diagram of a variable color display system for displaying integers and decimal numbers in respectively different colors.

The display system shown in FIG. 58 is capable of detecting the presence or absence of decimal point in the displayed digital string, and accordingly of displaying digital strings with decimal point (decimal numbers) in a first color, and digital strings without decimal point (integers) in a different color. The decimal point outputs DP of all common-cathode 7-segment decoders 23a to 23h are respectively connected to the inputs of an OR gate 154. When decimal point is present in the displayed digital string, the appropriate DP output will rise to a high logic level, thereby forcing the non-inverting output of the OR gate 154, which is connected to the interconnected color control inputs R of all color control circuits 52a to 52h, to rise to a high logic level, to thereby cause all displays 46a to 46h to illuminate in red color. When no decimal point is detected in the displayed digital string, the inverting output of the OR gate 154, which is connected to the interconnected color control inputs G of all color control circuits 52a to 52h, will rise to a high logic level, to thereby cause all displays 46a to 46h to illuminate in green color.

Figure 59:
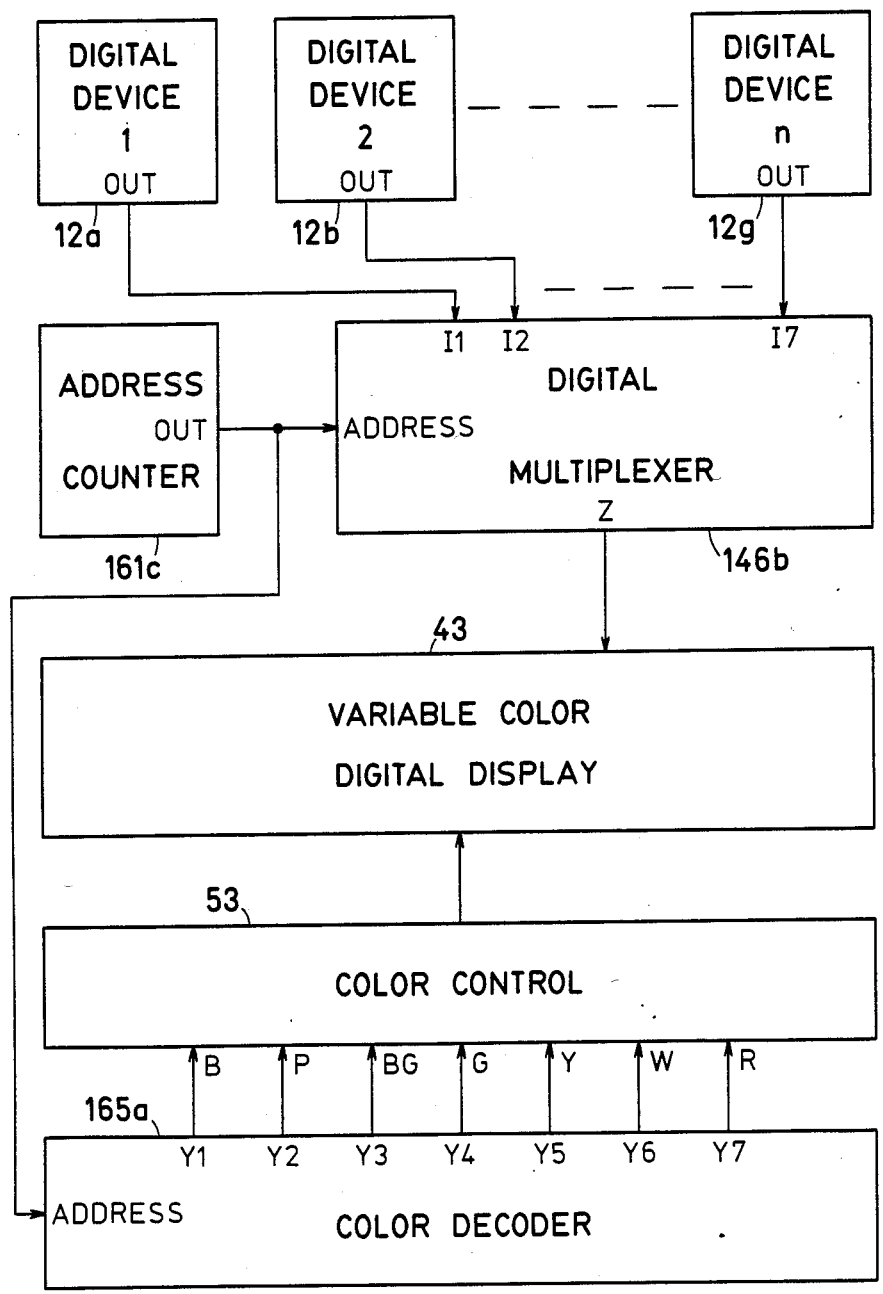
FIG. 59 is a block diagram of a variable color display device for selectively displaying output digital data from different digital devices in respectively different colors.

In FIG. 59 is shown a block diagram of a variable color digital display system for selectively indicating output values of seven digital devices 12a to 12g in digital format and in respectively different colors. The outputs of the digital devices 12a to 12g are respectively connected to the inputs I1 to I7 of a digital multiplexer 146b, which is addressed by a counter 161c. Displayable digital data will be routed from one of the multiplexer's inputs, selected by the instant output code of the counter 161c, to its output Z and to the variable color digital display 43, to be displayed thereon in digital format. The counter 161c simultaneously addresses the color decoder 165a, to activate one of seven color control inputs B, P, BG, G, Y, W, R of the color control circuit 53, in accordance with the selected input of the multiplexer 146b. By way of an example, when the counter's output code 010 (binary) is applied to the address inputs of the multiplexer 146b, the input I2 will be selected and data from the digital device 12b will be indicated on the display 43 in digital format. Simultaneously, the counter's output code will cause the output Y2 of the decoder 165a to be active, thereby activating the color control input P, to cause the display 43 to illuminate in purple color. Digital devices 12a to 12g may include certain of those disclosed earlier.

Figure 60:
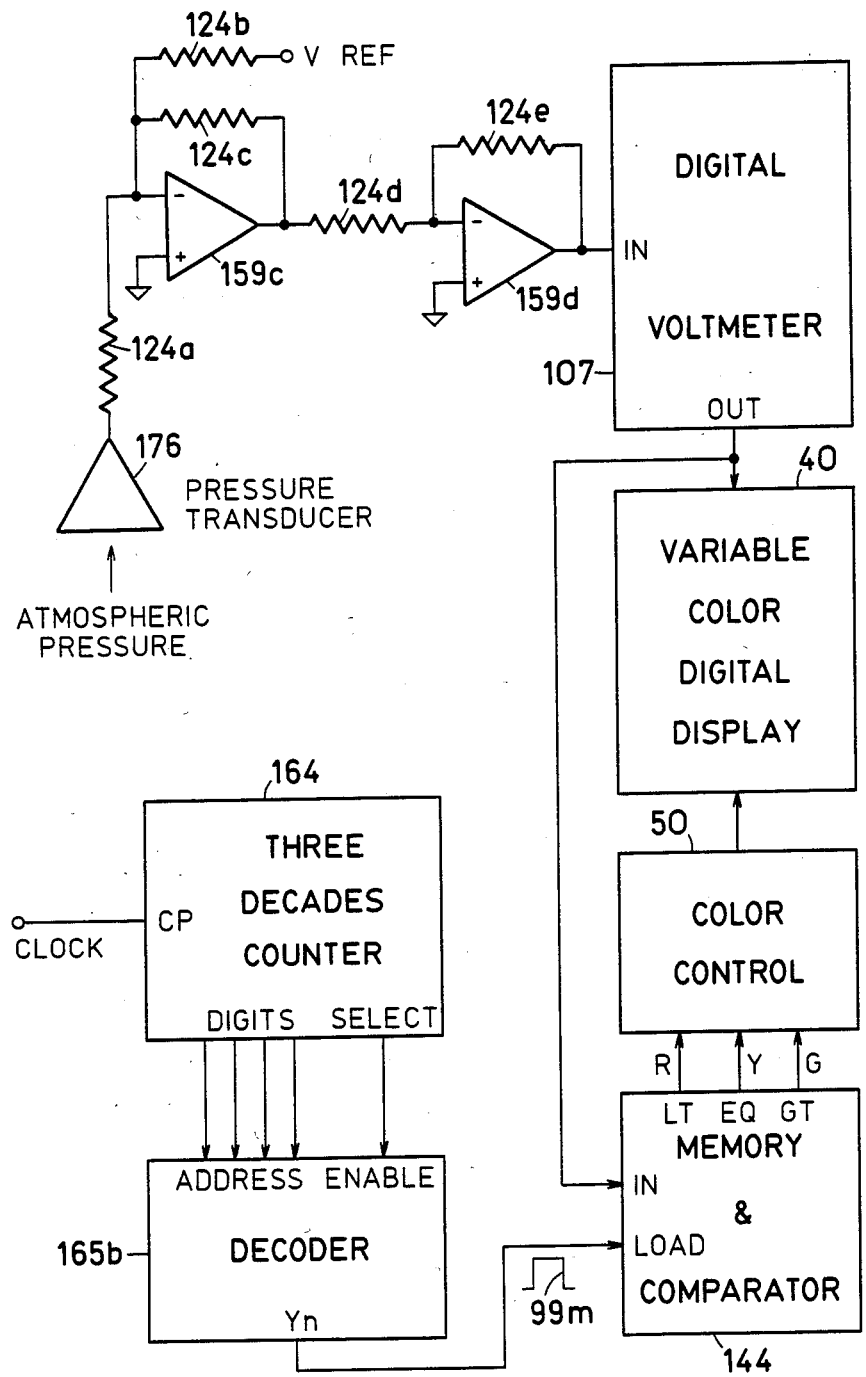
FIG. 60 is a simplified schematic diagram of a variable color digital barometer.

In FIG. 60 is shown an expanded block diagram of a variable color digital barometer with memory, for indicating measured values of atmospheric pressure in digital format and in a color depending on previous measured values. A scaling circuit consisting of op amps 159c, 159d and resistors 124a, 124b, 124c, 124d, 124e will shift and scale output voltage of a pressure transducer 176, which is linearly proportional to atmospheric pressure, such that voltage at the input of the digital voltmeter 107 directly corresponds to the atmospheric pressure, either in milibars or in mm Hg, depending on the values of the resistor 124e and V REF voltage. The digital voltmeter 107 will convert the instant analog voltage at its input to a digital code which is simultaneously applied to the variable color digital display 40, to be indicated thereon in digital format, and to the data input of a combined memory and comparator 144, to be stored therein from time to time. The invention resides in the addition of a color control circuit 50 for illuminating the display 40 in a color depending on the reult of comparison between the instant measured value of atmospheric pressure and previously stored one, to thereby indicate whether the atmospheric pressure is either rising, or falling, or remains unchanged. A three-decade counter 164, or other suitable device for keeping time, is incremented in regular intervals by a clock, and its DIGITS outputs indicate the instant count. A decocder 165b has its ADDRESS inputs connected, in a rather simplified manner, to the counter's DIGITS outputs and utilizes the counter's SELECT output as a strobe. As a result of continuous counting, at regular time intervals there will appear relatively short pulses 99m at the selected decoder's output Yn, which is connected to the LOAD input of the memory and comparator 144, to load the instant output data of the digital voltmeter 107 into the memory 144. The comparator 144 will effect a comparison of the data currently stored in its memory with the instant output data of the digital voltmeter 107 and will accordingly develop output signals LT (Less Than), EQ (Equal), and GT (Greater Than). The comparator's outputs LT, EQ, GT are respectively connected to the color control inputs R, Y, G of the color control circuit 50, to cause the display 40 to illuminate in red color when the comparator's output LT is active (atmospheric pressure is falling), in yellow color when the output EQ is active (atmospheric pressure is unchanged), and in green color when the output GT is active (atmospheric pressure is rising). The above description may serve as a background for consideration of more sophisticated barometric systems capable of comparing instant measured values with values obtained by virtue of arithmetic and logic operations, such are average or peak values of previous measurements, and of displaying measured values in a variety of colors depending on rate of increase or dicrease of measured values.

Figure 61:
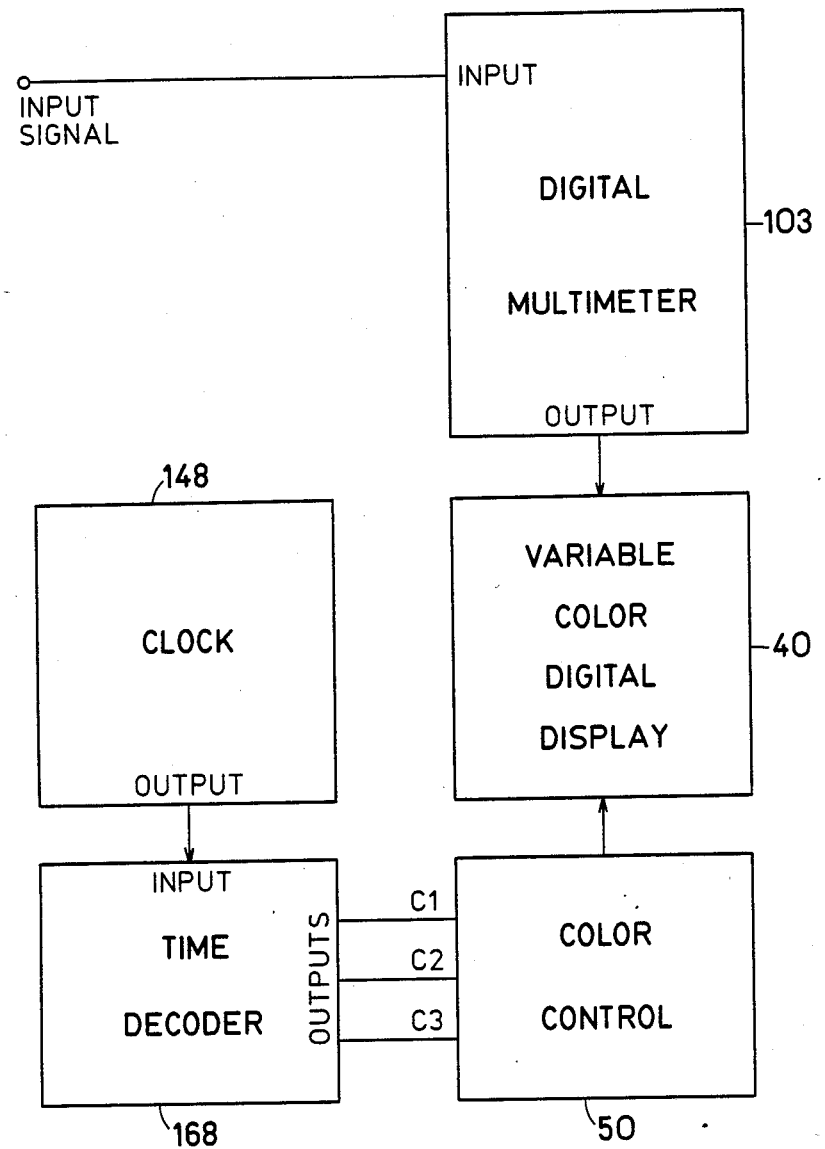
FIG. 61 is a simplified schematic diagram of a digital multimeter for displaying measurement results in accordance with time.

In FIG. 61 is shown a block diagram of a digital multimeter 103 for making series of measurements in combinations with a clock 148 for keeping time. The time signals developed by the clock circuit 148 are decoded by a suitable time decoder 168 and converted to color control signals C1, C2 to Cn. Values measured by the multimeter 103 will be indicated on the display 40 in digital format and in a color having relation to time.

Figure 62:
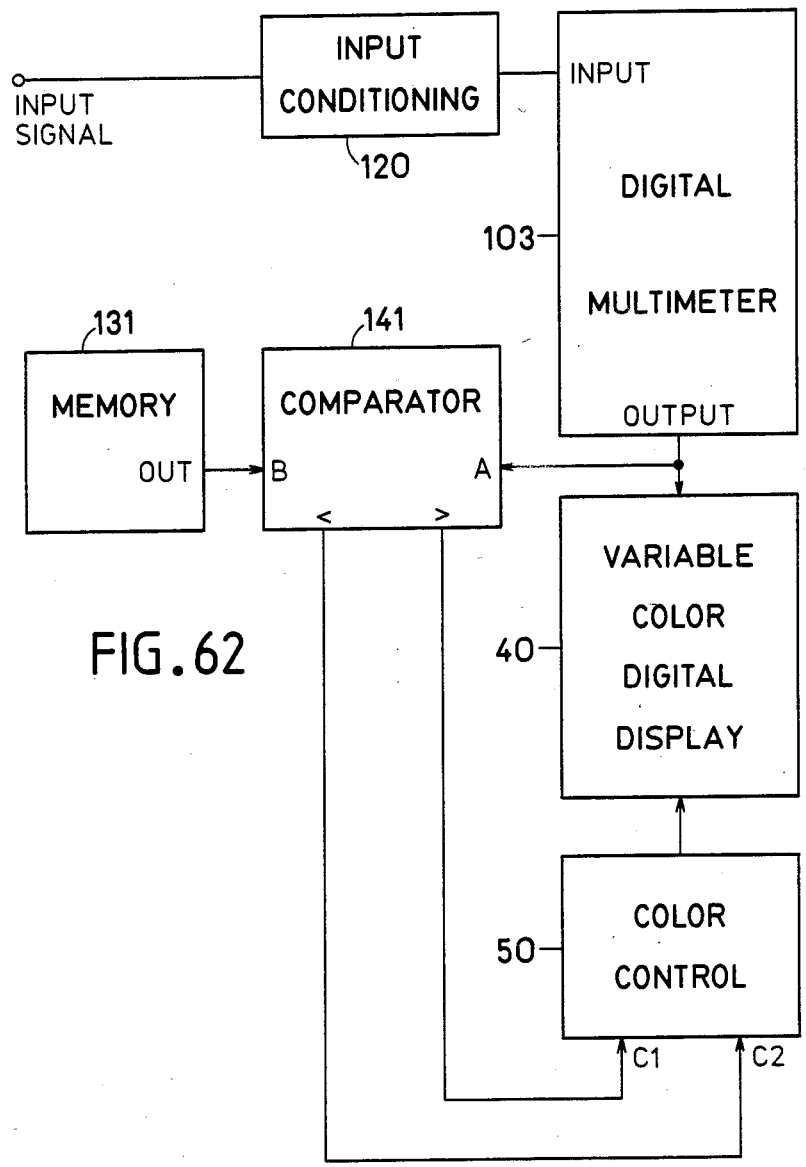
FIG. 62 is a block diagram of a variable color digital multimeter with comparator and memory.

FIG. 62 is a block diagram of a multimeter which includes a memory 131, containing a reference measured value, and a comparator 141. Measured values of input signal, which is applied to an input conditioning circuit 120, wherein it may be switched, scaled, attenuated, rectified, and filtered (not shown), will be compared with reference value stored in the memory 131 and indicated on the display 40 in digital format and in a color depending on the relationship between the measured value and the reference one. The memory 131 may include electronic storage elements, such are flip-flops, latches, RAMs, ROMs, and the like, and mechanical storage elements, such are binary switches and the like. When the instant measured value is less than the reference value, the output '<' of the comparator 141 will be active, thereby activating the color control input C2 of the color control circuit 50, to illuminate the display 40 in the color C2. When the instant measured value is greater than the reference one, the comparator's output '>' will be active and the measured value will be displayed in the color C1. Alternatively, the instant measured value may be displayed in a color indicating its deviation, absolute or relative, from the reference value.

Figure 63:
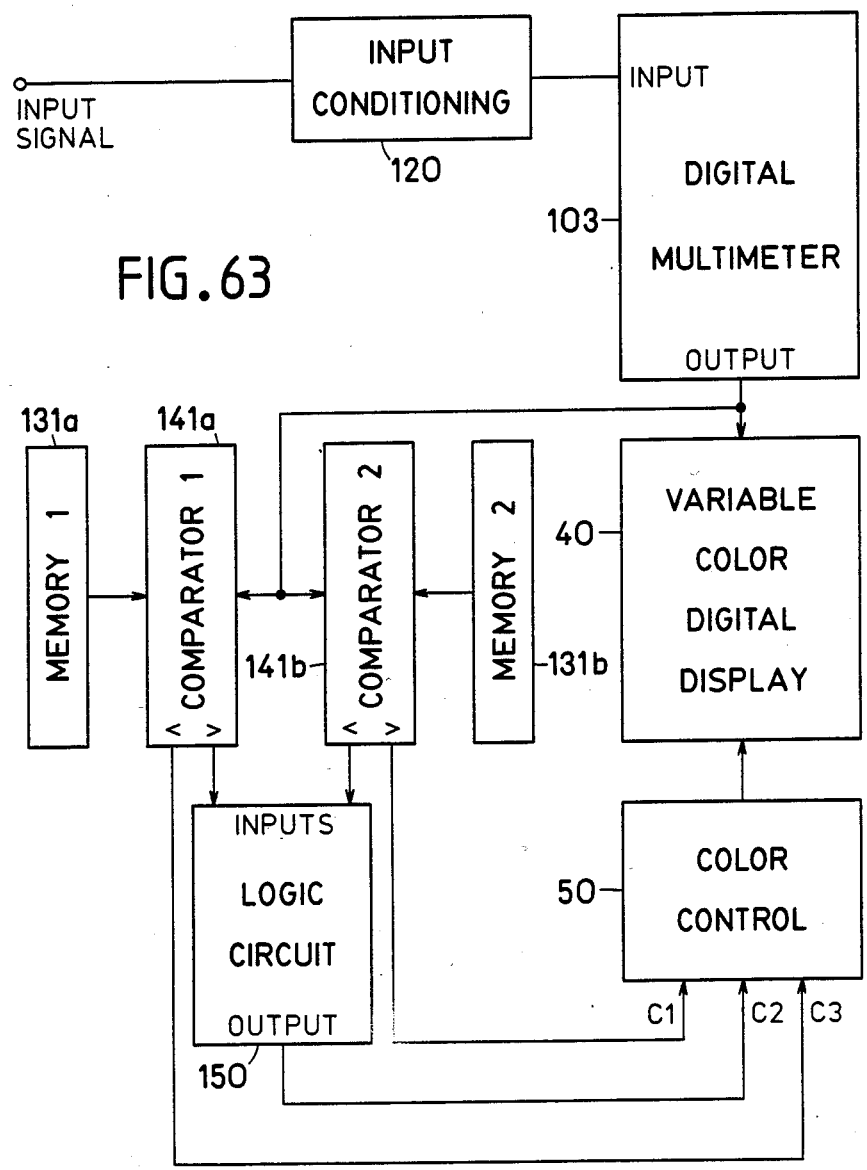
FIG. 63 is a block diagram of a variable color digital multimeter with comparator and memory for high and low limits.

FIG. 63 is a block diagram of a multimeter which includes a memory 131a for storing a low measurement limit, memory 131b for storing a high measurement limit, and comparators 141a, 141b. The measured values will be compared with the high and low measurement limits and indicated on the display 40 in a digital format and in a color depending on the relationship between the measured value and the low and high measurement limits. When the measured value is lower than the low measurement limit, stored in the memory 131a, the output '<' of the comparator 141a will be active, thereby activating the color control input C3 of the color control circuit 50, to illuminate the display 40 in the color C3. When the measurement value is higher than the high measurement limit, stored in the memory 131b, the output '>' of the comparator 141b will be active, thereby activating the color control input C1, to illuminate the display 40 in the color C1. When the measured value is higher than the low measurement limit and lower than the high measurement limit, the active outputs '>' of the comparator 141a and '<' of the comparator 141b will be combined in a logic fashion by a logic circuit 150, thereby activating the color control input C2, to illuminate the display 40 in the color C2.

Figure 64:
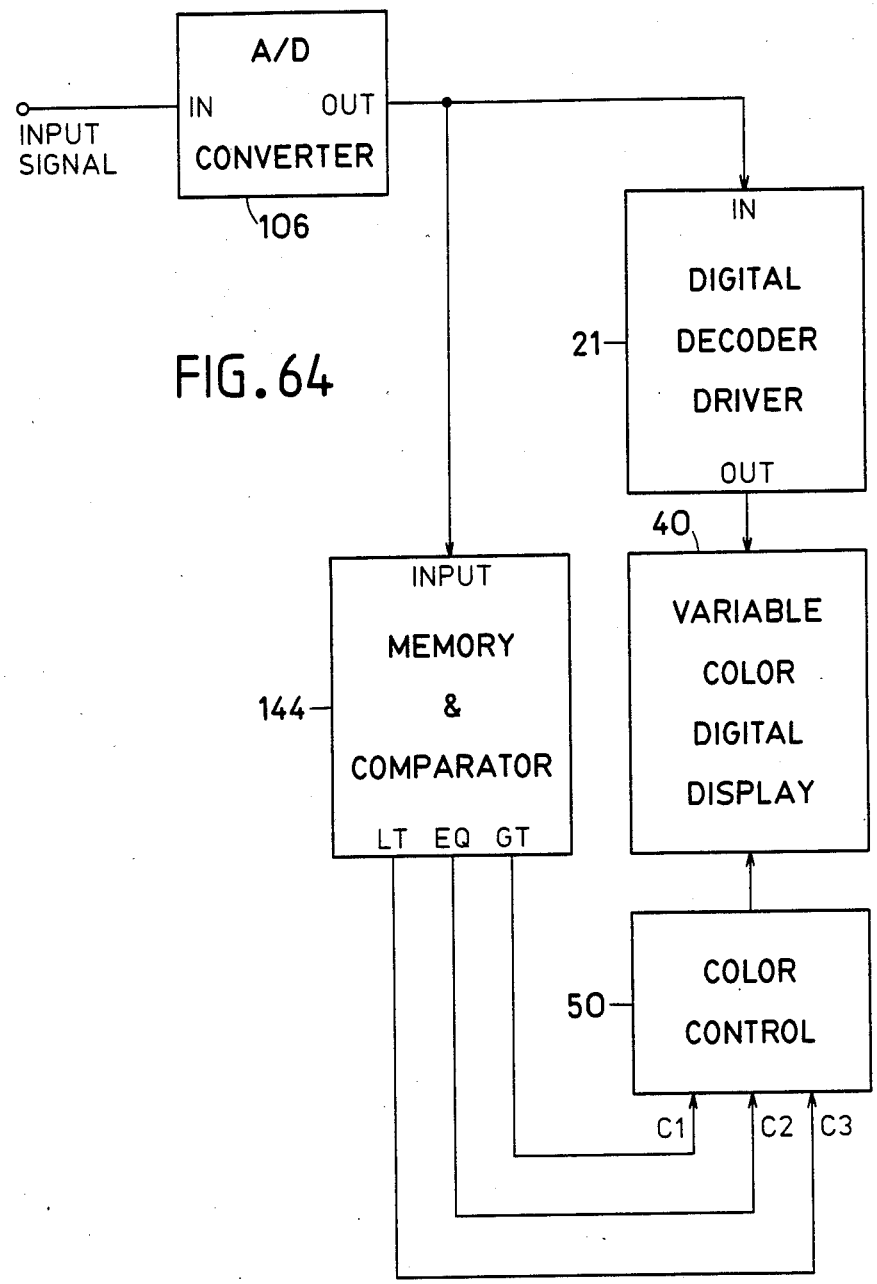
FIG. 64 is a block diagram of a variable color digital multimeter with comparator and memory for previous measurement values.

FIG. 64 is a block diagram of a multimeter for making repeated measurements, which includes an A/D converter 106 and memory and comparator circuit 144. The instant measured value of the input signal, converted to digital format by the A/D converter 106, may be from time to time stored in the memory 144, so that subsequent measurements could be compared with the same. The instant measured value will be displayed on the display 40 in a digital format and in a color depending on the result of comparison with the value stored in the memory. When the instant measured value is less than that stored in the memory, the output LT (Less Than) of the comparator 144 will be active, thereby activating the color control input C3 of the color control circuit 50, to display the measured value in the color C3. When the instant measured value is equal to that stored in the memory, the comparator output EQ (Equal) will be active, thereby activating the color control input C2, to display the measured value in the color C2. When the instant measured value is greater than that stored in the memory, the comparator output GT (Greater Than) will be active, thereby activating the color control input C1, to display the measured value in the color C1.

Figure 65:
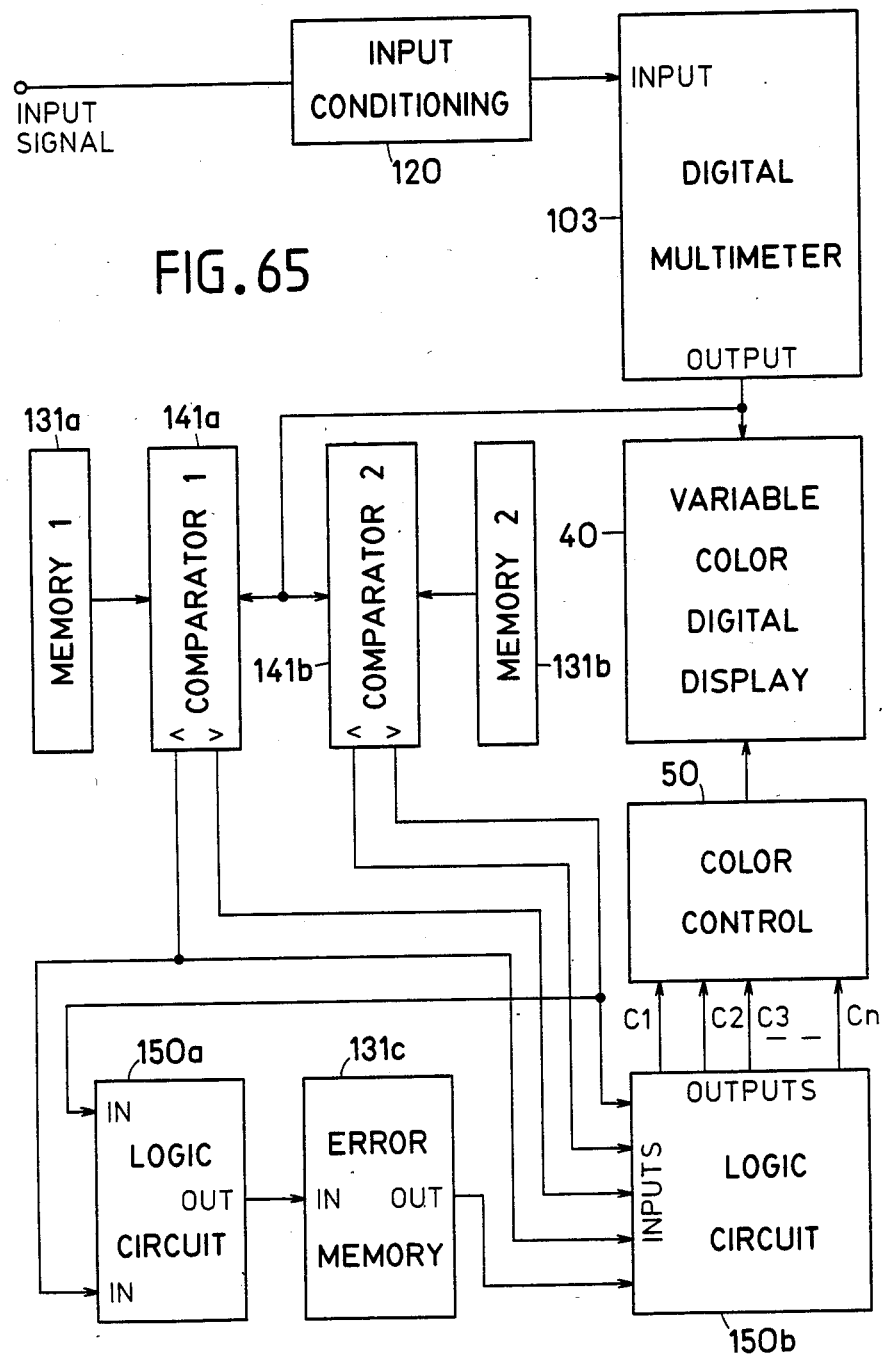
FIG. 65 is a block diagram of a variable color digital multimeter with memory for previous measurement errors.

FIG. 65 is a block diagram of a multimeter for making a series of measurements and for comparing each measured value, by comparators 141a, 141b, with low and high measurement limits stored in memories 131a, 131b, respectively. An additional error memory 131c, which may include an error counter, and logic circuit 150a are provided for storing the number of measurement errors. The instant measured value will be indicated on the display 40 in a digital format and and in a color depending, firstly, on its relationship with the applicable low and high measurement limits, and, secondly, on the number of previous measurement errors. Various kinds of decisions may be made, by a logic circuit 150b, based on the contents of the error memory. The decisions may be as simple as merely display measurement results in the color C1 for no previous measurement errors and in the color C2 for some previous errors, or it might involve sophisticated color selections based on the number of previous errors and total number of measurements, arrived at by virtue of arithmetic and logic operations.

Figure 66:
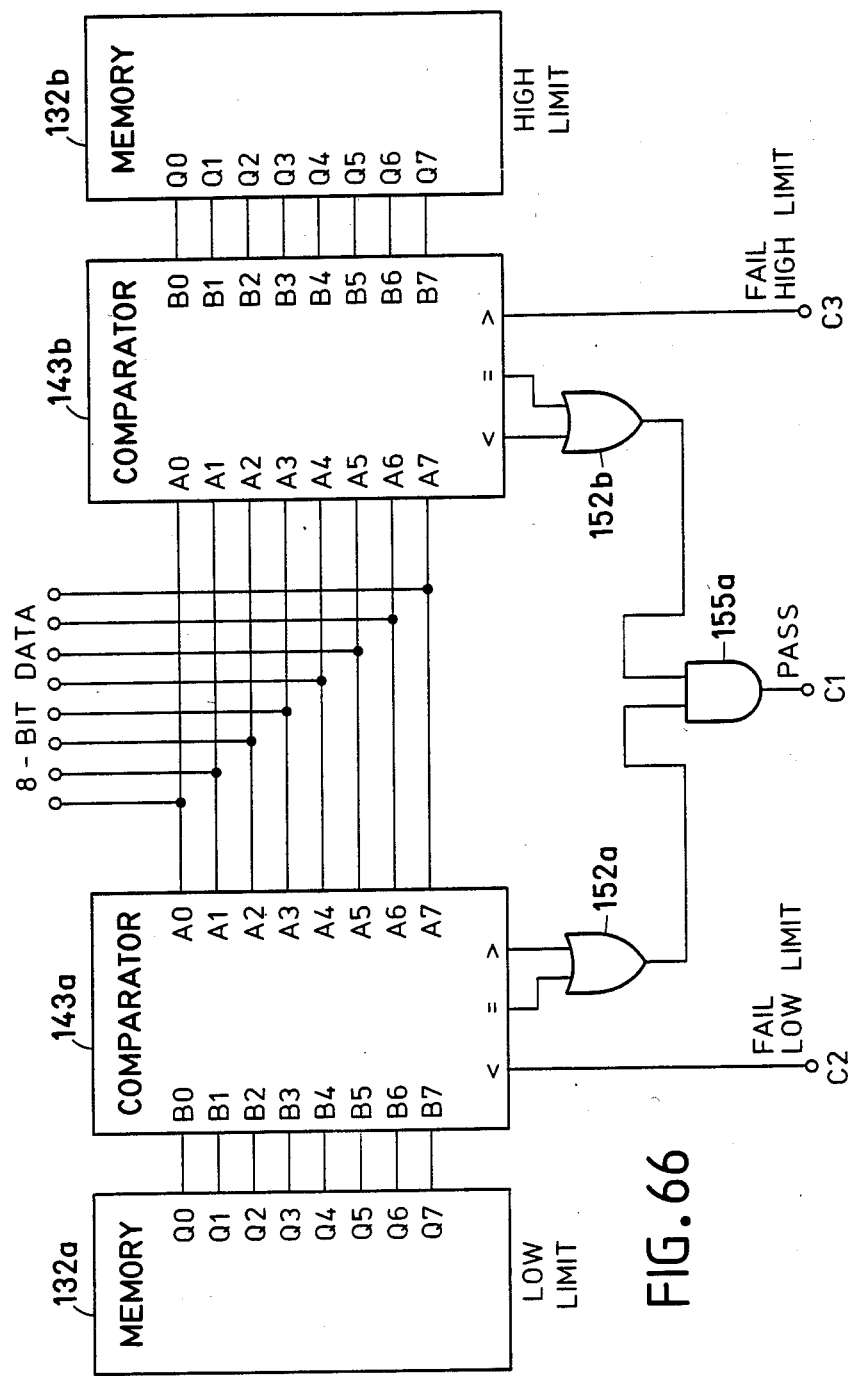
FIG. 66 is a schematic diagram of a comparator with low and high measurement limits.

In FIG. 66 is shown an exemplary simplified schematic diagram of the limit memory and limit comparator combination, generally shown in FIG. 65, for 8-bit measurement data (two BCD digits). The 8-bit data stored in a memory 132a, symbolizing the low measurement limit, are applied to respective inputs B0 to B7 of a digital comparator 143a; the 8-bit data stored in a like memory 132b, symbolizing the high measurement limit, are applied to respective inputs B0 to B7 of a comparator 143b. The 8-bit measurement data, having relation to the instant measured value, are applied to respective inputs A0 to A7 of both comparators 143a, 143b, interconnected in parallel. The comparators 143a, 143b will effect a comparison between the measurement data and the instant low and high measurement limits and accordingly develop their output signals '<', '=', '>'. When the instant measurement data are less than the low measurement limit, the '<' output of the comparator 143a will rise to a high logic level. When the instant measurement data are greater than the high measurement limit, the '>' output of the comparator 143b will rise to a high logic level. When the instant measurement data are between the low and high measurement limits, one of the inputs of each OR gate 152a, 152b will rise to a high logic level, thereby forcing both inputs of an AND gate 155a to rise to a high logic level, which in turn will force the output of the latter to rise to a high logic level. The outputs PASS, FAIL LOW LIMIT, and FAIL HIGH LIMIT may be connected to respective inputs C1, C2, and C3 of the color control 50. By way of an example, the display 40 may illuminate in green color for pass, in yellow color for fail on the low limit, and in red color for fail on the high limit.

Figure 67:
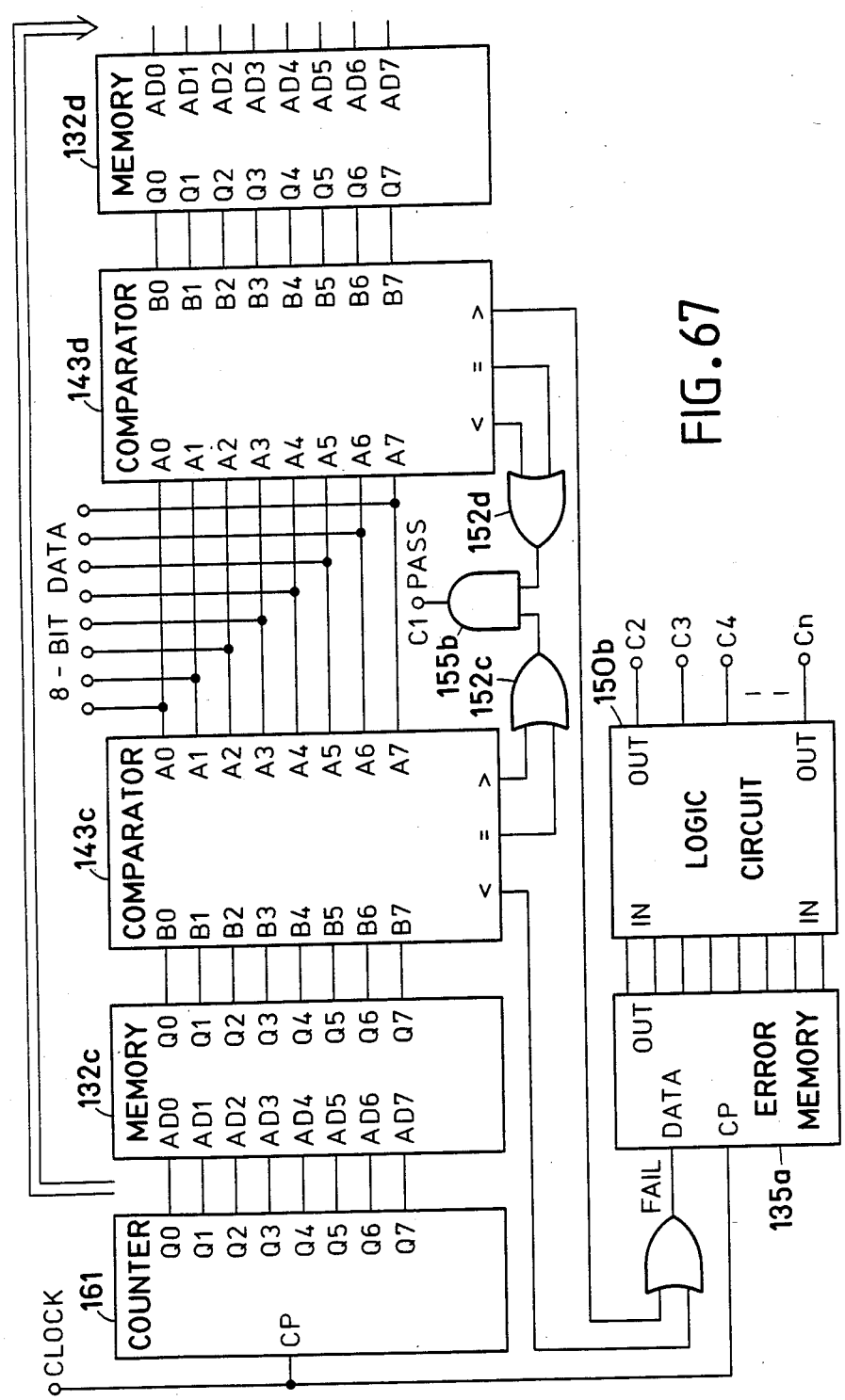
FIG. 67 is a schematic diagram of a comparator and error counter.

In FIG. 67 is shown a simplified schematic diagram of the limit memory, limit comparator, and error memory combination, in a digital multimeter for making a series of measurements. A memory 132c contains data symbolizing low measurement limits for each measurement step. A like memory 132d contains data symbolizing high measurement limits for each measurement step. An 8-bit counter 161, which is incremented for each measurement step by a suitable clock pulse, is used to simultaneously address both memories 132c, 132d. When addressed for a particular measurement step, the memories 132c, 132d present the data residing at such address to the inputs B0 to B7 of the comparators 143c, 143d, respectively, as the instant low and high measurement limits. The comparison of the instant measurement data with the instant measurement limits will be performed by the comparators 143c, 143d at each measurement step. When the measurement passes, the PASS output will rise to a high logic level. When the measurement fails, either on the low or high measurement limit, the FAIL output of the OR gate 152e will rise to a high logic level, and the error memory 135a will be incremented by the next clock pulse. Thus the error memory 135a contains data representing the total number of measurement errors. A logic circuit 150b will convert the instant error memory data to color control signals C2 to Cn, whereby the instant measured value will be displayed in the color C1 on pass, and in a certain of the colors C2 to Cn on fail, depending on the total number of previous measurement errors, as will be more fully explained later.

Figure 68:
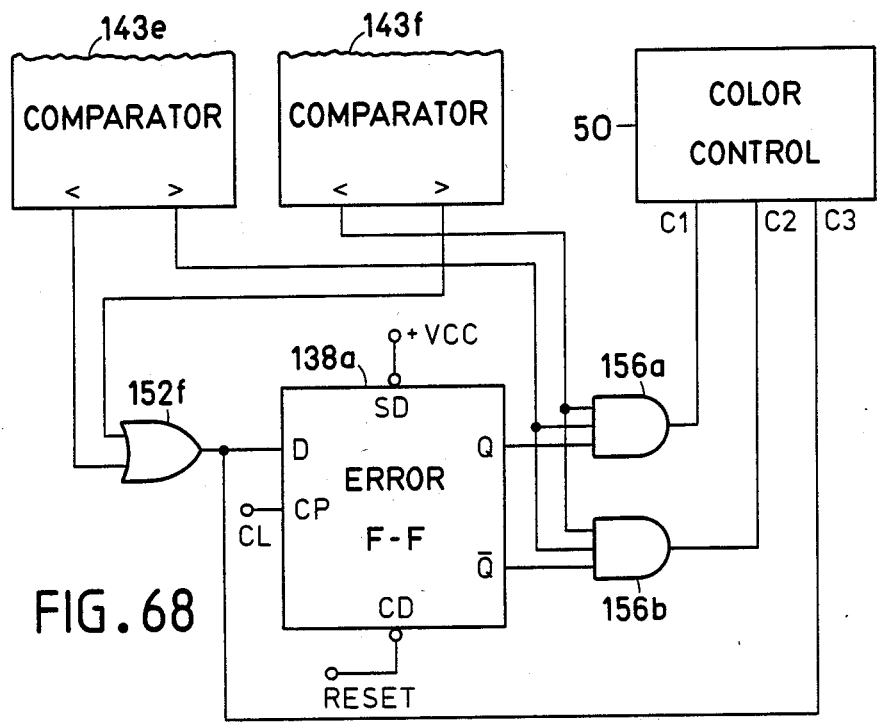
FIG. 68 is a detail of the comparator, error flip-flop, and color control combination.

In FIG. 68 is shown a detail of the comparator, error flip-flop, and color control combination generally shown in FIG. 65. When a measurement error occurs, either on the low or high measurement limit, the output of an OR gate 152f, which is connected to the D input of an error flip-flop 138a, will rise to a high logic level, and the error flip-flip will be set by the next clock pulse, to indicate that there was a measurement error. The error flip-flop may be suitably reset (not shown), e.g., at the beginning of each measurement series. Results of the measurements will be indicated on the display 40 in a digital format and in a color depending on the result of comparison with the instant low and high measurement limits, and on the condition of the error flip-flop. By way of an example, the measurements will be displayed in green color on pass, in yellow color on fail with no previous measurement errors, and in red color on fail with previous measurement errors.

Figure 69:
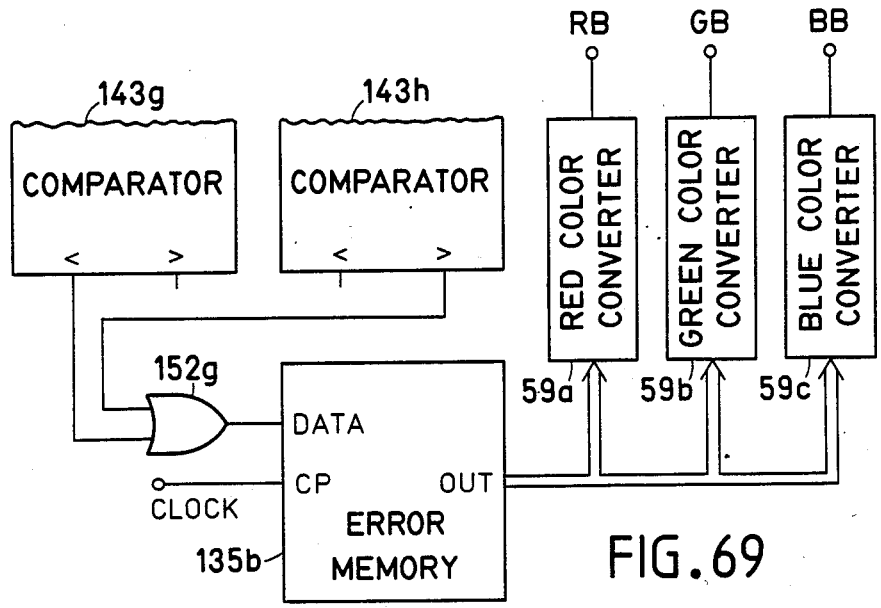
FIG. 69 is a detail of the comparator, error memory, and color converter combination.

FIG. 69 is another exemplary detail of the comparator, error memory, and color converter combination generally shown in FIG. 67. When a measurement error occurs, the output of an OR gate 152g, which is connected to the DATA input of the error memory 135b, will rise to a high logic level, and the error memory contents will be incremented by the next clock pulse. The error memory 135b thus contains data indicating the instant total number of previous measurement errors. The outputs of the error memory 135b are applied to the interconnected inputs of the red color converter 59a, green color converter 59b, and blue color converter 59c, which will develop drive signals for energizing the red, green, and blue buses of the display 40, to thereby illuminate the latter in a color related to the total number of previous errors.

Figure 70:
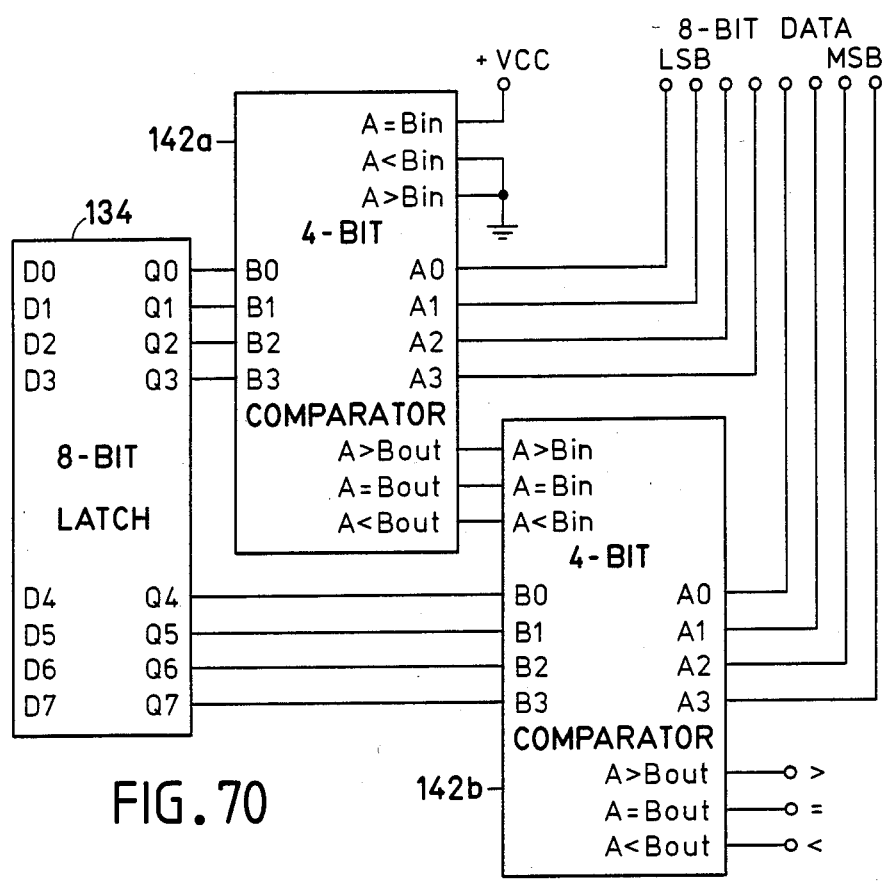
FIG. 70 is a detail of the low measurement limit memory and comparator combination.

FIG. 70 is a detail of the low limit memory and comparator combination shown in FIG. 66. An 8-bit latch 134 stores data representing the instant low measurement limit, which may be from time to time entered via its inputs D0 to D7 (not shown). Two 4-bit digital comparators 142a, 142b are cascaded to form an 8-bit digital comparator, in a manner well understood by those skilled in the art.

Figure 71:
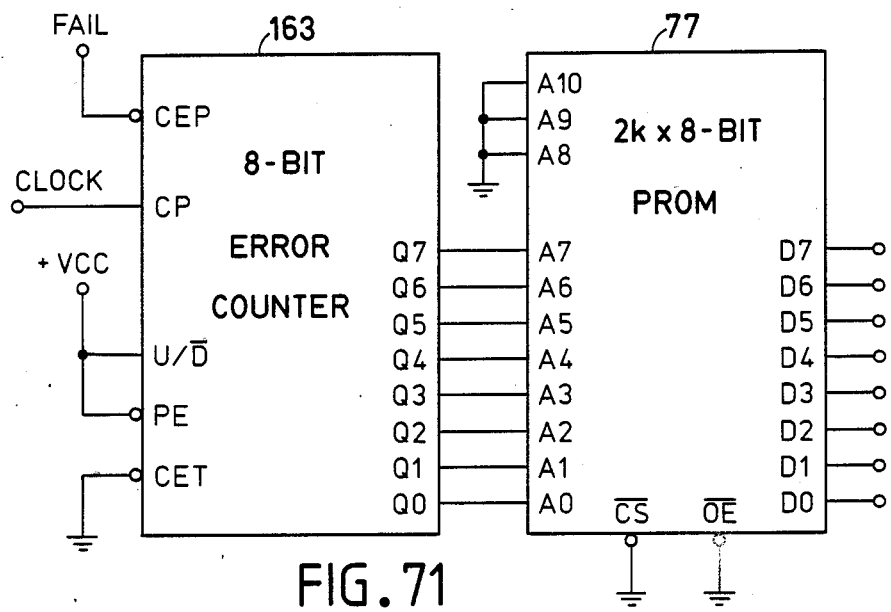
FIG. 71 is a detail of the error counter and PROM combination.

FIG. 71 is an exemplary detail of the error counter and PROM combination shown in FIG. 69. An 8-bit counter 163, which contains the count indicating the total number of previous measurement errors, is employed to address, via its outputs Q0 to Q7, a PROM 77 containing the color conversion data which may be used to develop drive signals for the red, green, and blue buses, as previously shown in FIG. 35, to thereby illuminate the display 40 in a color depending on the total number of previous measurement errors.

Figure 72:
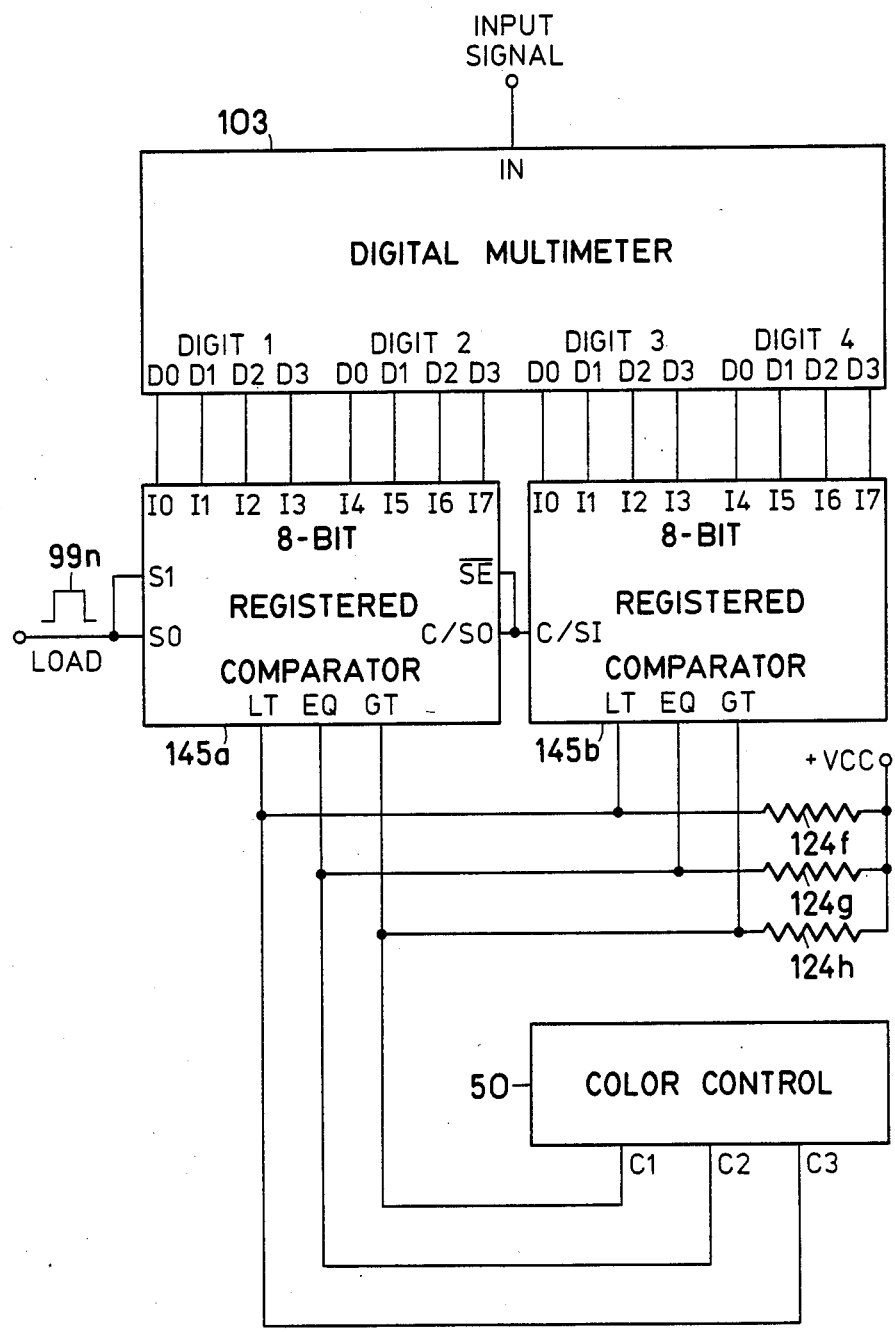
FIG. 72 is a schematic diagram of a variable color digital multimeter with registered comparator for comparing instant measured values with previously stored ones.

The schematic diagram shown in FIG. 72 includes a digital multimeter 103 for making repeated mesurements of input signals and for developing at its outputs 4-digit BCD code having relation to the magnitude of the instant input signal, and two cascaded registered comparators 145a, 145b for comparing the instant measured value with the value previously stored. From time to time, a short positive pulse 99n may be applied to the interconnected Load inputs S0, S1, to cause the instant data at the inputs I0 to I7 of both registered comparators 145a, 145b to be loaded therein. The subsequent measured values will be compared with the reference value currently loaded in the register, and the interconnected outputs LT (Less Than), EQ (Equal), GT (Greater Than), which are tied to the supply voltage va suitable pull-up resistors 124f, 124g, 124h, will indicate the results of each comparison. The comparator outputs are respectively connected to the color control inputs C1, C2, C3 of the color control circuit 50, to control the color of the display 40, shown in FIG. 62, in accordance with the result of comparison. The display 40 will indicate the instant measured value in a digital format and in a color depending on the result of comparison with the reference value currently stored in the register. By way of an example, the display 40 will illuminate in green color when the instant measured value is equal to the reference value, in yellow color when it is less than the reference value, and in red color when it is larger than the reference value.

Figure 73:
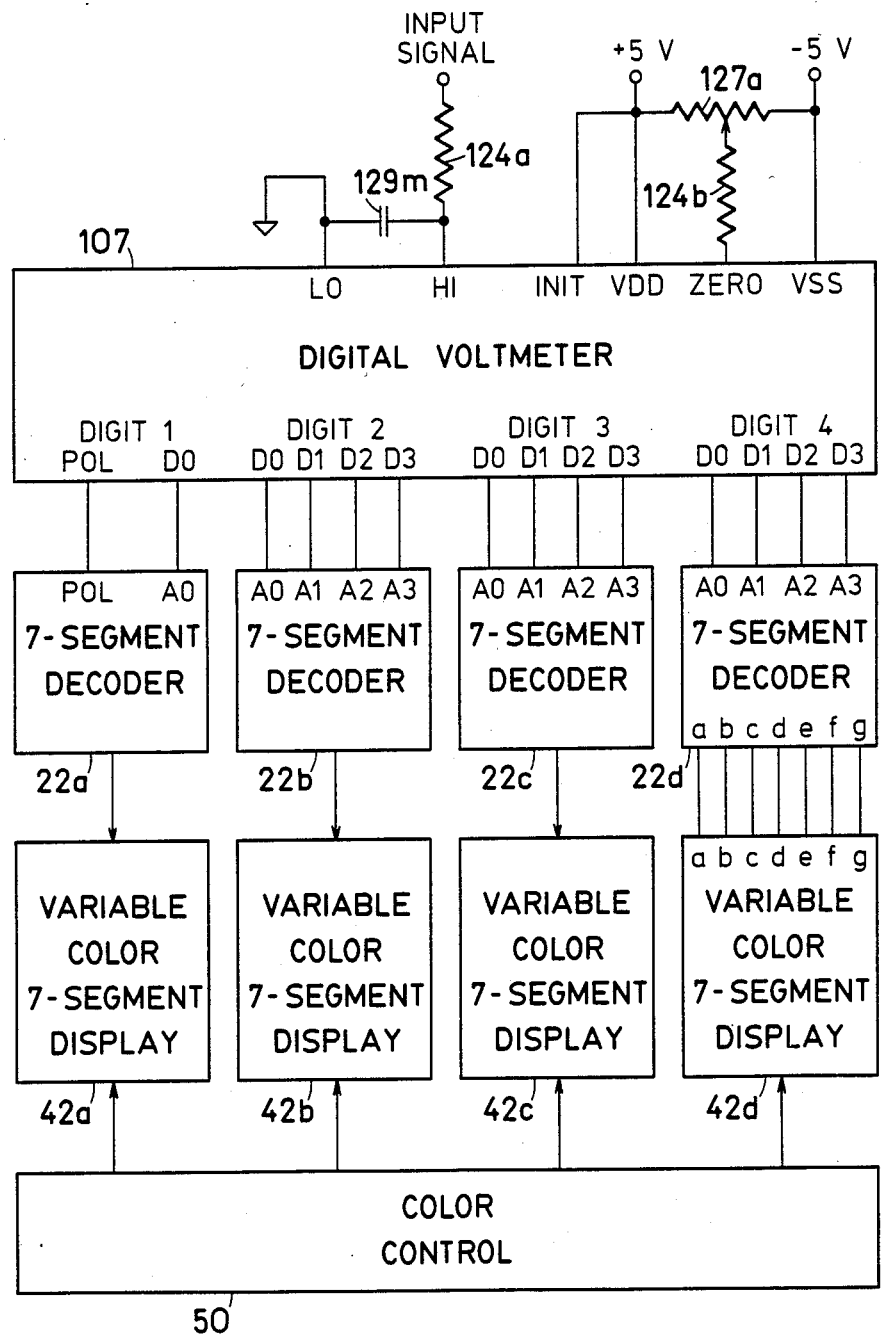
FIG. 73 is a block diagram of a variable color digital multimeter with uniform color control for all display digits.

In FIG. 73 is shown a simplified schematic diagram of digital voltmeter with 3½ digit variable color display. The digital voltmeter 107 is configured, by having its initialize conversion input INIT connected to a high logic level, to continuously convert input analog voltage, applied to its input terminal via a resistor 124a, to 3½ digit BCD code corresponding to the magnitude of instant input voltage. The BCD codes for the respective digits are converted, by 7-segment decoders 22a, 22b, 22c, 22d, to signals for directly energizing the segments of the variable color display digits 42a, 42b, 42c, 42d, respectively, in a manner well understood by those skilled in the art. The color control circuit 50 will cause all four display digits to illuminate uniformly in a selected color, as previously described.

Figure 74:
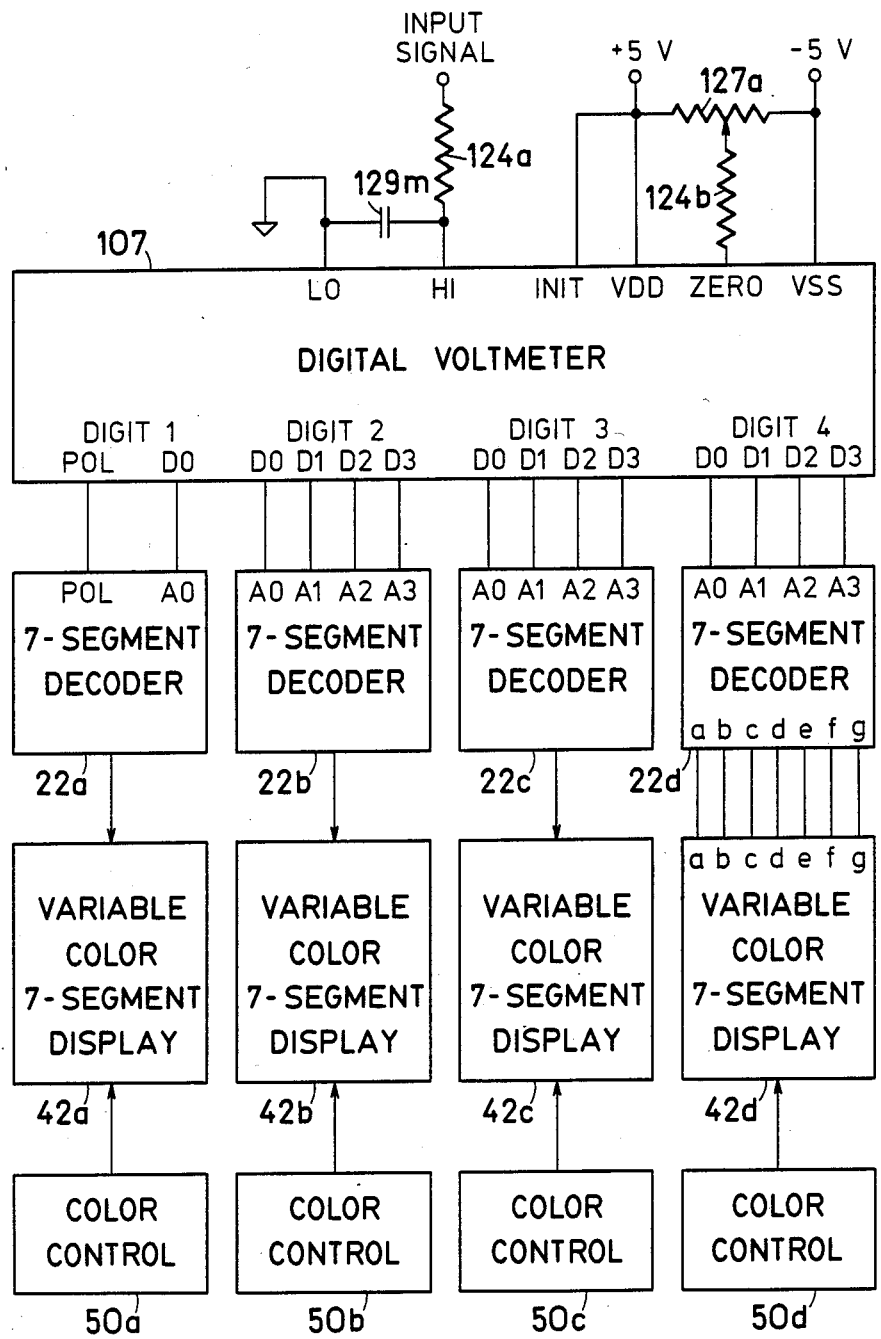
FIG. 74 is a block diagram of a variable color digital multimeter with independent color control for each display digit.

A like block diagram shown in FIG. 74 differs in that four color control circuits 50a, 50b, 50c, 50d are employed to independently control the color of respective display digits 42a, 42b, 42c, 42d.

Figure 75:
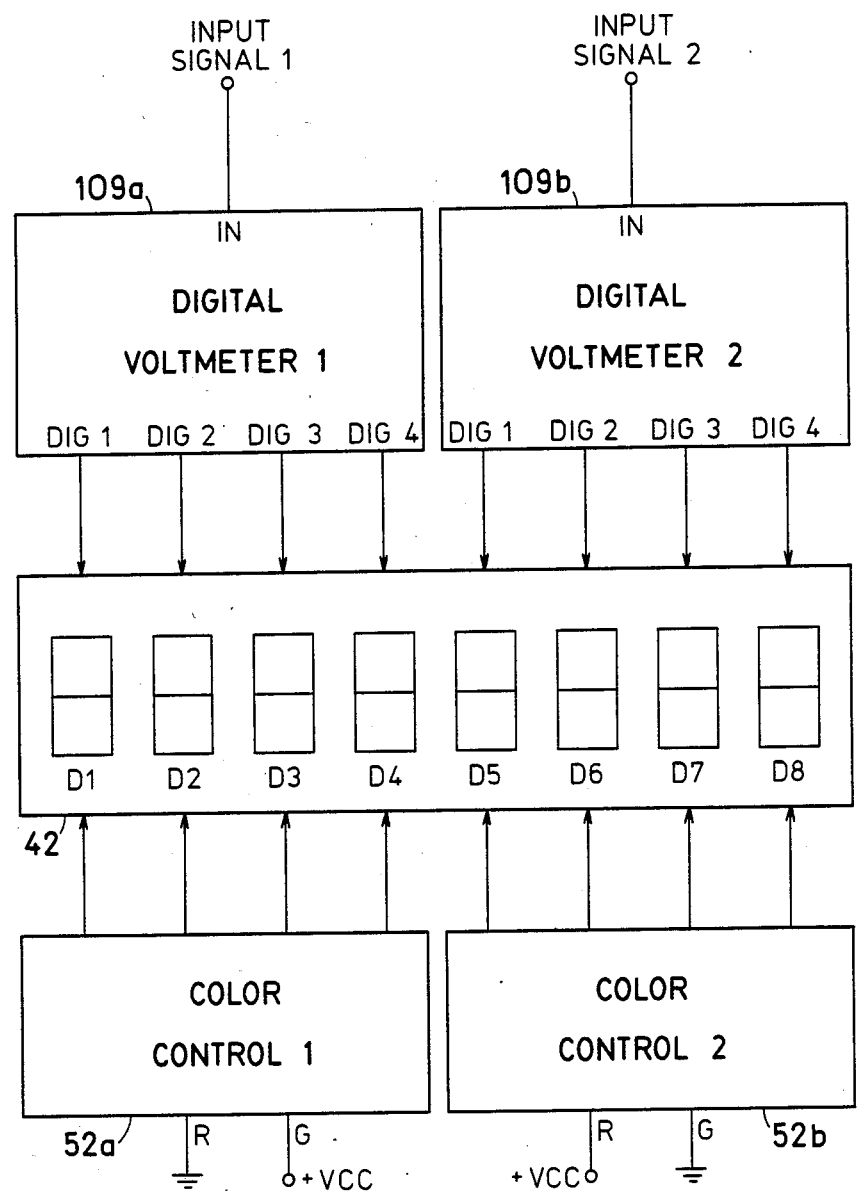
FIG. 75 is a block diagram of a dual digital voltmeter with single variable color digital display.

In FIG. 75 is shown, in a block diagram configuration, a multimeter utilizing two digital voltmeters 109a and 109b for measuring respective INPUT SIGNALS 1 and 2. The measured values of both input signals are simultaneously indicated on a single 8-digit variable color display 42 such that the four most significant display digits D1 to D4 indicate the output of the digital voltmeter 109a, and the four least significant display digits D5 to D8 indicate the output of the digital voltmeter 109b. In order to clearly distinguish between the two measured values, without the need for a visual gap therebetween, the color control circuit 52a is adapted, by having its color control input G connected to a high logic level, to illuminate the four most significant display digits D1 to D4 in green color, and like color control circuit 52b is adapted, by having its color control input R connected to a high logic level, to illuminate the four least significant digits D5 to D8 in red color.

Figure 76:
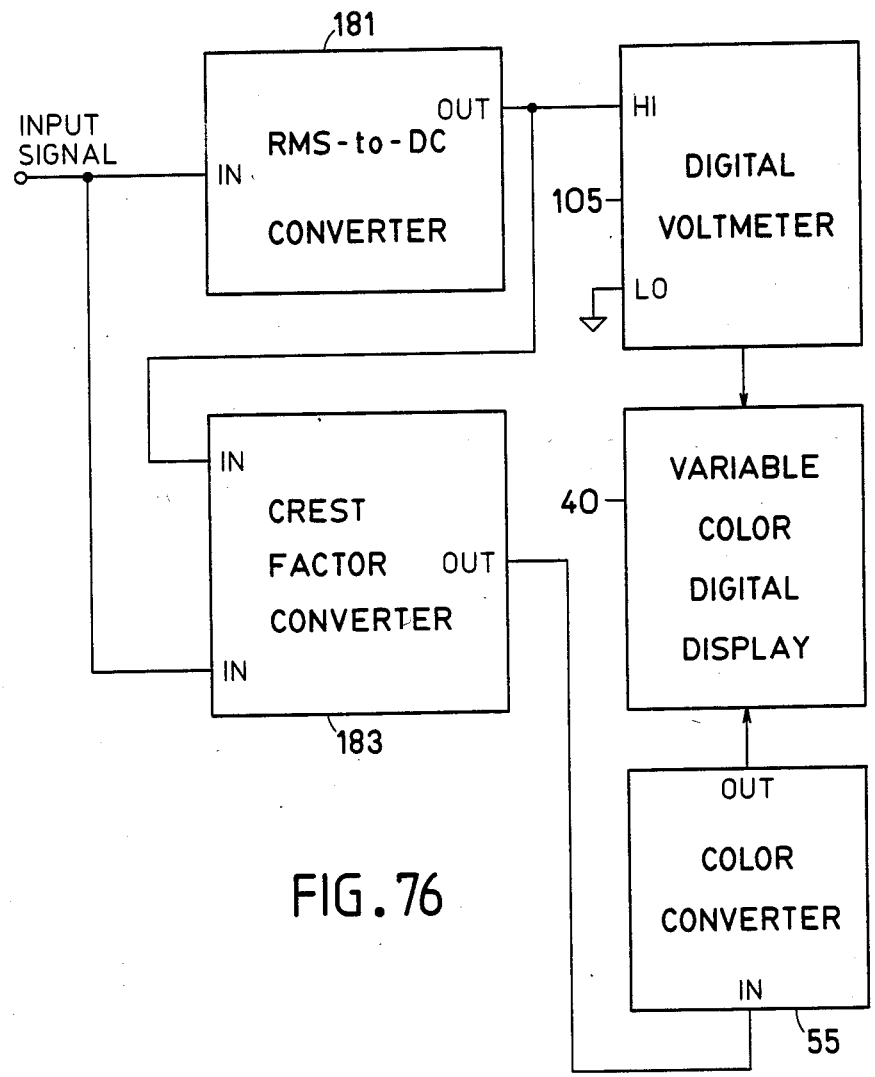
FIG. 76 is a block diagram of a variable color RMS digital voltmeter with variable color crest factor indication.

FIG. 76 is a block diagram of an RMS digital voltmeter with variable color crest factor indication. The RMS (Root Mean Square) value of the measured waveform is its heating value when applied to a resistor; it indicates the magnitude of the measured waveform regardless of its shape. The Crest Factor is the peak signal value divided by the RMS value; it indicates what type of a waveform it is.

The digital voltmeter includes an RMS converter 181 for converting an input measured signal to a DC value representative of the energy content of the measured signal. The DC value from the RMS conveter 181 is applied to the HI input terminal of a digital voltmeter 105 which will develop at its outputs signals to directly drive variable color digital display 40, to thereby indicate the measured RMS value in digital format, in a manner well known to those having ordinary skill in the art.

The invention resides in the addition of a crest factor converter 183 for computing the crest factor value of the measured waveform, and in a color converter 55 for controlling the color of the digital display 40 in accordance with the crest factor value. The RMS digital voltmeter of the present invention will simultaneously indicate the RMS value of the measured waveform in digital format and in a color indicative of the crest factor value of the measured waveform, to thereby simultaneously indicate its magnitude and shape.

FIG. 77 is a comparison chart of RMS and crest factor values for several exemplary waveforms. It is readily apparent that the crest factor value is a good indication of the waveform shape. The unity value of the crest factor indicates that the measured signal is either a symmetrical waveform or a DC signal. Small values of the crest factor (less than 2) usually indicate either a sine wave, triangle wave, or a low duty cycle pulse train. High values of the crest factor (greater than 4) usually indicate a noise signal or a pulse train with a high duty cycle.

Figure 78:
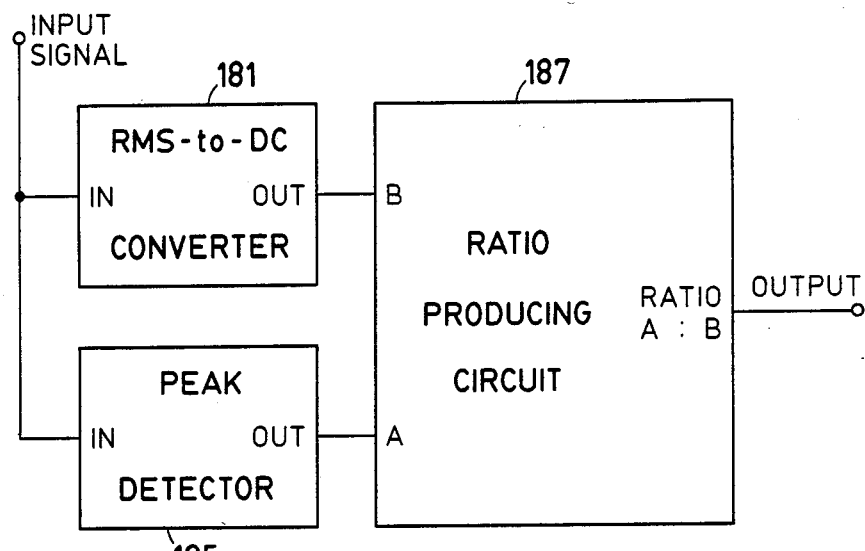
FIG. 78 is an expanded block diagram of a crest factor converter with ratio producing circuit.

As illustrated in FIG. 78, the crest factor converter 183 includes a ratio producing circuit 187 that will develop at its output RATIO A:B a signal representative of the ratio of signals applied to its inputs A and B. The peak signal value, obtained from the output of the peak detector 185, is applied to the input A. The RMS signal value, obtained from the output of the RMS-to-DC converter 184, is applied to the input B. The computed ratio of the peak signal value to the RMS signal value, developed at the output RATIO A:B, will be, by definition, a crest factor value of the measured signal.

Figure 79:
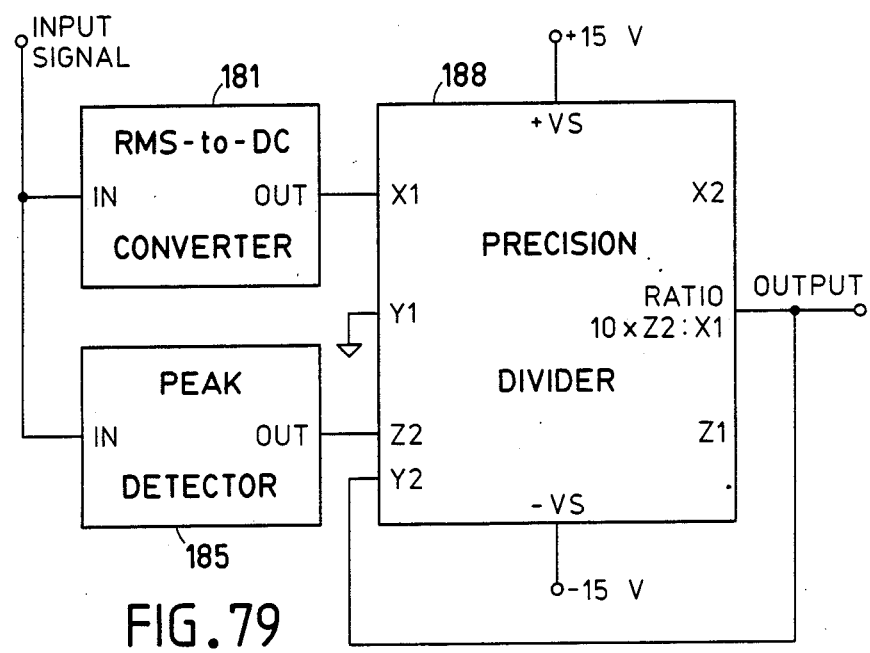
FIG. 79 is an expanded block diagram of a crest factor converter with precision divider.

In a simplified exemplary schematic diagram of a ratio producing circuit, shown in FIG. 79, the output DC voltage of the RMS-to-DC converter 181 is applied to the X1 input of a precision divider 188, while the output DC voltage of the peak detector 185 is applied to its input Z2. The precision divider 188 will develop at its output suitably scaled DC voltage representing the ratio of the signals Z2 to X1.

Figure 80:
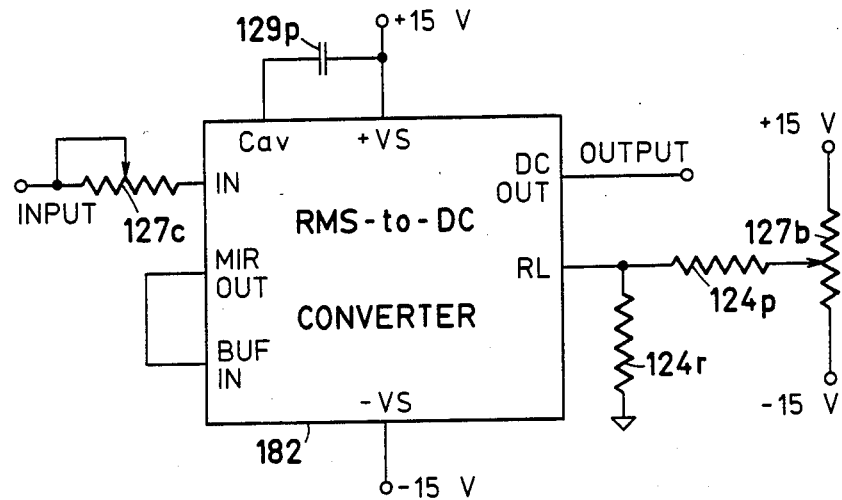
FIG. 80 is a schematic diagram of an RMS-to-DC converter.

In an exemplary detail of the RMS converter circuit, shown in FIG. 80, the measured signal is applied, via a suitable potentiometer 127c, to the input of an RMS-to-DC converter 182, which will develop at its output a DC voltage corresponding to RMS value of the measured signal. The potentiometer 127b and resistors 124p, 124r are used to adjust offset voltage; the capacitor 129p is selected to set a suitable averaging time constant.

Figure 81:
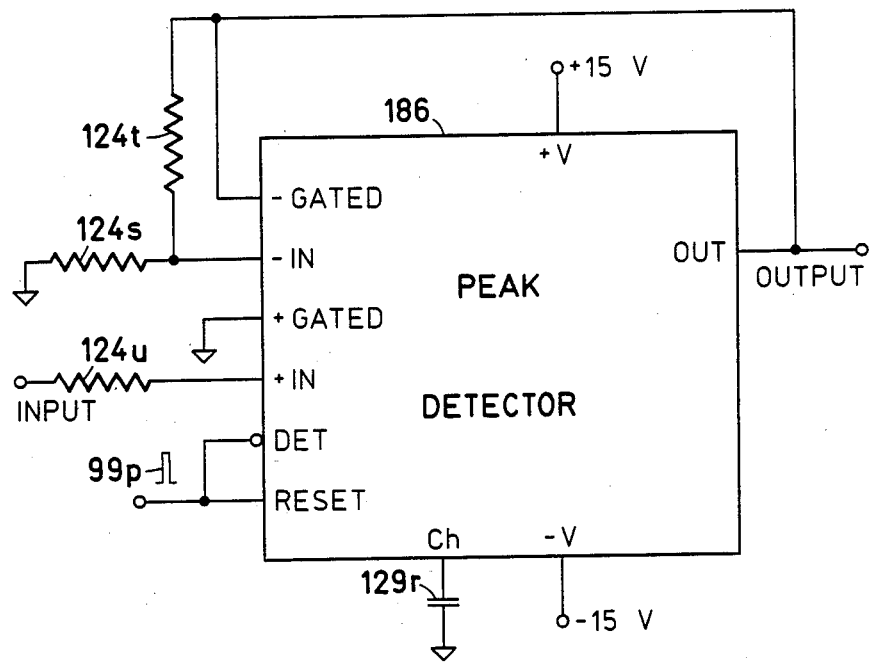
FIG. 81 is a schematic diagram of a peak detector.

FIG. 81 is an exemplary detail of the peak detector circuit, in which a measured signal is applied, via a suitable resistor 124u, to the input of a peak detector 186, which will develop at its output a DC voltage, retained on the hold capacitor 129r, representing the maximum value of the input signal. The present peak value may be from time to time reset, by applying a relatively short positive pulse 99p to the interconnected inputs DET and RESET. When the pulse 99p returns to a low logic level, new peak of the input signal may be measured.

Figures 82, 83:
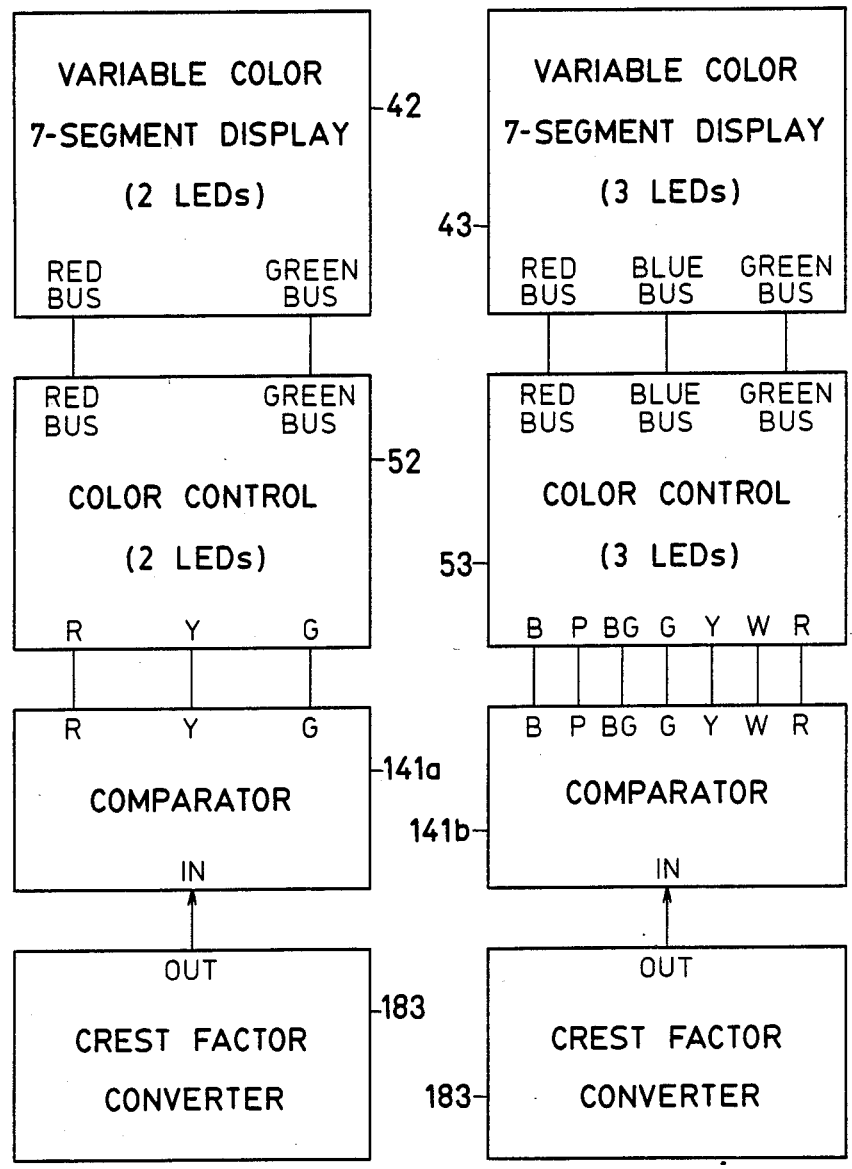
FIG. 82 is an expanded block diagram of 2-primary color control for the crest factor converter.
FIG. 83 is an expanded block diagram of 3-primary color control for the crest factor converter.

As shown in FIG. 82 in a block diagram form, the output voltage of the crest factor converter, which indicates the instant measured value of the crest factor, may be applied to input of a suitable comparator 141a, such as the one shown in FIG. 23, to develop color control logic signals R, Y, G for the color control circuit 52, to illuminate the display 42 in one of three colors, in accordance with the value of the crest factor. By way of an example, the comparator 141a may be set to develop active color control signal G for values of the crest factor less than 1.5, to illuminate the display 42 in green color, active color control signal Y for values of the crest factor between 1.5 and 2.5, to illuminate the display 42 in yellow color, and active color control signal R for values of the crest factor greater than 2.5, to illuminate the display 42 in red color.

A similar block diagram shown in FIG. 83 differs in that a comparator 141b, such as the one shown in FIG. 25, and color control circuit 53 are used to illuminate the display 43 in one of seven colors, in accordance with the value of the crest factor. By way of an example, the comparator 141b may develop active color control signal B for values of the crest factor less than 1.1, to illuminate the display 43 in blue color, active color control signal P for values of the crest factor between 1.1 and 1.4, to illuminate the display 43 in purple color, active color control signal BG for crest factor values between 1.4 and 1.7, to illuminate the display 43 in blue-green color, active color control signal G for crest factor values between 1.7 and 2.0, to illuminate the display 43 in green color, active color control signal Y for crest factor values between 2.0 and 2.5, to illuminate the display 43 in yellow color, active color control signal W for crest factor values between 2.5 and 3.0, to illuminate the display 43 in white color, and active color control signal R for crest factor values greater than 3.0, to illuminate the display 43 in red color.

Figures 84, 85:
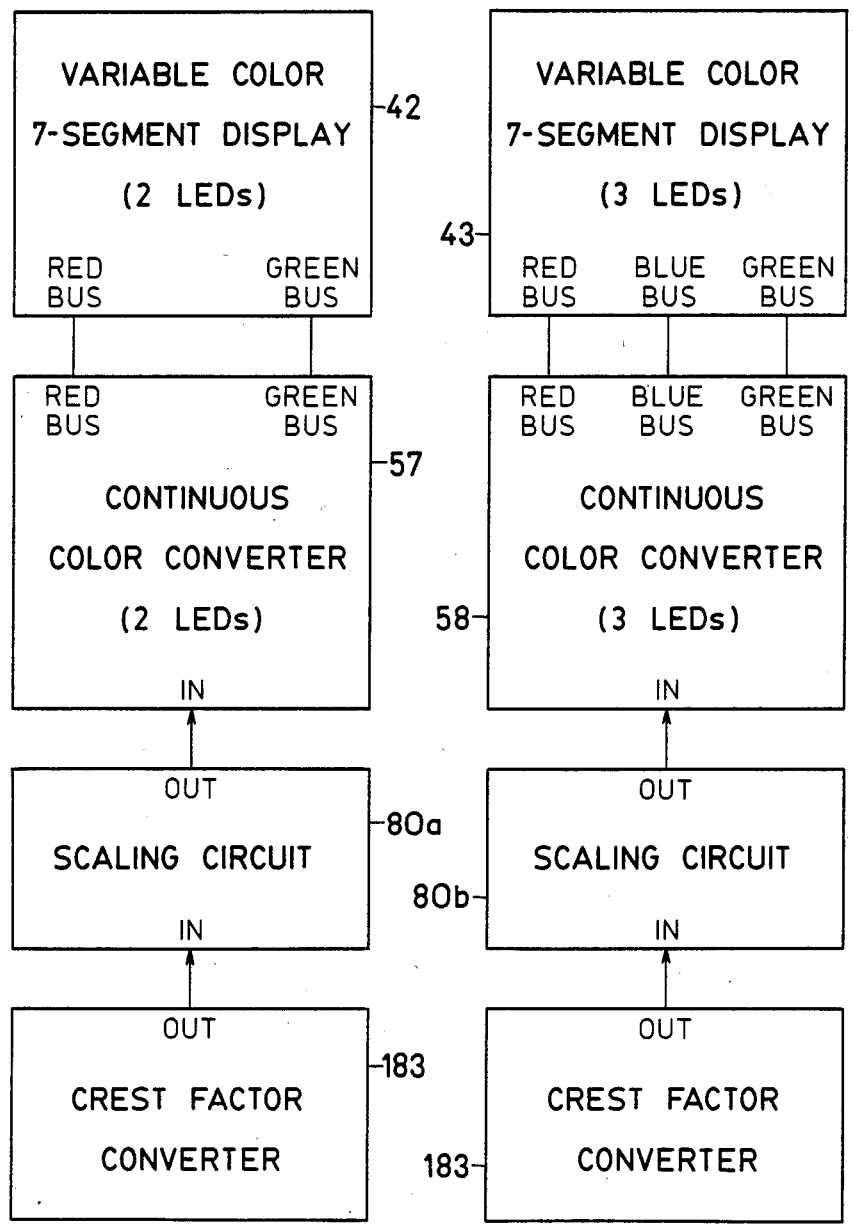
FIG. 84 is an expanded block diagram of 2-primary color converter for the crest factor converter.
FIG. 85 is an expanded block diagram of 3-primary color converter for the crest factor converter.

As shown in FIG. 84, the output voltage of the crest factor converter 183 is applied to the input of a scaling circuit 80a, such as the one shown in FIG. 31, to be scaled and shifted to a voltage range suitable for the continuous 2-primary color converter 57, which will develop drive signals for controlling the red and green buses, respectively, of the display 42, to illuminate same in a color related to the instant measured value of the crest factor.

A like block diagram shown in FIG. 85 differs in that a 3-primary color converter 58 is used to develop drive signals for the red, green, and blue buses, respectively, of the display 43, to illuminate same in a color related to the measured value of the crest factor. The relationship between the crest factor values and color of the display 43 may be defined at will, e.g., by programming suitable data into PROMs contained in the color converter 58, as previously described.

Figure 86:
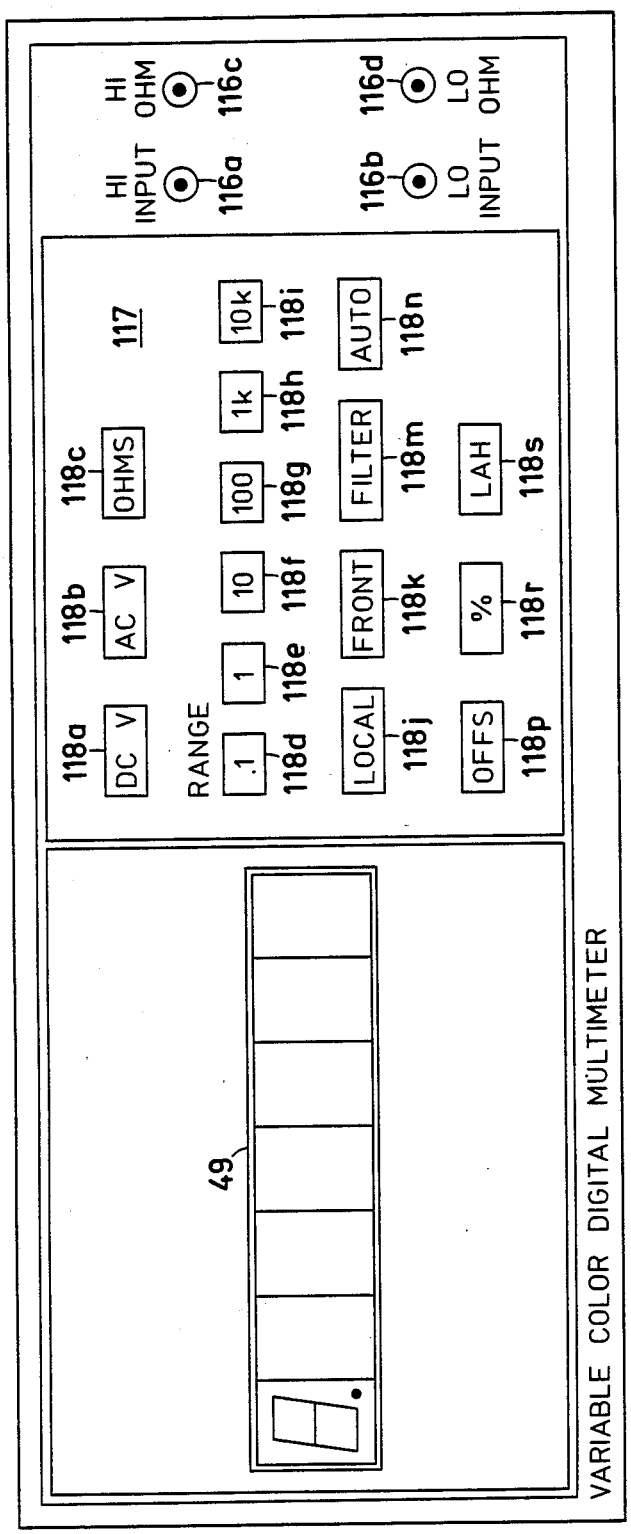
FIG. 86 is a front view of a variable color digital multimeter of the present invention.

In FIG. 86 is shown a front view of a digital multimeter which includes a 6½ digit variable color digital display 49, keyboard 117, and suitable terminals 116 for attaching thereto measuring cords. The keyboard 117 includes a 'DC V' key 118a for setting the multimeter to its DC voltage mode, 'AC V' key 118b for setting the multimeter to its AC voltage mode, OHMS key 118c for setting the multimeter to its OHMS mode, RANGE keys 118d, 118e, 118f, 118g, 118h, 118i for setting the multimeter to a selected range, LOCAL key 118j for setting the multimeter to its local mode, FRONT key 118k for selecting front measurement terminals, FILTER key 118m for setting the multimeter to its filter mode, AUTO key 118n for setting the multimeter to its autoranging mode, OFFS key 118p, '%' key 118r, and LAH key 118s for setting the multimeter to certain of its mathematical modes. The HI INPUT terminal 116a and LO INPUT terminal 116b may be used for voltage measurements; like HI OHM terminal 116c and LO OHM terminal 116d may be used for resistance measurements.

Figure 87:
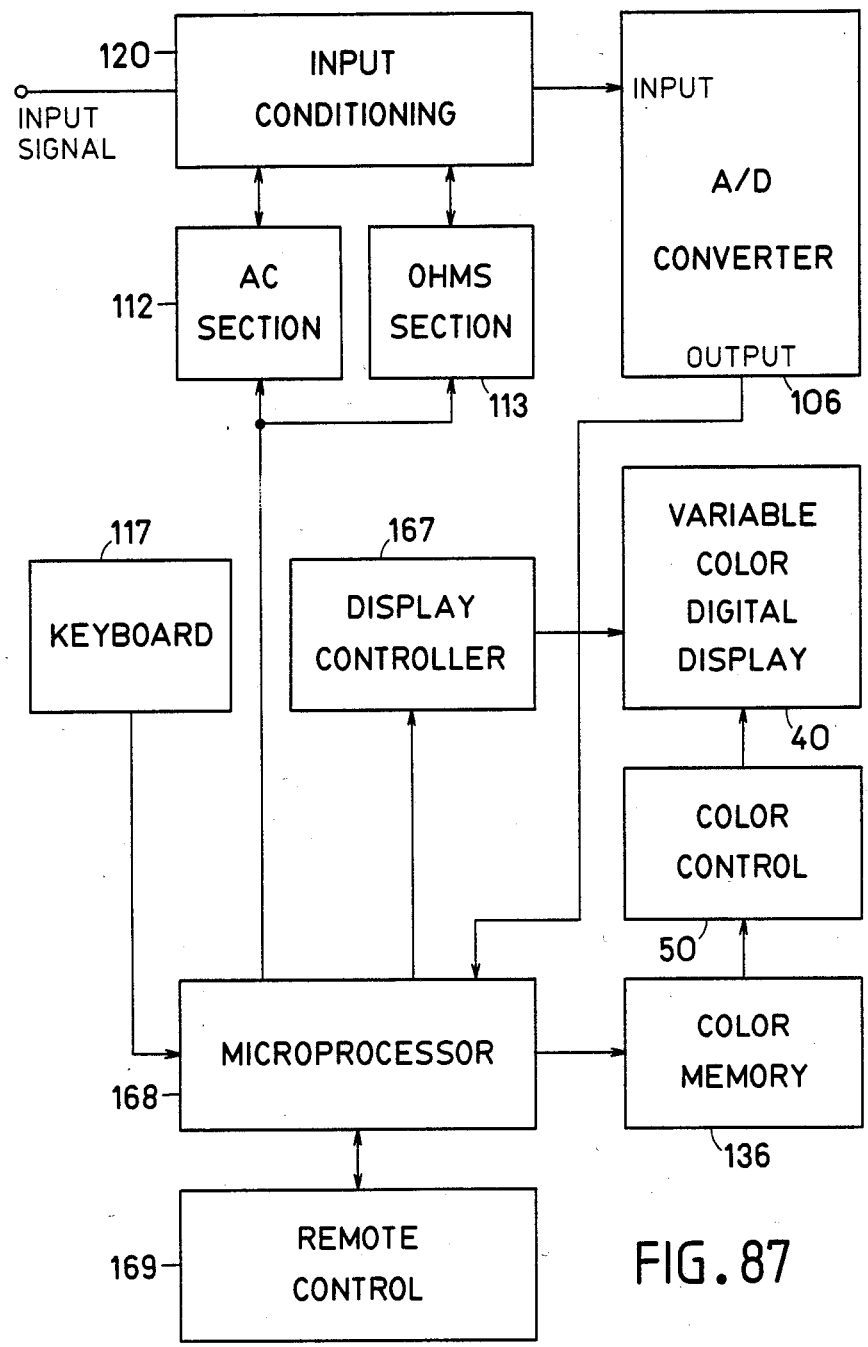
FIG. 87 is a block diagram of a variable color digital multimeter controlled by a microprocessor.

In FIG. 87 is shown a block diagram of a variable color digital multimeter controlled by a microprocessor or microcomputer 168, which can be influenced either locally, by entering commands via the keyboard 117, or remotely, by sending commands over a bus via the remote control circuit 169. When properly commanded, the microprocessor 168 can control the input conditioning section 120, AC section 112, and OHMS section 113, to selectively switch, scale, attenuate, rectify, and filter measured signals, before being applied to the input of an A/D converter 106, which will repeatedly perform analog-to-digital conversions and develop output data indicative of the magnitude of the instant measured signal. The microprocessor 168 can from time to time read output data of the converter 106 and send same to the display controller 167, which will cause the data to be indicated on the display 40 in a digital format. The invention resides in the addition of a color memory 136, wherein data symbolizing a selected color may be stored, and color control 50 for illuminating the display 40 in the selected color. It is contemplated that the color of the display 40 may be controlled in accordance with certain of the following operating modes:

a. Local/remote mode: The multimeter may be set either to its local mode, e.g., by actuating the LOCAL key 118j on the front panel, wherein all commands are entered via the keyboard 117 and the remote control 169 is disabled, or to its remote mode wherein all commands are sent via the remote control 169 and the keyboard 117 is disabled. When in its local mode, the microprocessor 168 will send data to the color memory 136 commanding the color control 50 to illuminate the display 40 in a first color (e.g., green); when in its remote mode, the microprocessor 168 will send different data to the color memory 136 commanding that the display 40 be illuminated in a second color (e.g., red), so that an operator may readily distinguish the two modes.

b. Normal/offset mode: The multimeter may be set to its offset mode, e.g., by actuating the OFFS key 118p on the front panel, wherein a numeric constant (an offset) is stored in the microprocessor's memory, to calculate and display the difference between a measured value and the offset; when in its normal mode, the multimeter displays true measured values. To indicate in which mode the multimeter currently operates, the microprocessor 168 will send data to the color memory 136 commanding that the display 40 be illuminated in a first color when in its normal mode, and in a second color when in its offset mode.

c. Standard/percent mode: The multimeter may be set to its percent mode, e.g., by actuating the '%' key 118r on the front panel, wherein a percent deviation of a measured value from a value stored in the microprocessor's memory (reference value) is calculated and displayed; when in its standard mode, true measured values are displayed. To indicate in which mode the multimeter currently operates, the microprocessor 168 will send data to the color memory 136 commanding that the display 40 be illuminated in a first color for the standard mode, and in a second color for the percent mode.

d. LAH/standard mode: The multimeter may be set to its LAH (Low, Average, High) mode, e.g., by actuating the LAH key 118s on the front panel, wherein the multimeter will store the most positive and most negative measured values, calculate the average measured value, and count the number of measurements during the LAH cycle; when in its standard mode, true measured values are displayed. To indicate whether the multimeter currently operates in the standard or LAH mode, the microprocessor 168 will send data to the color memory 136 commanding that the display 40 be illuminated in a first color for the standard mode, and in a second color for the LAH mode.

Figure 88:
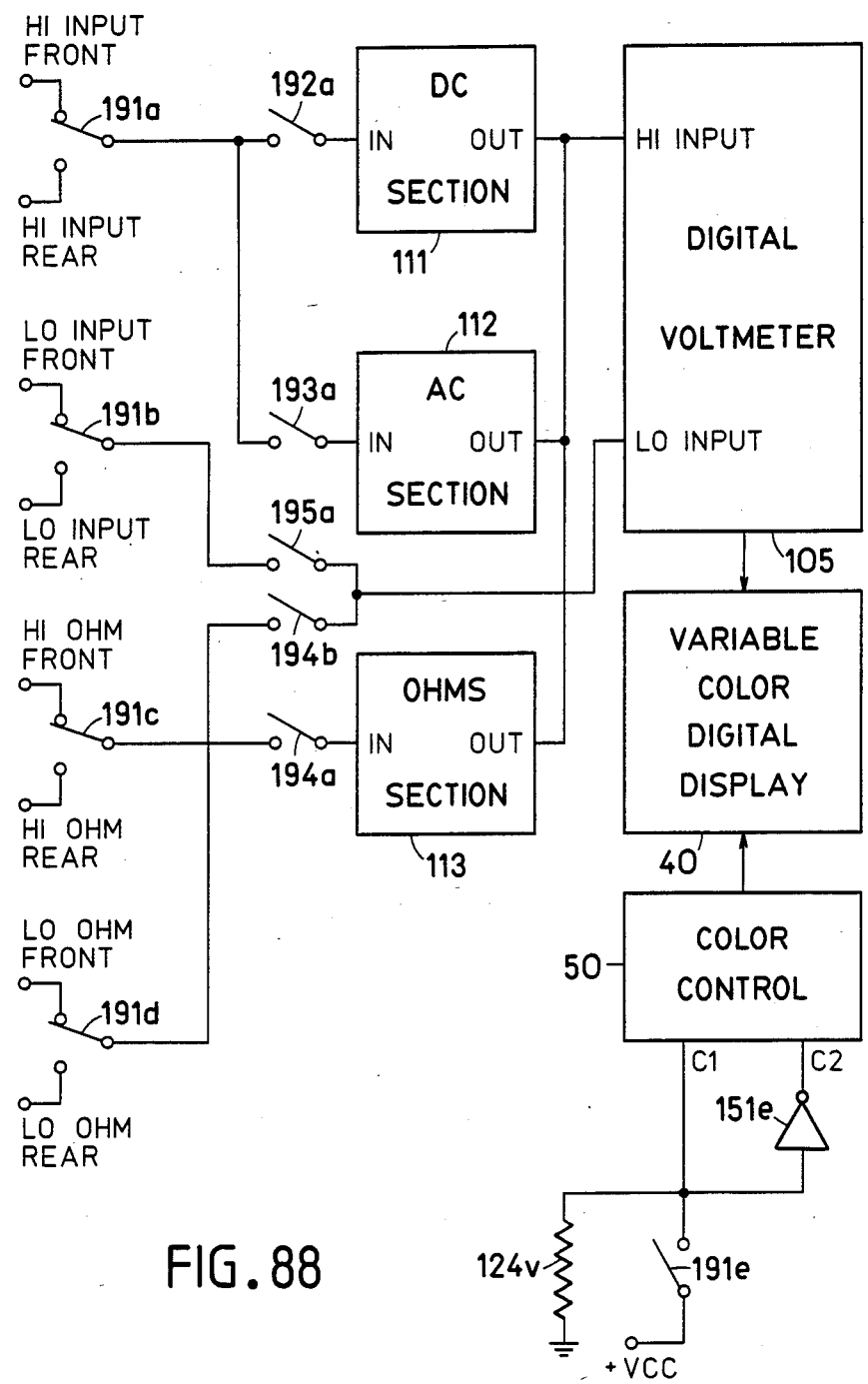
FIG. 88 is an expanded block diagram of a variable color digital multimeter for indicating front and rear measurements in different colors.

In FIG. 88 is shown an expanded block diagram of a digital multimeter with a DC section 111 for processing DC signals, AC section 112 for processing AC signals, and OHMS section 113 for performing resistance measurements, as will be more fully explained later. The multimeter includes input terminals HI INPUT 116a, LO INPUT 116b, HI OHM 116c, LO OHM 116d on the front panel shown in FIG. 86, and like input terminals on the rear panel (not shown), which may be selectively connected to the input of a digital voltmeter 105. To select between the front and rear measurements, the FRONT key 118k may be actuated, which will toggle a front/rear relay 191 between its energized and disenergized condition. To facilitate the illustration, a convention was adopted that a particular relay is designated in the drawings by a certain numeral and its associated contacts are designated by same numeral with character 'a', 'b', etc, appended. By way of an example, the relay 191 has contacts 191a, 191b, 191c, 191d, 191e. When the relay 191 is not energized, its contacts 191a to 191e are in the positions as illustrated, thereby making available the front input terminals for connection to the input of the digital voltmeter 105. When the relay 191 is energized, its contacts 191a to 191e will switch to their other positions, respectively, thereby moving available the rear input terminals for connection to the input of the digital voltmeter 105. The invention resides in the addition of the relay contact 191e, associated with the contacts 191a to 191d, such that the front and rear measurements are indicated in a digital format and in respectively different colors. When the measurements via the front input terminals are performed, as illustrated, the relay contact 191e is open and the color control input C1 is pulled to a low logic level by a suitable pull-down resistor 124v, thereby forcing, via an inverter 151e, the color control input C2 to rise to a high logic level, to thereby cause the display 40 to be illuminated in the color C2 (e.g., red). When the measurements via the rear input terminals are performed, by causing the relay 191 to be energized to switch its contacts 191a to 191e to their other positions, respectively, the contact 191e will be closed to apply a logic high level voltage from the source +VCC to the color control input C1, and simultaneously, to force, via the inverter 151e, the color control input C2 to a low logic level, to thereby cause the display 40 to be illuminated in the color C1 (e.g., green).

Figure 89:
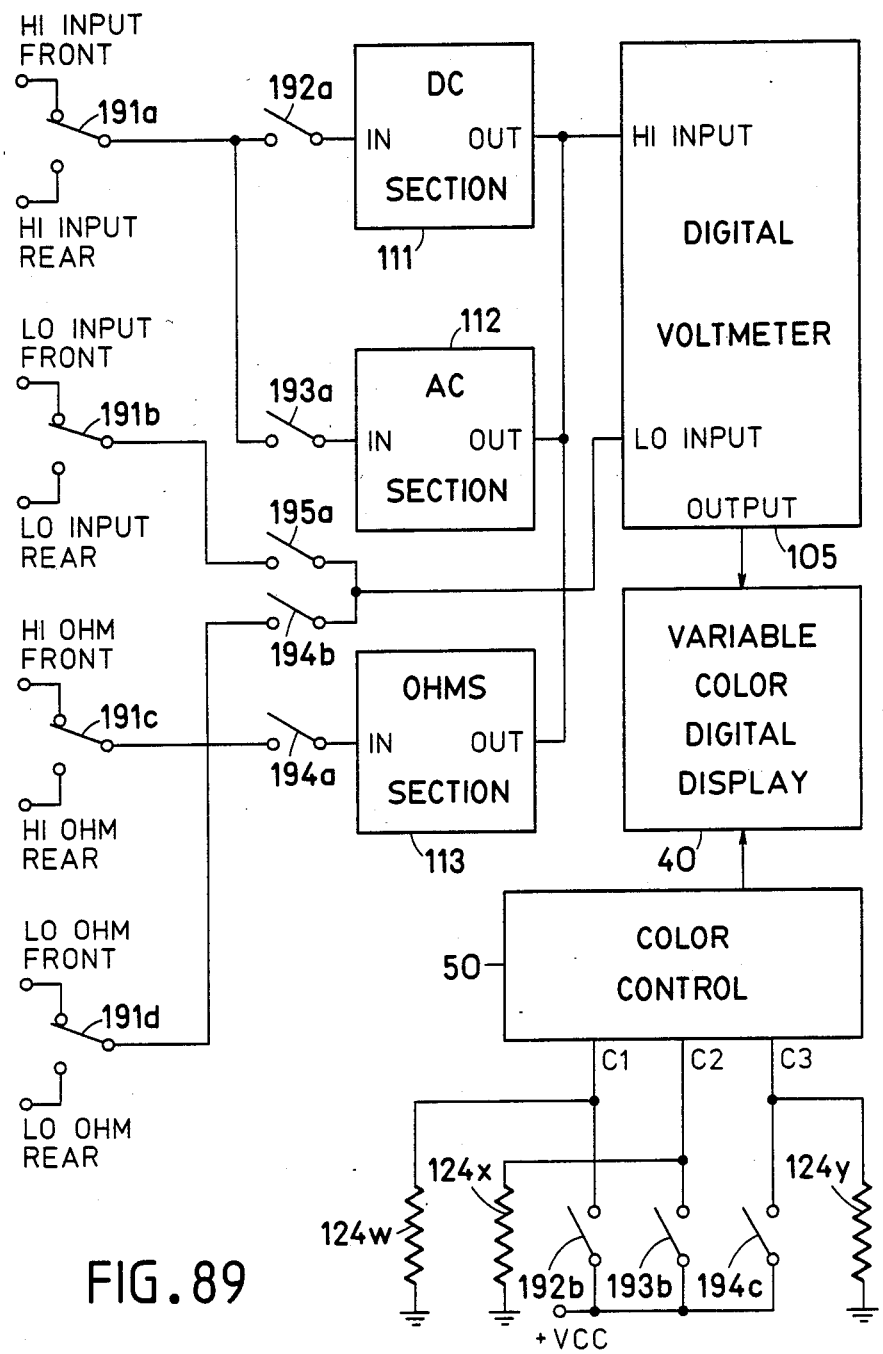
FIG. 89 is an expanded block diagram of a variable color digital multimeter for indicating DC, AC, and OHMS measurements in respectively different colors.

In FIG. 89 is shown a like block diagram of a digital multimeter for selectively performing DC, AC, and OHMS measurements and for indicating measured values in a digital format and in respectively different colors. To perform DC measurements, the DC relay 192 is energized, e.g., by actuating the 'DC V' key 118a on the front panel of the multimeter, to connect the HI INPUT terminal, via the contact 191a and closed contact 192a, and via the DC section 111, to the HI input of the digital voltmeter 105. Simultaneously, the LO relay 195 is energized to connect the LO INPUT terminal, via the contact 191b and closed contact 195a, to the LO input of the digital voltmeter 105. Measured DC values of the input signal will be indicated on the display 40 in a digital format, in a manner well understood by those skilled in the art. The invention resides in the provision of a relay contact 191b, associated with the contact 192a, to apply a high logic level voltage to the color control input C1, to cause the display 40 to illuminate in the color C1 (e.g., red).

To perform AC measurements, the AC relay 193 is energized, e.g., by actuating the 'AC V' key 118b on the multimeter's front panel, to connect the HI INPUT terminal, via the contact 191a and closed contact 193a, and via the AC section 112, to the HI input of the digital voltmeter 105. Simultaneously, the LO relay 195 is energized to connect the LO INPUT terminal to the LO input of the digital voltmeter 105. Measured AC values of the input signal will be indicated on the display 40 in a digital format, in a manner well understood. The relay contact 193b, associated with the contact 193a, will close when the relay 193 is energized, to apply a high logic level voltage to the color control input C2, to cause the display 40 to illuminate in the color C2 (e.g., yellow).

To perform OHMS measurements, the OHMS relay 124 is energized, e.g., by actuating the 'OHMS' key 118c on the multimeter's front panel, to connect the HI OHM terminal, via the closed contact 194a, and via the OHMS section 113, to the HI input of the digital voltmeter 105. The LO OHM terminal is connected, via the closed contact 194b, to the LO input of the digital voltmeter 105. Measured resistance values will be indicated on the display 40 in a digital format, in a manner well known. The relay contact 194c, associated with the contacts 194a, 194b, will close when the relay 194 is energized, to apply a high logic level voltage to the color control input C3, to cause the display 40 to illuminate in the color C3 (e.g., green).

Figure 90:
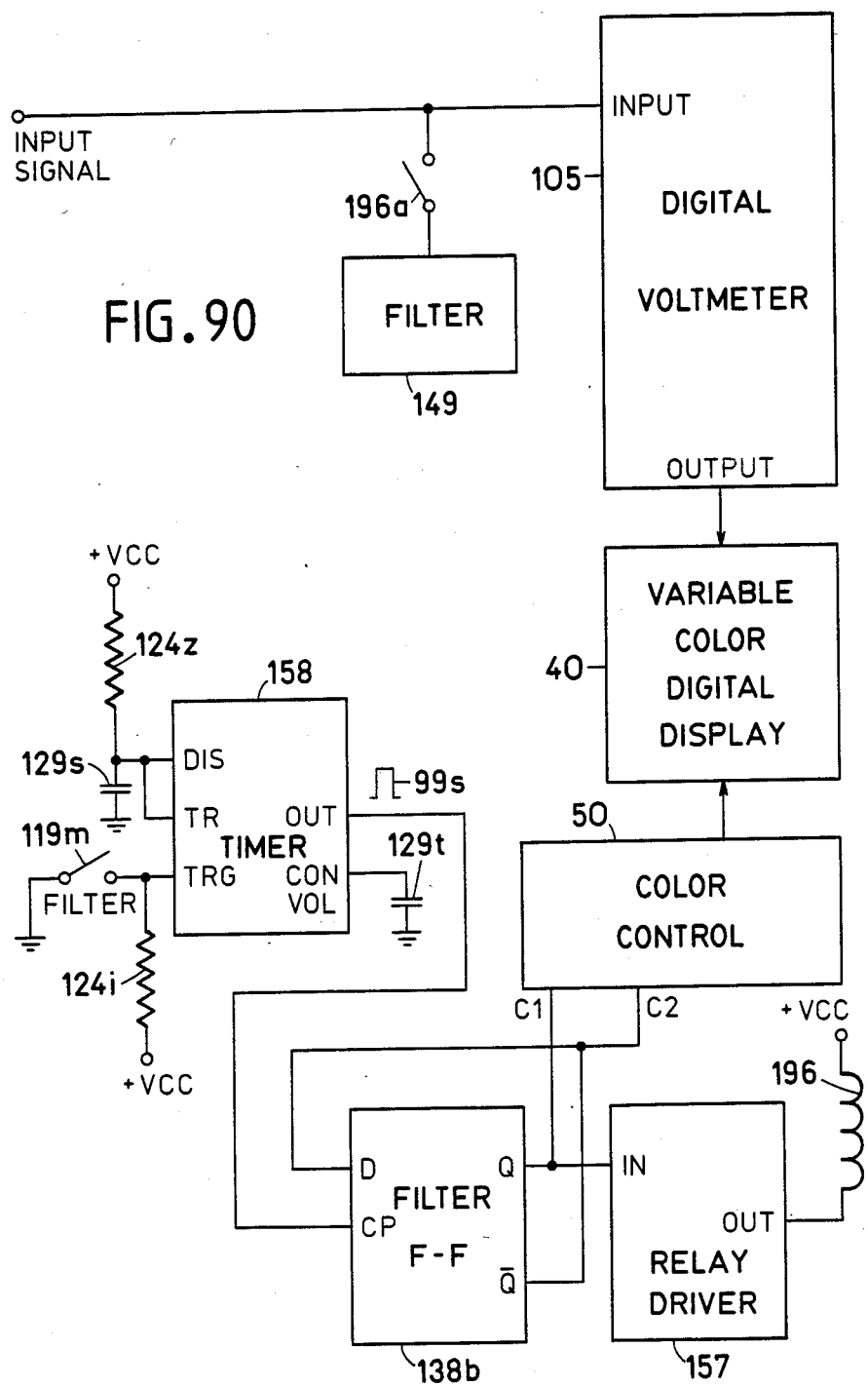
FIG. 90 is an expanded block diagram of a variable color digital multimeter for indicating measurements with filter and without filter in different colors.

The digital voltmeter shown in FIG. 90 may be set to its filter mode wherein the measured signal is filtered to remove high frequency noise. The invention resides in the addition of a filter flip-flop 138b for activating the color control circuit 50 to illuminate the display 40 in the color C1 for the filter mode turned on and in the color C2 for the filter mode turned off. The filter mode may be turned on and off by actuating the FILTER key 118m, to toggle the filter flip-flop 138b. When the key 118m is actuated, its associated keyswitch 119m will momentarily close, to connect a low logic level to the trigger input TRG of a timer 158, which is normally tied to a high logic level via its pull-up resistor 124i, to produce at the timer's output OUT a relatively short positive going pulse 99s, to trigger the filter flip-flop 138b to its opposite state. The width of the pulse 99s may be set by selecting suitable values of the resistor 124z and capacitor 129s, to eliminate the problem of possible bouncing of the keyswitch 119m. When the flip-flop 138b is in its set condition, its output Q, which is connected to the input of a relay driver 157, will rise to a high logic level, to activate the latter, to energize the filter relay 196. The associated relay contact 196a will close to connect the filter circuit 149 to the input of the digital voltmeter 105. The outputs Q and $\overline{Q}$ of the flip-flop 138b are connected to the color control inputs C1, C2, respectively, to cause the display 40 to illuminate in a color in accordance with the condition of the flip-flop 138b.

In brief summary, the invention describes a method and a device for simultaneously displaying values of two different measured quantities on a single variable color digital display device, by causing the value of the first quantity to be indicated in a digital format, and by controlling the color of the display in accordance with the value of the second quantity.

A digital multimeter with variable color digital display was disclosed which can indicate values of the measured quantities in a digital format and in a color selectively variable in accordance with the measurement quantity, method, units, mode, function, range, location, modifier, control, measurement limits, and the like.

In another embodiment, a digital voltmeter with variable color digital display was disclosed which can indicate RMS value of the measured AC voltage in digital format and in a color variable in accordance with the crest factor of the measured waveform, thereby simultaneously indicating its magnitude and shape.

All matter herein described and illustrated in the accompanying drawings should be interpreted as illustrative and not in a limiting sense. It would be obvious that numerous modifications can be made in the construction of the preferred embodiments shown herein, without departing from the spirit of the invention as defined in the appended claims. It is contemplated that the principles of the invention may be also applied to numerous diverse types of display devices, such are liquid crystal, plasma devices, and the like.

CORRELATION TABLE

This is a correlation table of reference characters used in the drawings herein, their descriptions, and examples of commercially available parts.

| # | DESCRIPTION | EXAMPLE |
|---|---|---|
| 1 | display segment | |
| 2 | red LED | |
| 3 | green LED | |
| 4 | blue LED | |
| 5 | red bus | |
| 6 | green bus | |
| 7 | blue bus | |
| 10 | device developing electric signals | |
| 11 | analog voltage source | |
| 12 | digital device | |
| 15 | segment body | |
| 16 | light scattering material | |
| 20 | decoder | |
| 21 | digital decoder driver | |
| 22 | 7-segment display decoder driver | |
| 23 | common cathode 7-segment decoder | 74LS49 |
| 24 | common anode 7-segment decoder | 74LS47 |
| 30 | monochromatic digital display | |
| 40 | variable color digital display | |
| 41 | multiplexed variable color display | |
| 42 | variable color 7-segment display (2 LEDs) | |
| 43 | variable color 7-segment display (3 LEDs) | |
| 46 | one variable color display character (2 LEDs) | |
| 47 | one variable color display character (3 LEDs) | |
| 48 | 3½ digit variable color display | |
| 49 | 6½ digit variable color 7-segment display | |
| 50 | color control | |
| 51 | step variable color control | |
| 52 | color control (2 LEDs) | |
| 53 | color control (3 LEDs) | |
| 55 | color converter | |
| 56 | continuously variable color converter | |
| 57 | 2-primary color converter | |
| 58 | 3-primary color converter | |
| 59 | single color converter | |
| 60 | 2-input OR gate | 74HC32 |
| 61 | 4-input OR gate | 4072 |
| 62 | non-inverting buffer | 74LS244 |
| 63 | inverting buffer | 74LS240 |
| 64 | inverter | part of 74LS240,4 |
| 65 | inverter | 74HC04 |

-continued

| # | DESCRIPTION | EXAMPLE |
|---|---|---|
| 66 | 2-input AND gate | 74HC08 |
| 67 | priority encoder | 74HC147 |
| 68 | 3-to-8 line decoder | 74HC138 |
| 69 | logic circuit | |
| 71 | 8-bit counter | 74F579 |
| 73 | D type flip-flop | 74HC74 |
| 74 | A/D converter | |
| 75 | 8-bit A/D converter | AD570 |
| 76 | memory | |
| 77 | 2k × 8 bit PROM | 2716 |
| 80 | scaling circuit | |
| 81 | op amp | LM741 |
| 82 | analog comparator | LM339 |
| 85 | signal converter | |
| 90 | resistor | |
| 91 | resistor | |
| 92 | potentiometer | |
| 93 | capacitor | |
| 99 | pulse | |
| 101 | multimeter | |
| 102 | multimeter with multiplexed outputs | |
| 103 | digital multimeter | |
| 105 | digital voltmeter | |
| 106 | A/D converter | |
| 107 | Teledyne DVM chip | TSC8750 |
| 108 | Teledyne DVM chip | TSC7107 |
| 109 | Intersil DVM chip | ILS7107 |
| 111 | DC section | |
| 112 | AC section | |
| 113 | OHMS section | |
| 115 | control section | |
| 116 | measuring terminal | |
| 117 | keyboard | |
| 118 | key | |
| 119 | keyswitch | |
| 120 | input conditioning | |
| 121 | selector | |
| 123 | rotary switch | |
| 124 | resistor | |
| 125 | resistor | |
| 126 | precision resistor | |
| 127 | potentiometer | |
| 128 | signal diode | 1N4148 |
| 129 | capacitor | |
| 131 | memory | |
| 132 | 8-bit wide memory | |
| 134 | 8-bit latch | 74HC273 |
| 135 | error memory | |
| 136 | color memory | |
| 138 | D-type flip-flop | 74HC74 |
| 141 | comparator | |
| 142 | 4-bit digital comparator | 74HC85 |
| 143 | 8-bit digital comparator | |
| 144 | memory & comparator | |
| 145 | registered comparator | 74F524 |
| 146 | 8-channel digital multiplexer | 74HC151 |
| 147 | analog multiplexer | 4051 |
| 148 | clock | |
| 149 | filter | |
| 150 | logic circuit | |
| 151 | inverter | 74HC04 |
| 152 | 2-input OR gate | 74HC32 |
| 154 | 8-input OR/NOR gate | 74HC4078 |
| 155 | 2-input AND gate | 74HC08 |
| 156 | 3-input AND gate | 74HC11 |
| 157 | relay driver | 1416 |
| 158 | timer | NE555 |
| 159 | op amp | LM741 |
| 161 | counter | |
| 162 | 4-bit binary counter | 74HC161 |
| 163 | 8-bit binary counter | 74F579 |
| 164 | 3-decade counter | 14553 |
| 165 | decoder | |
| 166 | 1-to-8 lines decoder | 74HC138 |
| 167 | display controller | ICM7218A |
| 168 | microprocessor | 8085 |
| 169 | remote control | |
| 172 | temperature transducer | |
| 173 | pressure transducer | |
| 174 | physiological transducer | |

-continued

| # | DESCRIPTION | EXAMPLE |
|---|---|---|
| 176 | SenSym pressure transducer | LX1802AN |
| 177 | Kelvin temperature transducer | |
| 178 | Celsius temperature transducer | LM35 |
| 179 | Fahrenheit temperature transducer | LM34 |
| 181 | RMS to DC converter | |
| 182 | RMS converter chip | AD536A |
| 183 | crest factor converter | |
| 185 | peak detector | |
| 186 | peak detector chip | PKD-01 |
| 187 | ratio producing circuit | |
| 188 | precision divider chip | AD535 |
| 191 | front/rear relay | JDT21 |
| 192 | DC section relay | JDT7 |
| 193 | AC section relay | JDT7 |
| 194 | OHMS section relay | JDT15 |
| 195 | LO input relay | JWD-107 |
| 196 | filter relay | JWD-107 |
| 199 | pulse | |

The examples of commercially available components should be considered as merely illustrative. It will be appreciated that other components may be readily and effectively used. The integrated circuits used in the description of the invention are manufactured by several well known companies, such are National Semiconductor Incorporated, Motorola Semiconductor Products Inc., Fairchild Camera and Instrument Corporation, Texas Instruments Incorporated, Intel Corporation, Analog Devices, Inc., Teledyne Semiconductor, Intersil, Inc., Precision Monolithics Incorporated, etc.

TABLE 1

| Input Voltage (Volts) | PROM Address (Hex) | DATA 'Red' PROM (Hex) | PORTIONS red | PORTIONS green |
|---|---|---|---|---|
| 0.0 | 00 | 00 | 0.0 | 1.0 |
| 0.039 | 01 | 00 | 0.0 | 1.0 |
| 0.078 | 02 | 00 | 0.0 | 1.0 |
| 0.117 | 03 | 00 | 0.0 | 1.0 |
| 0.156 | 04 | 00 | 0.0 | 1.0 |
| 0.195 | 05 | 00 | 0.0 | 1.0 |
| 0.234 | 06 | 00 | 0.0 | 1.0 |
| 0.273 | 07 | 00 | 0.0 | 1.0 |
| 0.312 | 08 | 00 | 0.0 | 1.0 |
| 0.352 | 09 | 00 | 0.0 | 1.0 |
| 0.391 | 0A | 00 | 0.0 | 1.0 |
| 0.430 | 0B | 00 | 0.0 | 1.0 |
| 0.469 | 0C | 00 | 0.0 | 1.0 |
| 0.508 | 0D | 00 | 0.0 | 1.0 |
| 0.547 | 0E | 00 | 0.0 | 1.0 |
| 0.586 | 0F | 00 | 0.0 | 1.0 |
| 0.625 | 10 | 40 | 0.25 | 0.75 |
| 0.664 | 11 | 40 | 0.25 | 0.75 |
| 0.703 | 12 | 40 | 0.25 | 0.75 |
| 0.742 | 13 | 40 | 0.25 | 0.75 |
| 0.781 | 14 | 40 | 0.25 | 0.75 |
| 0.820 | 15 | 40 | 0.25 | 0.75 |
| 0.859 | 16 | 40 | 0.25 | 0.75 |
| 0.898 | 17 | 40 | 0.25 | 0.75 |
| 0.937 | 18 | 40 | 0.25 | 0.75 |
| 0.977 | 19 | 40 | 0.25 | 0.75 |
| 1.016 | 1A | 40 | 0.25 | 0.75 |
| 1.055 | 1B | 40 | 0.25 | 0.75 |
| 1.094 | 1C | 40 | 0.25 | 0.75 |
| 1.133 | 1D | 40 | 0.25 | 0.75 |
| 1.172 | 1E | 40 | 0.25 | 0.75 |
| 1.211 | 1F | 40 | 0.25 | 0.75 |
| 1.250 | 20 | 80 | 0.5 | 0.5 |
| 1.289 | 21 | 80 | 0.5 | 0.5 |
| 1.328 | 22 | 80 | 0.5 | 0.5 |
| 1.367 | 23 | 80 | 0.5 | 0.5 |
| 1.406 | 24 | 80 | 0.5 | 0.5 |
| 1.445 | 25 | 80 | 0.5 | 0.5 |
| 1.484 | 26 | 80 | 0.5 | 0.5 |
| 1.523 | 27 | 80 | 0.5 | 0.5 |
| 1.562 | 28 | 80 | 0.5 | 0.5 |
| 1.602 | 29 | 80 | 0.5 | 0.5 |
| 1.641 | 2A | 80 | 0.5 | 0.5 |
| 1.680 | 2B | 80 | 0.5 | 0.5 |
| 1.719 | 2C | 80 | 0.5 | 0.5 |
| 1.758 | 2D | 80 | 0.5 | 0.5 |
| 1.797 | 2E | 80 | 0.5 | 0.5 |
| 1.836 | 2F | 80 | 0.5 | 0.5 |
| 1.875 | 30 | C0 | 0.75 | 0.25 |
| 1.914 | 31 | C0 | 0.75 | 0.25 |
| 1.953 | 32 | C0 | 0.75 | 0.25 |
| 1.992 | 33 | C0 | 0.75 | 0.25 |
| 2.031 | 34 | C0 | 0.75 | 0.25 |
| 2.070 | 35 | C0 | 0.75 | 0.25 |
| 2.109 | 36 | C0 | 0.75 | 0.25 |
| 2.148 | 37 | C0 | 0.75 | 0.25 |
| 2.187 | 38 | C0 | 0.75 | 0.25 |
| 2.227 | 39 | C0 | 0.75 | 0.25 |
| 2.266 | 3A | C0 | 0.75 | 0.25 |
| 2.305 | 3B | C0 | 0.75 | 0.25 |
| 2.344 | 3C | C0 | 0.75 | 0.25 |
| 2.389 | 3D | C0 | 0.75 | 0.25 |
| 2.422 | 3E | C0 | 0.75 | 0.25 |
| 2.461 | 3F | C0 | 0.75 | 0.25 |
| 2.500 | 40 | FF | 1.0 | 0.0 |
| 2.539 | 41 | FF | 1.0 | 0.0 |
| 2.578 | 42 | FF | 1.0 | 0.0 |
| 2.617 | 43 | FF | 1.0 | 0.0 |
| 2.656 | 44 | FF | 1.0 | 0.0 |
| 2.695 | 45 | FF | 1.0 | 0.0 |
| 2.734 | 46 | FF | 1.0 | 0.0 |
| 2.773 | 47 | FF | 1.0 | 0.0 |
| 2.812 | 48 | FF | 1.0 | 0.0 |
| 2.852 | 49 | FF | 1.0 | 0.0 |
| 2.891 | 4A | FF | 1.0 | 0.0 |
| 2.930 | 4B | FF | 1.0 | 0.0 |
| 2.969 | 4C | FF | 1.0 | 0.0 |
| 3.008 | 4D | FF | 1.0 | 0.0 |
| 3.047 | 4E | FF | 1.0 | 0.0 |
| 3.086 | 4F | FF | 1.0 | 0.0 |
| 3.125 | 50 | 00 | 0.0 | 1.0 |
| 3.164 | 51 | 00 | 0.0 | 1.0 |
| 3.203 | 52 | 00 | 0.0 | 1.0 |
| 3.242 | 53 | 00 | 0.0 | 1.0 |
| 3.281 | 54 | 00 | 0.0 | 1.0 |
| 3.320 | 55 | 00 | 0.0 | 1.0 |
| 3.359 | 56 | 00 | 0.0 | 1.0 |
| 3.398 | 57 | 00 | 0.0 | 1.0 |
| 3.437 | 58 | 00 | 0.0 | 1.0 |
| 3.477 | 59 | 00 | 0.0 | 1.0 |
| 3.516 | 5A | 00 | 0.0 | 1.0 |
| 3.555 | 5B | 00 | 0.0 | 1.0 |
| 3.594 | 5C | 00 | 0.0 | 1.0 |
| 3.633 | 5D | 00 | 0.0 | 1.0 |
| 3.672 | 5E | 00 | 0.0 | 1.0 |
| 3.711 | 5F | 00 | 0.0 | 1.0 |
| 3.750 | 60 | 40 | 0.25 | 0.75 |
| 3.789 | 61 | 40 | 0.25 | 0.75 |
| 3.828 | 62 | 40 | 0.25 | 0.75 |
| 3.867 | 63 | 40 | 0.25 | 0.75 |
| 3.906 | 64 | 40 | 0.25 | 0.75 |
| 3.945 | 65 | 40 | 0.25 | 0.75 |
| 3.984 | 66 | 40 | 0.25 | 0.75 |
| 4.023 | 67 | 40 | 0.25 | 0.75 |
| 4.062 | 68 | 40 | 0.25 | 0.75 |
| 4.102 | 69 | 40 | 0.25 | 0.75 |
| 4.141 | 6A | 40 | 0.25 | 0.75 |
| 4.178 | 6B | 40 | 0.25 | 0.75 |
| 4.219 | 6C | 40 | 0.25 | 0.75 |
| 4.258 | 6D | 40 | 0.25 | 0.75 |
| 4.299 | 6E | 40 | 0.25 | 0.75 |
| 4.336 | 6F | 40 | 0.25 | 0.75 |
| 4.375 | 70 | 80 | 0.5 | 0.5 |
| 4.414 | 71 | 80 | 0.5 | 0.5 |
| 4.453 | 72 | 80 | 0.5 | 0.5 |
| 4.492 | 73 | 80 | 0.5 | 0.5 |

TABLE 1-continued

| Input Voltage (Volts) | PROM Address (Hex) | DATA 'Red' PROM (Hex) | PORTIONS red | green |
|---|---|---|---|---|
| 4.531 | 74 | 80 | 0.5 | 0.5 |
| 4.570 | 75 | 80 | 0.5 | 0.5 |
| 4.609 | 76 | 80 | 0.5 | 0.5 |
| 4.648 | 77 | 80 | 0.5 | 0.5 |
| 4.687 | 78 | 80 | 0.5 | 0.5 |
| 4.727 | 79 | 80 | 0.5 | 0.5 |
| 4.766 | 7A | 80 | 0.5 | 0.5 |
| 4.805 | 7B | 80 | 0.5 | 0.5 |
| 4.844 | 7C | 80 | 0.5 | 0.5 |
| 4.883 | 7D | 80 | 0.5 | 0.5 |
| 4.922 | 7E | 80 | 0.5 | 0.5 |
| 4.961 | 7F | 80 | 0.5 | 0.5 |
| 5.000 | 80 | C0 | 0.75 | 0.25 |
| 5.039 | 81 | C0 | 0.75 | 0.25 |
| 5.078 | 82 | C0 | 0.75 | 0.25 |
| 5.117 | 83 | C0 | 0.75 | 0.25 |
| 5.156 | 84 | C0 | 0.75 | 0.25 |
| 5.195 | 85 | C0 | 0.75 | 0.25 |
| 5.234 | 86 | C0 | 0.75 | 0.25 |
| 5.273 | 87 | C0 | 0.75 | 0.25 |
| 5.312 | 88 | C0 | 0.75 | 0.25 |
| 5.352 | 89 | C0 | 0.75 | 0.25 |
| 5.391 | 8A | C0 | 0.75 | 0.25 |
| 5.430 | 8B | C0 | 0.75 | 0.25 |
| 5.469 | 8C | C0 | 0.75 | 0.25 |
| 5.508 | 8D | C0 | 0.75 | 0.25 |
| 5.547 | 8E | C0 | 0.75 | 0.25 |
| 5.586 | 8F | C0 | 0.75 | 0.25 |
| 5.625 | 90 | FF | 1.0 | 0.0 |
| 5.664 | 91 | FF | 1.0 | 0.0 |
| 5.703 | 92 | FF | 1.0 | 0.0 |
| 5.742 | 93 | FF | 1.0 | 0.0 |
| 5.781 | 94 | FF | 1.0 | 0.0 |
| 5.820 | 95 | FF | 1.0 | 0.0 |
| 5.859 | 96 | FF | 1.0 | 0.0 |
| 5.898 | 97 | FF | 1.0 | 0.0 |
| 5.937 | 98 | FF | 1.0 | 0.0 |
| 5.977 | 99 | FF | 1.0 | 0.0 |
| 6.016 | 9A | FF | 1.0 | 0.0 |
| 6.055 | 9B | FF | 1.0 | 0.0 |
| 6.094 | 9C | FF | 1.0 | 0.0 |
| 6.133 | 9D | FF | 1.0 | 0.0 |
| 6.172 | 9E | FF | 1.0 | 0.0 |
| 6.211 | 9F | FF | 1.0 | 0.0 |
| 6.250 | A0 | 00 | 0.0 | 1.0 |
| 6.289 | A1 | 00 | 0.0 | 1.0 |
| 6.328 | A2 | 00 | 0.0 | 1.0 |
| 6.367 | A3 | 00 | 0.0 | 1.0 |
| 6.406 | A4 | 00 | 0.0 | 1.0 |
| 6.445 | A5 | 00 | 0.0 | 1.0 |
| 6.484 | A6 | 00 | 0.0 | 1.0 |
| 6.524 | A7 | 00 | 0.0 | 1.0 |
| 6.562 | A8 | 00 | 0.0 | 1.0 |
| 6.602 | A9 | 00 | 0.0 | 1.0 |
| 6.641 | AA | 00 | 0.0 | 1.0 |
| 6.680 | AB | 00 | 0.0 | 1.0 |
| 6.719 | AC | 00 | 0.0 | 1.0 |
| 6.758 | AD | 00 | 0.0 | 1.0 |
| 6.797 | AE | 00 | 0.0 | 1.0 |
| 6.836 | AF | 00 | 0.0 | 1.0 |
| 6.875 | B0 | 40 | 0.25 | 0.75 |
| 6.914 | B1 | 40 | 0.25 | 0.75 |
| 6.953 | B2 | 40 | 0.25 | 0.75 |
| 6.992 | B3 | 40 | 0.25 | 0.75 |
| 7.031 | B4 | 40 | 0.25 | 0.75 |
| 7.070 | B5 | 40 | 0.25 | 0.75 |
| 7.109 | B6 | 40 | 0.25 | 0.75 |
| 7.148 | B7 | 40 | 0.25 | 0.75 |
| 7.187 | B8 | 40 | 0.25 | 0.75 |
| 7.227 | B9 | 40 | 0.25 | 0.75 |
| 7.266 | BA | 40 | 0.25 | 0.75 |
| 7.305 | BB | 40 | 0.25 | 0.75 |
| 7.344 | BC | 40 | 0.25 | 0.75 |
| 7.383 | BD | 40 | 0.25 | 0.75 |
| 7.422 | BE | 40 | 0.25 | 0.75 |
| 7.461 | BF | 40 | 0.25 | 0.75 |
| 7.500 | C0 | 80 | 0.5 | 0.5 |
| 7.539 | C1 | 80 | 0.5 | 0.5 |
| 7.587 | C2 | 80 | 0.5 | 0.5 |
| 7.617 | C3 | 80 | 0.5 | 0.5 |
| 7.656 | C4 | 80 | 0.5 | 0.5 |
| 7.695 | C5 | 80 | 0.5 | 0.5 |
| 7.734 | C6 | 80 | 0.5 | 0.5 |
| 7.773 | C7 | 80 | 0.5 | 0.5 |
| 7.812 | C8 | 80 | 0.5 | 0.5 |
| 7.852 | C9 | 80 | 0.5 | 0.5 |
| 7.891 | CA | 80 | 0.5 | 0.5 |
| 7.930 | CB | 80 | 0.5 | 0.5 |
| 7.969 | CC | 80 | 0.5 | 0.5 |
| 8.008 | CD | 80 | 0.5 | 0.5 |
| 8.047 | CE | 80 | 0.5 | 0.5 |
| 8.086 | CF | 80 | 0.5 | 0.5 |
| 8.125 | D0 | C0 | 0.75 | 0.25 |
| 8.164 | D1 | C0 | 0.75 | 0.25 |
| 8.203 | D2 | C0 | 0.75 | 0.25 |
| 8.242 | D3 | C0 | 0.75 | 0.25 |
| 8.281 | D4 | C0 | 0.75 | 0.25 |
| 8.320 | D5 | C0 | 0.75 | 0.25 |
| 8.359 | D6 | C0 | 0.75 | 0.25 |
| 8.398 | D7 | C0 | 0.75 | 0.25 |
| 8.437 | D8 | C0 | 0.75 | 0.25 |
| 8.477 | D9 | C0 | 0.75 | 0.25 |
| 8.516 | DA | C0 | 0.75 | 0.25 |
| 8.555 | DB | C0 | 0.75 | 0.25 |
| 8.594 | DC | C0 | 0.75 | 0.25 |
| 8.633 | DD | C0 | 0.75 | 0.25 |
| 8.672 | DE | C0 | 0.75 | 0.25 |
| 8.711 | DF | C0 | 0.75 | 0.25 |
| 8.750 | E0 | FF | 1.0 | 0.0 |
| 8.789 | E1 | FF | 1.0 | 0.0 |
| 8.828 | E2 | FF | 1.0 | 0.0 |
| 8.867 | E3 | FF | 1.0 | 0.0 |
| 8.906 | E4 | FF | 1.0 | 0.0 |
| 8.945 | E5 | FF | 1.0 | 0.0 |
| 8.984 | E6 | FF | 1.0 | 0.0 |
| 9.023 | E7 | FF | 1.0 | 0.0 |
| 9.062 | E8 | FF | 1.0 | 0.0 |
| 9.102 | E9 | FF | 1.0 | 0.0 |
| 9.141 | EA | FF | 1.0 | 0.0 |
| 9.180 | EB | FF | 1.0 | 0.0 |
| 9.219 | EC | FF | 1.0 | 0.0 |
| 9.258 | ED | FF | 1.0 | 0.0 |
| 9.299 | EE | FF | 1.0 | 0.0 |
| 9.336 | EF | FF | 1.0 | 0.0 |
| 9.375 | F0 | 00 | 0.0 | 1.0 |
| 9.414 | F1 | 00 | 0.0 | 1.0 |
| 9.453 | F2 | 00 | 0.0 | 1.0 |
| 9.492 | F3 | 00 | 0.0 | 1.0 |
| 9.531 | F4 | 00 | 0.0 | 1.0 |
| 9.570 | F5 | 00 | 0.0 | 1.0 |
| 9.609 | F6 | 00 | 0.0 | 1.0 |
| 9.648 | F7 | 00 | 0.0 | 1.0 |
| 9.687 | F8 | 00 | 0.0 | 1.0 |
| 9.727 | F9 | 00 | 0.0 | 1.0 |
| 9.766 | FA | 00 | 0.0 | 1.0 |
| 9.805 | FB | 00 | 0.0 | 1.0 |
| 9.844 | FC | 00 | 0.0 | 1.0 |
| 9.883 | FD | 00 | 0.0 | 1.0 |
| 9.922 | FE | 00 | 0.0 | 1.0 |
| 9.961 | FF | 00 | 0.0 | 1.0 |

TABLE 2

| Input Voltage (Volts) | PROM Address (Hex) | DATA 'Red' PROM (Hex) | 'Green' PROM (Hex) | 'Blue' PROM (Hex) | PORTIONS red | green | blue |
|---|---|---|---|---|---|---|---|
| 0.0 | 00 | FF | 00 | 00 | 1.0 | 0.0 | 0.0 |
| 0.039 | 01 | FE | 02 | 00 | 0.992 | 0.008 | 0.0 |
| 0.078 | 02 | FC | 04 | 00 | 0.984 | 0.016 | 0.0 |
| 0.117 | 03 | FA | 06 | 00 | 0.976 | 0.024 | 0.0 |
| 0.156 | 04 | F8 | 08 | 00 | 0.969 | 0.031 | 0.0 |

TABLE 2-continued

| Input Voltage (Volts) | PROM Address (Hex) | 'Red' PROM DATA (Hex) | 'Green' PROM DATA (Hex) | 'Blue' PROM DATA (Hex) | PORTIONS red | green | blue |
|---|---|---|---|---|---|---|---|
| 0.195 | 05 | F6 | 0A | 00 | 0.961 | 0.039 | 0.0 |
| 0.234 | 06 | F4 | 0C | 00 | 0.953 | 0.047 | 0.0 |
| 0.273 | 07 | F2 | 0E | 00 | 0.945 | 0.055 | 0.0 |
| 0.312 | 08 | F0 | 10 | 00 | 0.937 | 0.063 | 0.0 |
| 0.352 | 09 | EE | 12 | 00 | 0.930 | 0.070 | 0.0 |
| 0.391 | 0A | EC | 14 | 00 | 0.922 | 0.078 | 0.0 |
| 0.430 | 0B | EA | 16 | 00 | 0.914 | 0.086 | 0.0 |
| 0.469 | 0C | E8 | 18 | 00 | 0.906 | 0.094 | 0.0 |
| 0.508 | 0D | E6 | 1A | 00 | 0.899 | 0.101 | 0.0 |
| 0.547 | 0E | E4 | 1C | 00 | 0.891 | 0.109 | 0.0 |
| 0.586 | 0F | E2 | 1E | 00 | 0.883 | 0.117 | 0.0 |
| 0.625 | 10 | E0 | 20 | 00 | 0.875 | 0.125 | 0.0 |
| 0.664 | 11 | DE | 22 | 00 | 0.867 | 0.133 | 0.0 |
| 0.703 | 12 | DC | 24 | 00 | 0.859 | 0.141 | 0.0 |
| 0.742 | 13 | DA | 26 | 00 | 0.851 | 0.149 | 0.0 |
| 0.781 | 14 | D8 | 28 | 00 | 0.844 | 0.156 | 0.0 |
| 0.820 | 15 | D6 | 2A | 00 | 0.836 | 0.164 | 0.0 |
| 0.859 | 16 | D4 | 2C | 00 | 0.828 | 0.172 | 0.0 |
| 0.898 | 17 | D2 | 2E | 00 | 0.820 | 0.180 | 0.0 |
| 0.937 | 18 | D0 | 30 | 00 | 0.812 | 0.188 | 0.0 |
| 0.977 | 19 | CE | 32 | 00 | 0.804 | 0.196 | 0.0 |
| 1.016 | 1A | CC | 34 | 00 | 0.796 | 0.204 | 0.0 |
| 1.055 | 1B | CA | 36 | 00 | 0.788 | 0.212 | 0.0 |
| 1.094 | 1C | C8 | 38 | 00 | 0.781 | 0.219 | 0.0 |
| 1.133 | 1D | C6 | 3A | 00 | 0.773 | 0.227 | 0.0 |
| 1.172 | 1E | C4 | 3C | 00 | 0.766 | 0.234 | 0.0 |
| 1.211 | 1F | C2 | 3E | 00 | 0.758 | 0.242 | 0.0 |
| 1.250 | 20 | C0 | 40 | 00 | 0.75 | 0.25 | 0.0 |
| 1.289 | 21 | BE | 42 | 00 | 0.742 | 0.258 | 0.0 |
| 1.328 | 22 | BC | 44 | 00 | 0.734 | 0.266 | 0.0 |
| 1.367 | 23 | BA | 46 | 00 | 0.726 | 0.274 | 0.0 |
| 1.406 | 24 | B8 | 48 | 00 | 0.719 | 0.281 | 0.0 |
| 1.445 | 25 | B6 | 4A | 00 | 0.711 | 0.289 | 0.0 |
| 1.484 | 26 | B4 | 4C | 00 | 0.703 | 0.297 | 0.0 |
| 1.523 | 27 | B2 | 4E | 00 | 0.695 | 0.305 | 0.0 |
| 1.562 | 28 | B0 | 50 | 00 | 0.687 | 0.313 | 0.0 |
| 1.602 | 29 | AE | 52 | 00 | 0.680 | 0.320 | 0.0 |
| 1.641 | 2A | AC | 54 | 00 | 0.672 | 0.328 | 0.0 |
| 1.680 | 2B | AA | 56 | 00 | 0.664 | 0.336 | 0.0 |
| 1.719 | 2C | A8 | 58 | 00 | 0.656 | 0.344 | 0.0 |
| 1.758 | 2D | A6 | 5A | 00 | 0.648 | 0.352 | 0.0 |
| 1.797 | 2E | A4 | 5C | 00 | 0.641 | 0.359 | 0.0 |
| 1.836 | 2F | A2 | 5E | 00 | 0.633 | 0.367 | 0.0 |
| 1.875 | 30 | A0 | 60 | 00 | 0.625 | 0.375 | 0.0 |
| 1.914 | 31 | 9E | 62 | 00 | 0.613 | 0.383 | 0.0 |
| 1.953 | 32 | 9C | 64 | 00 | 0.609 | 0.391 | 0.0 |
| 1.992 | 33 | 9A | 66 | 00 | 0.602 | 0.398 | 0.0 |
| 2.031 | 34 | 98 | 68 | 00 | 0.594 | 0.406 | 0.0 |
| 2.070 | 35 | 96 | 6A | 00 | 0.586 | 0.414 | 0.0 |
| 2.109 | 36 | 94 | 6C | 00 | 0.578 | 0.422 | 0.0 |
| 2.148 | 37 | 92 | 6E | 00 | 0.570 | 0.430 | 0.0 |
| 2.187 | 38 | 90 | 70 | 00 | 0.562 | 0.438 | 0.0 |
| 2.227 | 39 | 8E | 72 | 00 | 0.554 | 0.446 | 0.0 |
| 2.266 | 3A | 8C | 74 | 00 | 0.547 | 0.453 | 0.0 |
| 2.305 | 3B | 8A | 76 | 00 | 0.539 | 0.461 | 0.0 |
| 2.344 | 3C | 88 | 78 | 00 | 0.531 | 0.469 | 0.0 |
| 2.389 | 3D | 86 | 7A | 00 | 0.524 | 0.476 | 0.0 |
| 2.422 | 3E | 84 | 7C | 00 | 0.516 | 0.484 | 0.0 |
| 2.461 | 3F | 82 | 7E | 00 | 0.508 | 0.492 | 0.0 |
| 2.500 | 40 | 80 | 80 | 00 | 0.5 | 0.5 | 0.0 |
| 2.539 | 41 | 7C | 84 | 00 | 0.484 | 0.516 | 0.0 |
| 2.578 | 42 | 78 | 88 | 00 | 0.469 | 0.531 | 0.0 |
| 2.617 | 43 | 74 | 8C | 00 | 0.453 | 0.547 | 0.0 |
| 2.656 | 44 | 70 | 90 | 00 | 0.437 | 0.563 | 0.0 |
| 2.695 | 45 | 6C | 94 | 00 | 0.422 | 0.578 | 0.0 |
| 2.734 | 46 | 68 | 98 | 00 | 0.406 | 0.594 | 0.0 |
| 2.773 | 47 | 64 | 9C | 00 | 0.391 | 0.609 | 0.0 |
| 2.812 | 48 | 60 | A0 | 00 | 0.375 | 0.625 | 0.0 |
| 2.852 | 49 | 5C | A4 | 00 | 0.359 | 0.641 | 0.0 |
| 2.891 | 4A | 58 | A8 | 00 | 0.344 | 0.656 | 0.0 |
| 2.930 | 4B | 54 | AC | 00 | 0.328 | 0.672 | 0.0 |
| 2.969 | 4C | 50 | B0 | 00 | 0.312 | 0.688 | 0.0 |
| 3.008 | 4D | 4C | B4 | 00 | 0.297 | 0.703 | 0.0 |
| 3.047 | 4E | 48 | B8 | 00 | 0.281 | 0.719 | 0.0 |
| 3.086 | 4F | 44 | BC | 00 | 0.266 | 0.734 | 0.0 |
| 3.125 | 50 | 40 | C0 | 00 | 0.25 | 0.75 | 0.0 |
| 3.164 | 51 | 3C | C4 | 00 | 0.234 | 0.766 | 0.0 |
| 3.203 | 52 | 38 | C8 | 00 | 0.219 | 0.781 | 0.0 |
| 3.242 | 53 | 34 | CC | 00 | 0.203 | 0.797 | 0.0 |
| 3.281 | 54 | 30 | D0 | 00 | 0.187 | 0.813 | 0.0 |
| 3.320 | 55 | 2C | D4 | 00 | 0.172 | 0.828 | 0.0 |
| 3.359 | 56 | 28 | D8 | 00 | 0.156 | 0.844 | 0.0 |
| 3.398 | 57 | 24 | DC | 00 | 0.141 | 0.859 | 0.0 |
| 3.437 | 58 | 20 | E0 | 00 | 0.125 | 0.875 | 0.0 |
| 3.477 | 59 | 1C | E4 | 00 | 0.109 | 0.891 | 0.0 |
| 3.516 | 5A | 18 | E8 | 00 | 0.094 | 0.906 | 0.0 |
| 3.555 | 5B | 14 | EC | 00 | 0.078 | 0.922 | 0.0 |
| 3.594 | 5C | 10 | F0 | 00 | 0.062 | 0.938 | 0.0 |
| 3.633 | 5D | 0C | F4 | 00 | 0.047 | 0.953 | 0.0 |
| 3.672 | 5E | 08 | F8 | 00 | 0.031 | 0.967 | 0.0 |
| 3.711 | 5F | 04 | FC | 00 | 0.016 | 0.984 | 0.0 |
| 3.750 | 60 | 00 | FF | 00 | 0.0 | 1.0 | 0.0 |
| 3.789 | 61 | 00 | F8 | 08 | 0.0 | 0.969 | 0.031 |
| 3.828 | 62 | 00 | F0 | 10 | 0.0 | 0.937 | 0.063 |
| 3.867 | 63 | 00 | E8 | 18 | 0.0 | 0.906 | 0.094 |
| 3.906 | 64 | 00 | E0 | 20 | 0.0 | 0.875 | 0.125 |
| 3.945 | 65 | 00 | D8 | 28 | 0.0 | 0.844 | 0.156 |
| 3.984 | 66 | 00 | D0 | 30 | 0.0 | 0.812 | 0.188 |
| 4.023 | 67 | 00 | C8 | 38 | 0.0 | 0.781 | 0.219 |
| 4.062 | 68 | 00 | C0 | 40 | 0.0 | 0.75 | 0.25 |
| 4.102 | 69 | 00 | B8 | 48 | 0.0 | 0.719 | 0.281 |
| 4.141 | 6A | 00 | B0 | 50 | 0.0 | 0.687 | 0.313 |
| 4.178 | 6B | 00 | A8 | 58 | 0.0 | 0.656 | 0.344 |
| 4.219 | 6C | 00 | A0 | 60 | 0.0 | 0.625 | 0.375 |
| 4.258 | 6D | 00 | 98 | 68 | 0.0 | 0.594 | 0.406 |
| 4.299 | 6E | 00 | 90 | 70 | 0.0 | 0.562 | 0.438 |
| 4.336 | 6F | 00 | 88 | 78 | 0.0 | 0.531 | 0.469 |
| 4.375 | 70 | 00 | 80 | 80 | 0.0 | 0.5 | 0.5 |
| 4.414 | 71 | 00 | 78 | 88 | 0.0 | 0.469 | 0.531 |
| 4.453 | 72 | 00 | 70 | 90 | 0.0 | 0.437 | 0.563 |
| 4.492 | 73 | 00 | 68 | 98 | 0.0 | 0.406 | 0.594 |
| 4.531 | 74 | 00 | 60 | A0 | 0.0 | 0.375 | 0.625 |
| 4.570 | 75 | 00 | 58 | A8 | 0.0 | 0.344 | 0.656 |
| 4.609 | 76 | 00 | 50 | B0 | 0.0 | 0.312 | 0.688 |
| 4.648 | 77 | 00 | 48 | B8 | 0.0 | 0.281 | 0.719 |
| 4.687 | 78 | 00 | 40 | C0 | 0.0 | 0.25 | 0.75 |
| 4.727 | 79 | 00 | 38 | C8 | 0.0 | 0.219 | 0.781 |
| 4.766 | 7A | 00 | 30 | D0 | 0.0 | 0.187 | 0.813 |
| 4.805 | 7B | 00 | 28 | D8 | 0.0 | 0.156 | 0.844 |
| 4.844 | 7C | 00 | 20 | E0 | 0.0 | 0.125 | 0.875 |
| 4.883 | 7D | 00 | 18 | E8 | 0.0 | 0.094 | 0.906 |
| 4.922 | 7E | 00 | 10 | F0 | 0.0 | 0.062 | 0.938 |
| 4.961 | 7F | 00 | 08 | F8 | 0.0 | 0.031 | 0.967 |
| 5.000 | 80 | 00 | 00 | FF | 0.0 | 0.0 | 1.0 |
| 5.039 | 81 | 04 | 00 | FC | 0.016 | 0.0 | 0.984 |
| 5.078 | 82 | 08 | 00 | F8 | 0.031 | 0.0 | 0.969 |
| 5.117 | 83 | 0C | 00 | F4 | 0.047 | 0.0 | 0.953 |
| 5.156 | 84 | 10 | 00 | F0 | 0.063 | 0.0 | 0.937 |
| 5.195 | 85 | 14 | 00 | EC | 0.078 | 0.0 | 0.922 |
| 5.234 | 86 | 18 | 00 | E8 | 0.094 | 0.0 | 0.906 |
| 5.273 | 87 | 1C | 00 | E4 | 0.109 | 0.0 | 0.891 |
| 5.312 | 88 | 20 | 00 | E0 | 0.125 | 0.0 | 0.875 |
| 5.352 | 89 | 24 | 00 | DC | 0.141 | 0.0 | 0.859 |
| 5.391 | 8A | 28 | 00 | D8 | 0.156 | 0.0 | 0.844 |
| 5.430 | 8B | 2C | 00 | D4 | 0.172 | 0.0 | 0.828 |
| 5.469 | 8C | 30 | 00 | D0 | 0.188 | 0.0 | 0.812 |
| 5.508 | 8D | 34 | 00 | CC | 0.2 | 0.0 | 0.8 |
| 5.547 | 8E | 38 | 00 | C8 | 0.219 | 0.0 | 0.781 |
| 5.586 | 8F | 3C | 00 | C4 | 0.234 | 0.0 | 0.766 |
| 5.625 | 90 | 40 | 00 | C0 | 0.25 | 0.0 | 0.75 |
| 5.664 | 91 | 44 | 00 | BC | 0.266 | 0.0 | 0.734 |
| 5.703 | 92 | 48 | 00 | B8 | 0.281 | 0.0 | 0.719 |
| 5.742 | 93 | 4C | 00 | B4 | 0.297 | 0.0 | 0.703 |
| 5.781 | 94 | 50 | 00 | B0 | 0.313 | 0.0 | 0.687 |
| 5.820 | 95 | 54 | 00 | AC | 0.328 | 0.0 | 0.672 |
| 5.859 | 96 | 58 | 00 | A8 | 0.344 | 0.0 | 0.656 |
| 5.898 | 97 | 5C | 00 | A4 | 0.359 | 0.0 | 0.641 |
| 5.937 | 98 | 60 | 00 | A0 | 0.375 | 0.0 | 0.625 |
| 5.977 | 99 | 64 | 00 | 9C | 0.391 | 0.0 | 0.609 |
| 6.016 | 9A | 68 | 00 | 98 | 0.406 | 0.0 | 0.594 |
| 6.055 | 9B | 6C | 00 | 94 | 0.422 | 0.0 | 0.578 |
| 6.094 | 9C | 70 | 00 | 90 | 0.438 | 0.0 | 0.562 |
| 6.133 | 9D | 74 | 00 | 8C | 0.453 | 0.0 | 0.547 |
| 6.172 | 9E | 78 | 00 | 88 | 0.469 | 0.0 | 0.531 |

TABLE 2-continued

| Input Voltage (Volts) | PROM Address (Hex) | DATA 'Red' PROM (Hex) | 'Green' PROM (Hex) | 'Blue' PROM (Hex) | PORTIONS red | green | blue |
|---|---|---|---|---|---|---|---|
| 6.211 | 9F | 7C | 00 | 84 | 0.484 | 0.0 | 0.516 |
| 6.250 | A0 | 80 | 00 | 80 | 0.5 | 0.0 | 0.5 |
| 6.289 | A1 | 84 | 00 | 7C | 0.516 | 0.0 | 0.484 |
| 6.328 | A2 | 88 | 00 | 78 | 0.531 | 0.0 | 0.469 |
| 6.367 | A3 | 8C | 00 | 74 | 0.547 | 0.0 | 0.453 |
| 6.406 | A4 | 90 | 00 | 70 | 0.563 | 0.0 | 0.437 |
| 6.445 | A5 | 94 | 00 | 6C | 0.578 | 0.0 | 0.422 |
| 6.484 | A6 | 98 | 00 | 68 | 0.594 | 0.0 | 0.406 |
| 6.524 | A7 | 9C | 00 | 64 | 0.609 | 0.0 | 0.391 |
| 6.562 | A8 | A0 | 00 | 60 | 0.625 | 0.0 | 0.375 |
| 6.602 | A9 | A4 | 00 | 5C | 0.641 | 0.0 | 0.359 |
| 6.641 | AA | A8 | 00 | 58 | 0.656 | 0.0 | 0.344 |
| 6.680 | AB | AC | 00 | 54 | 0.672 | 0.0 | 0.328 |
| 6.719 | AC | B0 | 00 | 50 | 0.688 | 0.0 | 0.312 |
| 6.758 | AD | B4 | 00 | 4C | 0.703 | 0.0 | 0.297 |
| 6.797 | AE | B8 | 00 | 48 | 0.719 | 0.0 | 0.281 |
| 6.836 | AF | BC | 00 | 44 | 0.734 | 0.0 | 0.266 |
| 6.875 | B0 | C0 | 00 | 40 | 0.75 | 0.0 | 0.25 |
| 6.914 | B1 | C4 | 00 | 3C | 0.766 | 0.0 | 0.234 |
| 6.953 | B2 | C8 | 00 | 38 | 0.781 | 0.0 | 0.219 |
| 6.992 | B3 | CC | 00 | 34 | 0.797 | 0.0 | 0.203 |
| 7.031 | B4 | D0 | 00 | 30 | 0.813 | 0.0 | 0.187 |
| 7.070 | B5 | D4 | 00 | 2C | 0.828 | 0.0 | 0.172 |
| 7.109 | B6 | D8 | 00 | 28 | 0.844 | 0.0 | 0.156 |
| 7.148 | B7 | DC | 00 | 24 | 0.859 | 0.0 | 0.141 |
| 7.187 | B8 | E0 | 00 | 20 | 0.875 | 0.0 | 0.125 |
| 7.227 | B9 | E4 | 00 | 1C | 0.891 | 0.0 | 0.109 |
| 7.266 | BA | E8 | 00 | 18 | 0.906 | 0.0 | 0.094 |
| 7.305 | BB | EC | 00 | 14 | 0.922 | 0.0 | 0.078 |
| 7.344 | BC | F0 | 00 | 10 | 0.938 | 0.0 | 0.062 |
| 7.383 | BD | F4 | 00 | 0C | 0.953 | 0.0 | 0.047 |
| 7.422 | BE | F8 | 00 | 08 | 0.967 | 0.0 | 0.031 |
| 7.461 | BF | FC | 00 | 04 | 0.984 | 0.0 | 0.016 |

What I claim is:

1. The method of simultaneously indicating RMS values and crest factor values of a measured waveform, on a single variable color digital display means, by causing said RMS values to be indicated on said variable color digital display means in a digital format, and by controlling the color of said variable color digital display means in accordance with said crest factor values.

2. The method as defined in claim 1 wherein the color of said variable color digital display means may be controlled substantially continuously such that the color changes of said variable color digital display means are proportional to changes in said crest factor values.

3. The method as defined in claim 1 wherein the color of said variable color digital display means may be controlled in a plurality of steps.

4. A device for measuring a waveform comprising:
first measurement means for measuring RMS values of said waveform;
second measurement means for measuring crest factor values of said waveform;
variable color digital display means for indicating measured RMS values of said waveform in a digital format; and
color control means for controlling the color of said variable color digital display means in accordance with measured crest factor values of said waveform.

5. A measurement device as defined in claim 4 more characterized by:
said second measurement means including:
peak detector means for detecting the instant peak value of said waveform; and
ratio producing means for developing a signal indicative of a ratio of said peak value to said RMS value.

6. A device as defined in claim 4 more characterized by:
said color control means causing said display means to illuminate in green color for crest factor values less than 1.5, in yellow color for crest factor values between 1.5 and 2.5, and in red color for crest factor values greater than 2.5.

7. A device as defined in claim 4 more characterized by:
said color control means causing said display means to illuminate in blue color for crest factor values less than 1.1, in purple color for crest factor values between 1.1 and 1.4, in blue-green color for crest factor values between 1.4 and 1.7, in green color for crest factor values between 1.7 and 2.0, in yellow color for crest factor values between 2.0 and 2.5, in white color for crest factor values between 2.5 and 3.0, and in red color for crest factor values greater than 3.0.

8. A method of simultaneously indicating a value of a first quantity indicative of a magnitude of a waveform and a value of a second quantity indicative of a shape of a waveform, on a single variable color digital display means, by causing a digital indication of the value of said first quantity to be exhibited on said display means, and by controlling the color of said indication in accordance with the value of said second quantity.

9. A measuring device comprising:
first measurement means for measuring a first quantity indicative of a magnitude of a waveform;
variable color digital display means for providing a digital indication of the value of said first quantity;
second measurement means for measuring a second quantity indicative of a shape of a waveform and for developing output signals indicative of the value of said second quantity; and
color control means responsive to said output signals for controlling the color of said indication in accordance with the values of said second quantity.

10. A measuring device comprising:
first measurement means for measuring a first quantity of a signal and for developing output data indicative of the measured value of said first quantity;
variable color digital display means responsive to said output data for providing a digital indication of the measured value of said first quantity;
second measurement means for measuring a second quantity of a signal and for developing output signals indicative of the measured value of said second quantity;
comparator means responsive to said output signals for comparing the measured value of said second quantity with a predetermined low measurement limit and a predetermined high measurement limit and for accordingly developing an active first comparison signal for the measured value of said second quantity being lower than said low measurement limit, an active second comparison signal for the measured value of said second quantity being between said low measurement limit and said high measurement limit, and an active third comparison signal for the measured value of said second quantity being higher than said high measurement limit, said first, second, and third comparison signals being mutually exclusive; and
color control means for causing said digital indication to illuminate in a first color in response to said active first comparison signal, in a second color in response to said active second comparison signal, and in a third color in response to said active third comparison signal, said first, second, and third colors being respectively different.

* * * * *